(12) United States Patent
Ishii

(10) Patent No.: US 8,970,009 B2
(45) Date of Patent: Mar. 3, 2015

(54) SEMICONDUCTOR DEVICE AND SEMICONDUCTOR WAFER

(71) Applicant: Renesas Electronics Corporation, Kanagawa (JP)

(72) Inventor: Yasushi Ishii, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/174,863

(22) Filed: Feb. 7, 2014

(65) Prior Publication Data
US 2014/0239455 A1    Aug. 28, 2014

(30) Foreign Application Priority Data
Feb. 26, 2013  (JP) .................................. 2013-036426

(51) Int. Cl.
*H01L 23/544* (2006.01)
*H01L 29/06* (2006.01)
*H01L 23/02* (2006.01)
*H01L 21/44* (2006.01)
*H01L 23/00* (2006.01)

(52) U.S. Cl.
CPC ............ *H01L 23/564* (2013.01); *H01L 23/562* (2013.01)
USPC ........... 257/620; 257/622; 257/678; 257/684; 438/106; 438/107; 438/110

(58) Field of Classification Search
CPC .............. H01L 23/585; H01L 29/0657; H01L 2924/14; H01L 24/01079; H01L 24/01029; H01L 21/3105; H01L 21/76843; H01L 2224/48091
USPC ................. 257/620, 622, 629, 678, 684, 750; 438/106, 107, 110, 113, 618
See application file for complete search history.

(56) References Cited

U.S. PATENT DOCUMENTS

| 7,605,448 | B2 | 10/2009 | Furusawa et al. | |
| 8,164,163 | B2 * | 4/2012 | Takemura et al. | ............ 257/620 |
| 8,168,529 | B2 * | 5/2012 | Lin et al. | ........................ 438/622 |
| 8,193,614 | B2 | 6/2012 | Yamada et al. | |
| 2011/0233735 | A1 | 9/2011 | Yoshizawa et al. | |

FOREIGN PATENT DOCUMENTS

| JP | 2008-270720 | 11/2008 |
| JP | 2011-009795 | 1/2011 |
| JP | 2011-222939 | 11/2011 |

* cited by examiner

*Primary Examiner* — Hsien Ming Lee
(74) *Attorney, Agent, or Firm* — Young & Thompson

(57) ABSTRACT

To improve reliability of a semiconductor device obtained through a dicing step.
In a ring region, a first outer ring is provided outside a seal ring, and a second outer ring is provided outside the first outer ring. This can prevent a crack from reaching even the seal ring that exists in the ring region, for example, when a scribe region located outside the ring region is cut off by a dicing blade.

20 Claims, 40 Drawing Sheets

US 8,970,009 B2

SEMICONDUCTOR DEVICE AND SEMICONDUCTOR WAFER

CROSS-REFERENCE TO RELATED APPLICATION

The disclosure of Japanese Patent Application No. 2013-036426 filed on Feb. 26, 2013 including the specification, drawings and abstract is incorporated herein by reference in its entirety.

BACKGROUND

The present invention relates to a semiconductor device and a semiconductor wafer, and to a technology effective in applying to, for example, a semiconductor device that is provided with a ring region in which a seal ring has been arranged outside a circuit region in which an integrated circuit has been formed and a semiconductor wafer.

Japanese Patent Laid-Open No. 2011-222939 (Patent Document 1) describes a semiconductor device in which a crack protection ring is provided in a region directly under a crack prevention window located outside a moisture-resistant ring. At this time, a top surface of the crack protection ring is configured so as to be exposed from a bottom surface of the crack prevention window.

Japanese Patent Laid-Open No. 2008-270720 (Patent Document 2) describes a semiconductor device in which a metal wire is provided in a region directly under an opening located outside a moisture-resistant shield ring.

Japanese Patent Laid-Open No. 2011-9795 (Patent Document 3) describes a semiconductor device in which a silicon nitride film peel-off prevention groove is provided outside a seal ring, being a moisture shielding wall, and in which an external seal ring is provided between the seal ring and the silicon nitride film peel-off prevention groove.

SUMMARY

For example, there exists a plurality of chip regions in a semiconductor wafer, and these chip regions are partitioned by scribe regions. Additionally, in manufacturing steps of a semiconductor device, the chip regions are separated by dicing the semiconductor wafer along the scribe regions (a dicing step), to produce a plurality of semiconductor chips from the semiconductor wafer.

Here, from a viewpoint of improving reliability of the semiconductor chips obtained through the dicing step, it has been desired to devise structures of the semiconductor chip and the semiconductor wafer.

The other problems and the new feature will become clear from the description of the present specification and the accompanying drawings.

A semiconductor device in one embodiment is provided with: a seal ring; a groove portion formed outside the seal ring; a first outer ring arranged between the seal ring and the groove portion; and a second outer ring arranged outside the first outer ring, the second outer ring being arranged so as to overlap with the groove portion in plan view.

According to one embodiment, reliability of the semiconductor device can be improved.

DETAILED DESCRIPTION

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements or the like (including the number, a numeric value, an amount, a range and the like), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step and the like) is not necessarily indispensable, except for the case where it is clearly specified in particular and where it is considered to be clearly indispensable from a theoretical point of view or the like.

Similarly, in the following embodiments, when shape, position relationship or the like of an element or the like is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation thereof is omitted. In order to make a drawing intelligible, hatching may be attached even if it is a plan view.

Figure 1:
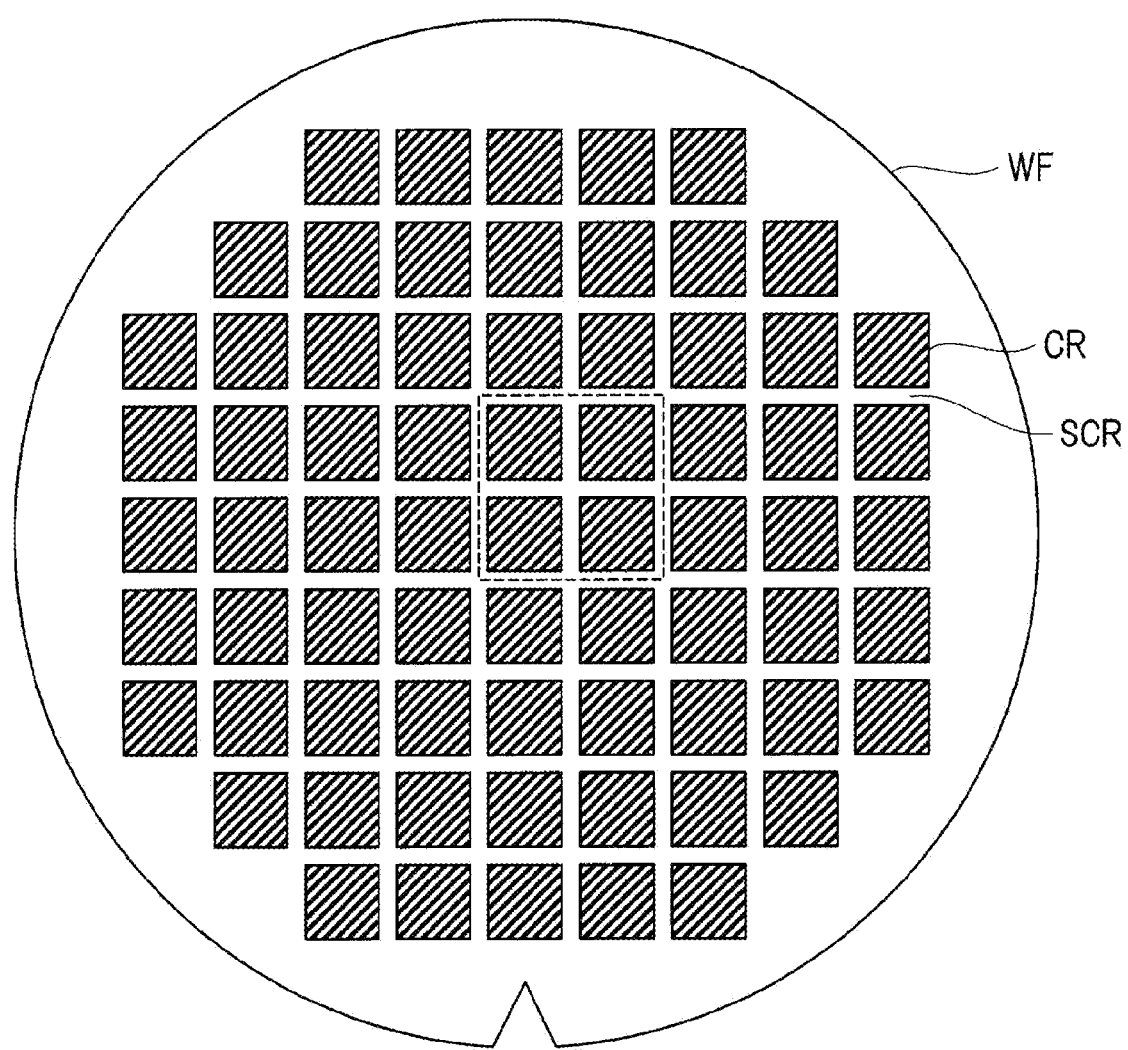
FIG. 1 is a plan view showing a layout configuration of a semiconductor wafer.

(First Embodiment) FIG. 1 is a plan view showing a layout configuration of a semiconductor wafer WF. As shown in FIG. 1, the semiconductor wafer WF is substantially disk-shaped, and has a plurality of chip regions CR in an inner region. An integrated circuit including a semiconductor element, such as an MISFET (Metal Insulator Semiconductor Field Effect Transistor), and a wiring is formed in each of the chip regions CR, and these chip regions CR are partitioned by a scribe region SCR. Additionally, in manufacturing steps of a semiconductor device, the chip regions CR are cut off by dicing the semiconductor wafer WF along the scribe region SCR, to produce a plurality of semiconductor chips from the semiconductor wafer WF.

A technical idea in the present first embodiment has been thought out in order to prevent decrease in reliability of a semiconductor device (semiconductor chip) due to a crack with the risk of occurrence in dicing the semiconductor wafer WF. Hereinafter, a related art will be first explained, and a room for improvement existing in the related art will be explained, and after that, the technical idea in the present first embodiment which has been devised to improve the related art will be explained.

Figure 2:
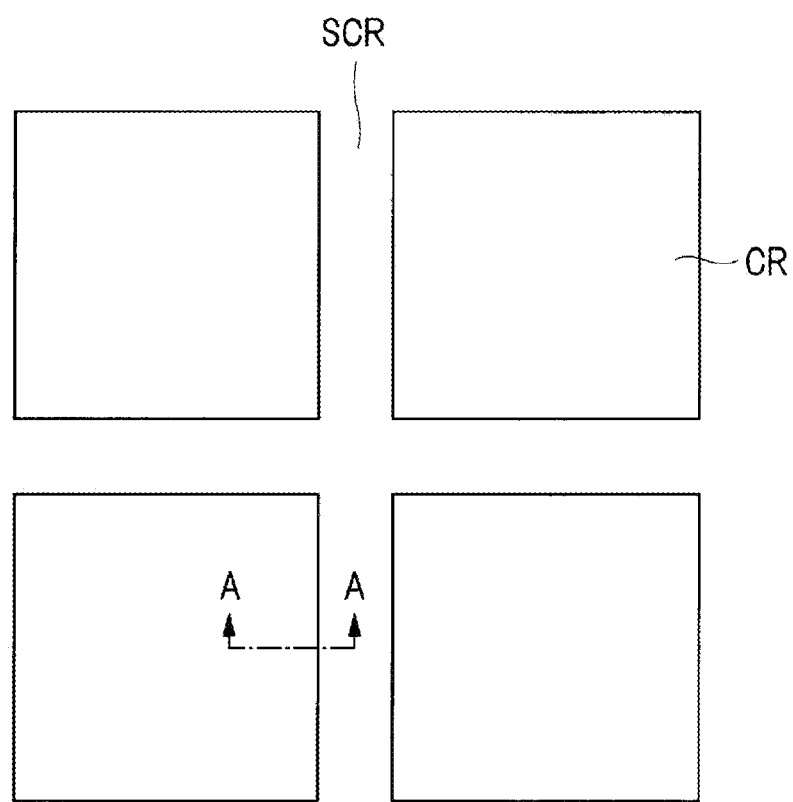
FIG. 2 is an enlarged view showing a partial region of the semiconductor wafer shown in FIG. 1.

<Explanation of Related Art>FIG. 2 is an enlarged view showing a partial region of the semiconductor wafer WF shown in FIG. 1. Specifically, FIG. 2 shows the enlarged view of the region surrounded with a dashed line of FIG. 1. In FIG. 2, it can be seen that four chip regions CR are shown, and that a scribe region SCR is formed so as to partition these four chip regions CR. Additionally, the four chip regions CR shown in FIG. 2 are separated into mutually independent four semiconductor chips, by dicing the semiconductor wafer WF along the scribe region SCR.

Figure 3:
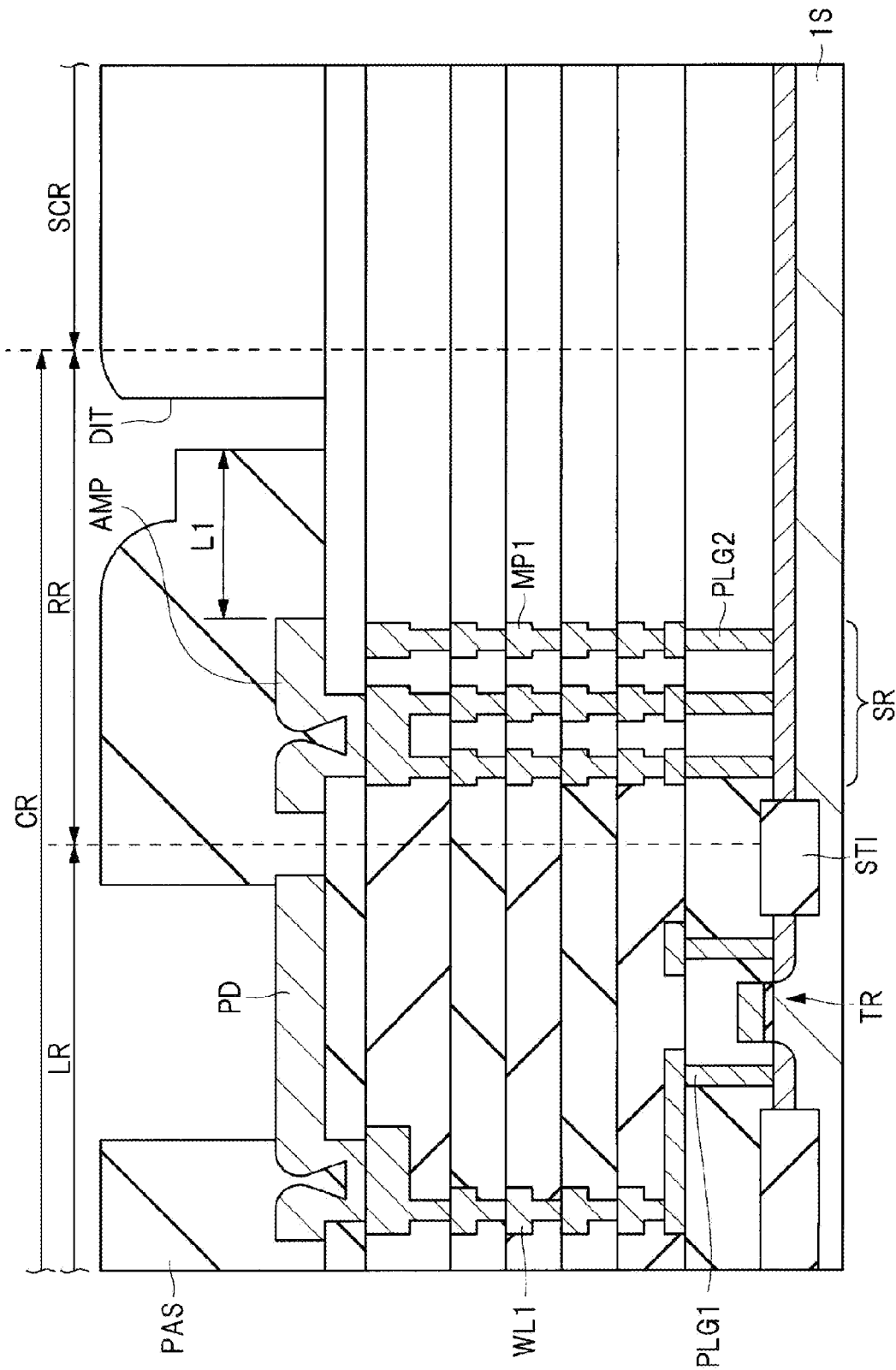
FIG. 3 is a cross-sectional view taken along a line A-A of FIG. 2.

FIG. 3 is a cross-sectional view taken along a line A-A of FIG. 2. As shown in FIG. 3, the scribe region SCR is formed outside the chip region CR, and this chip region CR is, for example, configured to include a circuit region LR in which an integrated circuit has been formed and a ring region RR formed outside the circuit region LR. Here, among the two regions partitioned by a boundary line, a region side away from a center of the individual chip region CR is defined as an "outside", and a region side near the center of the individual chip region CR is defined as an "inside". Namely, in a certain cross section of the semiconductor chip, the region side near an outer periphery of the semiconductor chip, which is a cut surface of the semiconductor chip, is defined as the "outside", and the region side away from the outer periphery of the semiconductor chip is defined as the "inside".

In the circuit region LR shown in FIG. 3, a field insulating film STI is formed on a semiconductor substrate 1S and, for example, a field effect transistor TR is formed in an active region partitioned by the field insulating film STI. Additionally, a multi-layered interlayer insulating film is formed so as to cover the field effect transistor TR, and plugs PLG1 connected to the field effect transistor TR, and wirings WL1 electrically connected to the plugs PLG1 are formed in the interlayer insulating film. The wiring WL1, for example, includes a copper wiring, and is formed in the interlayer insulating film in a multi-layered manner. For example, a pad PD including an aluminum film is formed over the wiring WL1 formed in a top layer, and a surface protection film PAS is formed so as to cover the pad PD. Additionally, an opening is formed in the surface protection film PAS, and a part of the pad PD is exposed from the opening. A wire including a metal line is connected to the exposed pad PD, for example, in a wire bonding step.

Subsequently, a seal ring SR is formed in the ring region RR shown in FIG. 3 so as to be connected to the semiconductor substrate 1S. The seal ring SR, for example, includes plugs PLG2 connected to the semiconductor substrate 1S, and metal patterns MP1 connected to the plugs PLG2. That is, the interlayer insulating film is formed over the semiconductor substrate 1S also in the ring region RR, the plugs PLG2 and the multi-layered metal patterns MP1 are formed in the interlayer insulating film, and the metal patterns MP1 adjacent to each other in a lamination direction are connected with the plugs.

The metal pattern MP1 is, for example, formed from a copper pattern and, for example, a metal pattern AMP including an aluminum film is formed over the metal pattern MP1 in the top layer. The seal ring SR configured as described above includes: the plugs PLG2; the multi-layered metal patterns MP1; the plugs that couple the metal patterns to each other; and the metal pattern AMP, and configures a kind of protection barrier. Accordingly, moisture entering from an outside of the ring region RR is suppressed from entering the circuit region LR by the seal ring SR that functions as the protection barrier. Namely, the seal ring SR formed in the ring region RR has a function to prevent entering of the moisture from the outside to the circuit region LR. Thereby, according to the related art, since entering of the moisture to the circuit region LR can be suppressed by the seal ring SR formed in the ring region RR, reliability of the semiconductor device (semiconductor chip) can be improved.

Furthermore, in the related art, as shown in FIG. 3, the surface protection film PAS is formed over the interlayer insulating film including a portion over the seal ring SR, and a groove portion DIT that reaches the interlayer insulating film is formed in the surface protection film PAS. Namely, in the related art, the groove portion DIT is formed outside the seal ring SR in FIG. 3. Additionally, the scribe region SCR is formed outside the ring region RR in which the seal ring SR and the groove portion DIT have been formed.

In the scribe region SCR shown in FIG. 3, the interlayer insulating film is formed over the semiconductor substrate 1S, and the surface protection film PAS is formed over this interlayer insulating film. It is to be noted that, for example, a TEG pattern may be formed in the scribe region SCR. The TEG pattern means the pattern including an experimental sample fabricated to evaluate a fundamental structure, a physical property, an electrical characteristic, circuit operation, reliability, a yield, and the like in an element level or an IC (Integrated Circuit) level. However, illustration of the TEG pattern formed in the scribe region SCR is omitted in the present specification.

Figure 4:
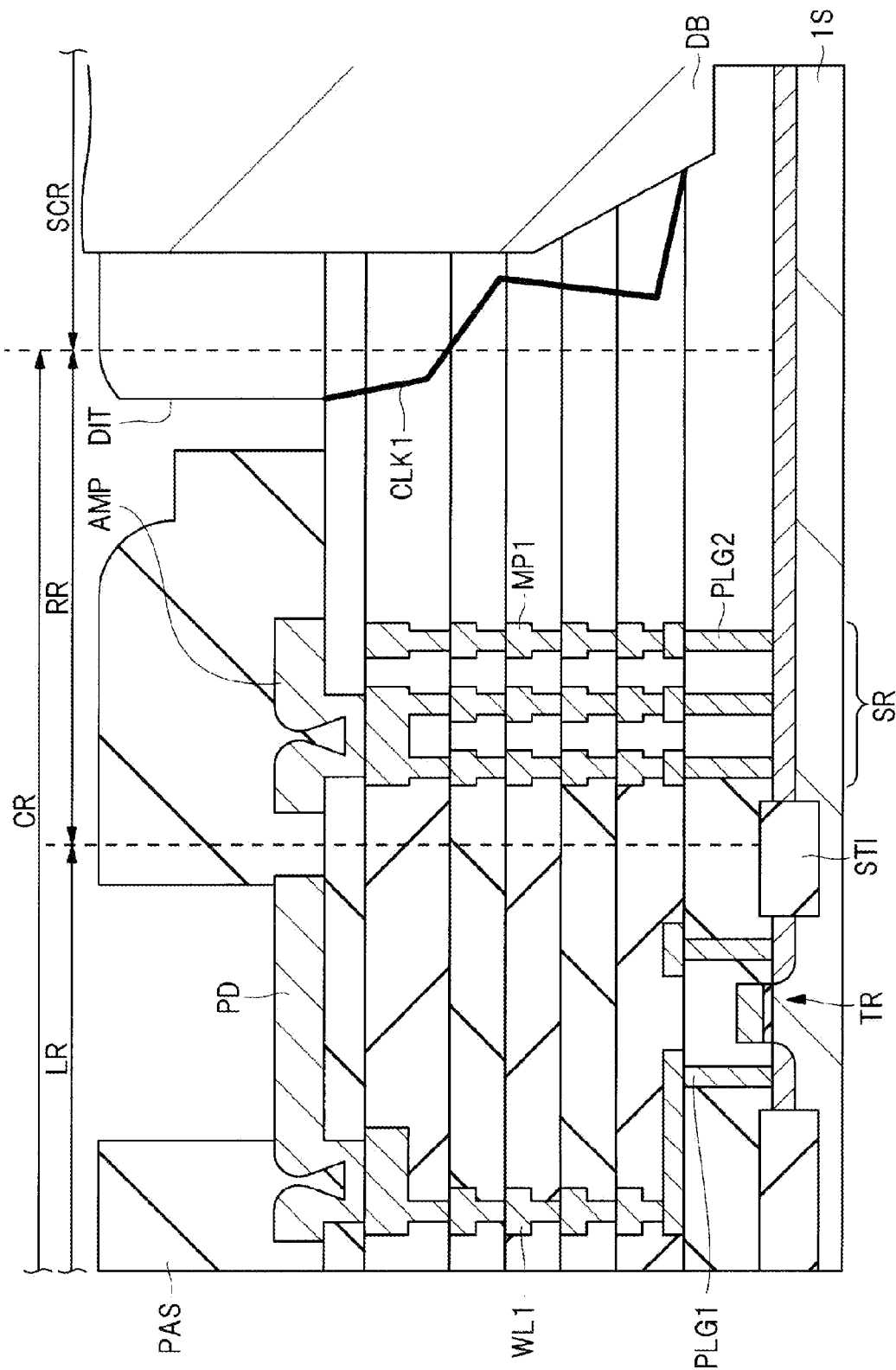
FIG. 4 is a cross-sectional view schematically showing a step of dicing the semiconductor wafer.

The related art is configured as described above and hereinafter, particularly, a function of the groove portion DIT formed in the ring region RR will be explained. FIG. 4 is a cross-sectional view schematically showing a step of dicing the semiconductor wafer. In FIG. 4, the scribe region SCR is cut off by a dicing blade DB in the dicing step.

At this time, the dicing blade DB rotatingly cuts off the scribe region SCR, and a downward force is applied to the semiconductor wafer when the rotating dicing blade DB enters the semiconductor wafer, and an upward force is applied to the semiconductor wafer when the rotating dicing blade DB gets out of the semiconductor wafer.

For this reason, since the force is applied to the semiconductor wafer in the scribe region SCR of the semiconductor wafer being cut off by the dicing blade DB, the semiconductor wafer may have a crack.

In a manner described above, it is conceived that when the crack occurs in the scribe region SCR, the crack reaches from the scribe region SCR to the ring region RR, and even to the seal ring SR formed in the ring region RR. In this case, the seal ring SR may be destroyed, and when it is destroyed, it becomes impossible to prevent moisture from entering the circuit region LR. As a result of this, there is concern over causing failure of the integrated circuit formed in the circuit region LR.

Consequently, the groove portion DIT is provided in the ring region RR in the related art. Specifically, the groove portion DIT is provided outside the seal ring SR formed in the ring region RR. In this case, for example, as shown in FIG. 4, a crack CLK1 occurring in the dicing step is formed so as to extend to a scribe region SCR side with a bottom of the groove portion DIT being as a starting point. The reason is that since the groove portion DIT is formed by removing the surface protection film PAS, a thickness of the semiconductor wafer is thin and the semiconductor wafer is easily broken in the groove portion DIT. That is, in the related art, an easily broken portion is intentionally formed by providing the groove portion DIT in the surface protection film PAS. Thereby, it is conceived that the crack CLK1 occurring in the dicing step may be made with the easily broken bottom of the groove portion DIT being as the starting point, and in this case, the crack CLK1 does not reach the seal ring SR as shown in FIG. 4. From this, according to the related art, it is conceived that the seal ring SR can be protected from the crack CLK1 occurring in the dicing step.

However, as a result of examination of the above-mentioned related art by the present inventor, it became obvious that there exists a room for further improvement. Hereinafter, the room for improvement existing in the related art will be explained.

Figure 5:
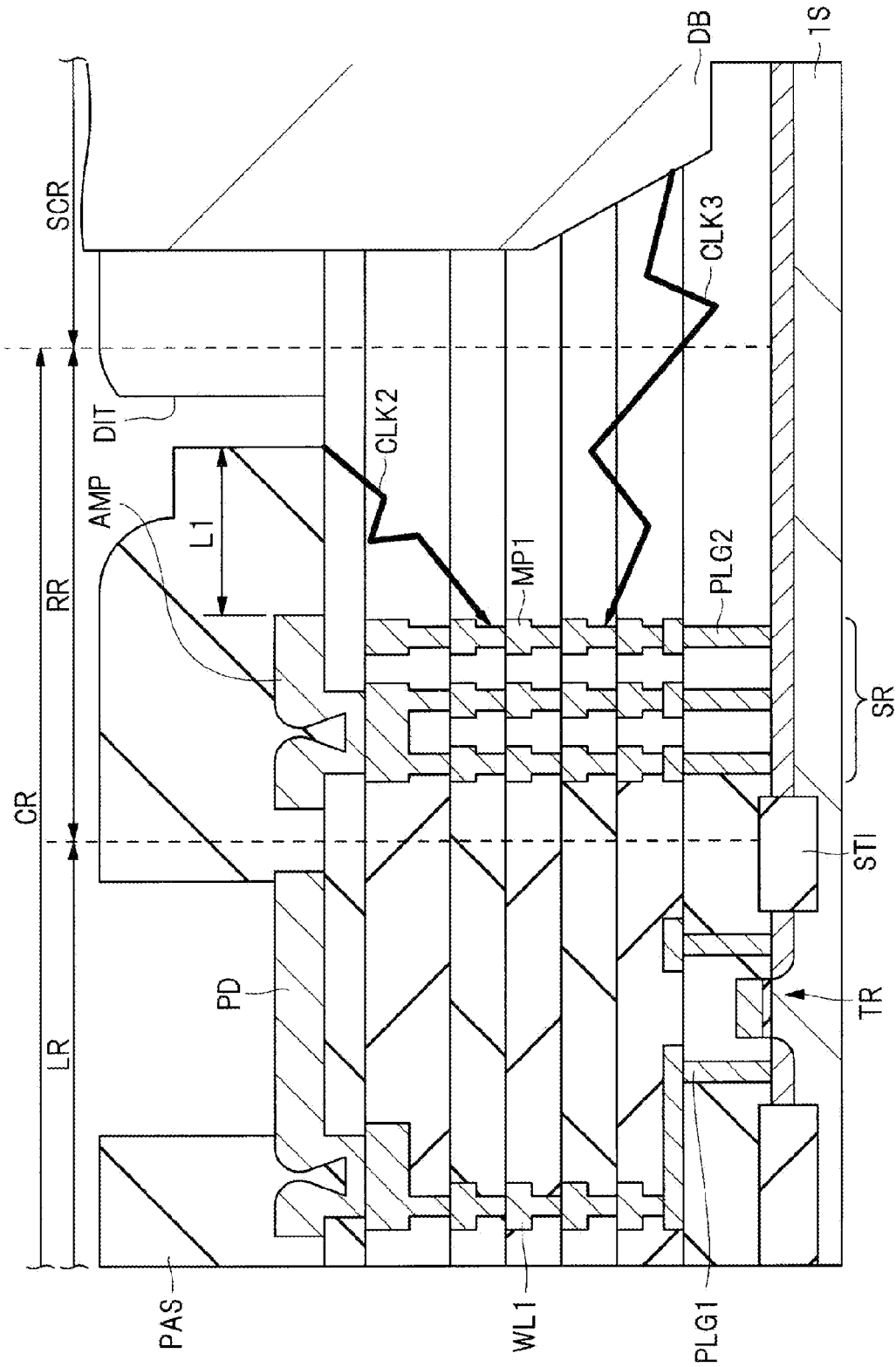
FIG. 5 is a cross-sectional view explaining a room for improvement in a dicing step in a related art.

<Room for Improvement Existing in Related Art> FIG. 5 is a cross-sectional view explaining the room for improvement in the dicing step in the related art. As shown in FIG. 5, for example, in the scribe region SCR being cut off by the dicing blade DB, a force is applied to the semiconductor wafer. At this time, in the related art, the groove portion DIT is provided outside the seal ring SR formed in the ring region RR.

In this case, for example, as shown in FIG. 5, it is conceived that a crack CLK2 occurring in the dicing step may occur with the bottom of the groove portion DIT being as a starting point in many cases, the bottom being intentionally formed so as to be easily broken.

However, there is conceived not only a case where the crack CLK2 having occurred with the bottom of the groove portion DIT being as the starting point progresses toward the scribe region SCR outside the ring region RR, but a case where it progresses toward the seal ring SR arranged inside the groove portion DIT. That is, even though the easily broken groove portion DIT is intentionally provided, a progressing direction of the crack CLK2 having occurred at the bottom of the groove portion DIT cannot be controlled.

Accordingly, for example, as shown in FIG. 4, when the crack CLK1 having occurred at the bottom of the groove portion DIT progresses toward the scribe region SCR, the crack CLK1 can be prevented from reaching the seal ring SR.

Meanwhile, for example, as shown in FIG. 5, when the crack CLK2 having occurred at the bottom of the groove portion DIT progresses toward the seal ring SR, the crack CLK2 reaches the seal ring SR, and the seal ring SR may be destroyed.

Furthermore, when the force (stress) applied to the semiconductor wafer in the dicing step is too strong, for example, as shown in FIG. 5, there is a case where the bottom of the groove portion DIT may not serve as the starting point of occurrence of a crack CLK3, but a contact region of the dicing blade DB and the semiconductor wafer may serve as the starting point. In this case, the crack CLK3 progresses toward the seal ring SR, the crack CLK3 reaches the seal ring SR, and the seal ring SR may be destroyed.

From the discussion described above, in the related art, the crack having occurred in the dicing step cannot be fully prevented from reaching the seal ring SR formed in the ring region RR, and as a result of this, there exists a room for improvement that moisture cannot be reliably prevented from entering the circuit region LR due to destruction of the seal ring SR by the crack. Namely, there exists the room for improvement in the related art from a viewpoint of improving reliability of the semiconductor device.

Here, for example, it is conceived that a distance L1 between the seal ring SR and the groove portion DIT is made larger in FIG. 5. The reason is that the crack CLK2 occurs with the groove portion DIT being as the starting point by increasing the distance L1 between the seal ring SR and the groove portion DIT, and that even when the crack CLK2 progresses toward the seal ring SR, a possibility of the crack CLK2 reaching the seal ring SR can be made lower.

Furthermore, for example, as shown in FIG. 5, it is conceived that even when the bottom of the groove portion DIT does not serve as the starting point of occurrence of the crack CLK3, but the contact region of the dicing blade DB and the semiconductor wafer serves as the starting point, a distance from the starting point of the crack CLK3 to the seal ring SR is large, and thus a possibility of the crack CLK3 reaching the seal ring SR can be made lower.

However, since increasing the distance L1 between the seal ring SR and the groove portion DIT means increasing a size of the ring region RR, and the ring region RR constitutes a part of the chip region CR, increase of the ring region RR means increase of the chip region CR. From this, the number of the semiconductor chips obtained from a single semiconductor wafer decreases, and thereby manufacturing cost of a semiconductor device rises.

As described above, it is conceived that a configuration for increasing the distance L1 between the seal ring SR and the groove portion DIT is the useful configuration from a viewpoint that possibilities of the cracks CLK2 and CLK3 reaching the seal ring SR can be made lower. However, when sizes of the cracks CLK2 and CLK3 are large, there exists a potential of the seal ring SR being destroyed even though the distance L1 between the seal ring SR and the groove portion DIT is increased, and thus it is conceived that increasing the distance L1 cannot be said to be a sufficient measure from a viewpoint of reliably preventing destruction of the seal ring SR. Furthermore, as mentioned above, when the configuration for increasing the distance L1 between the seal ring SR and the groove portion DIT is employed, increase of a size of the chip region CR including the ring region RR is inevitably caused, and it is conceived that the configuration cannot be said to bean effective measure also from a viewpoint of reducing the manufacturing cost of the semiconductor device.

Figure 6:
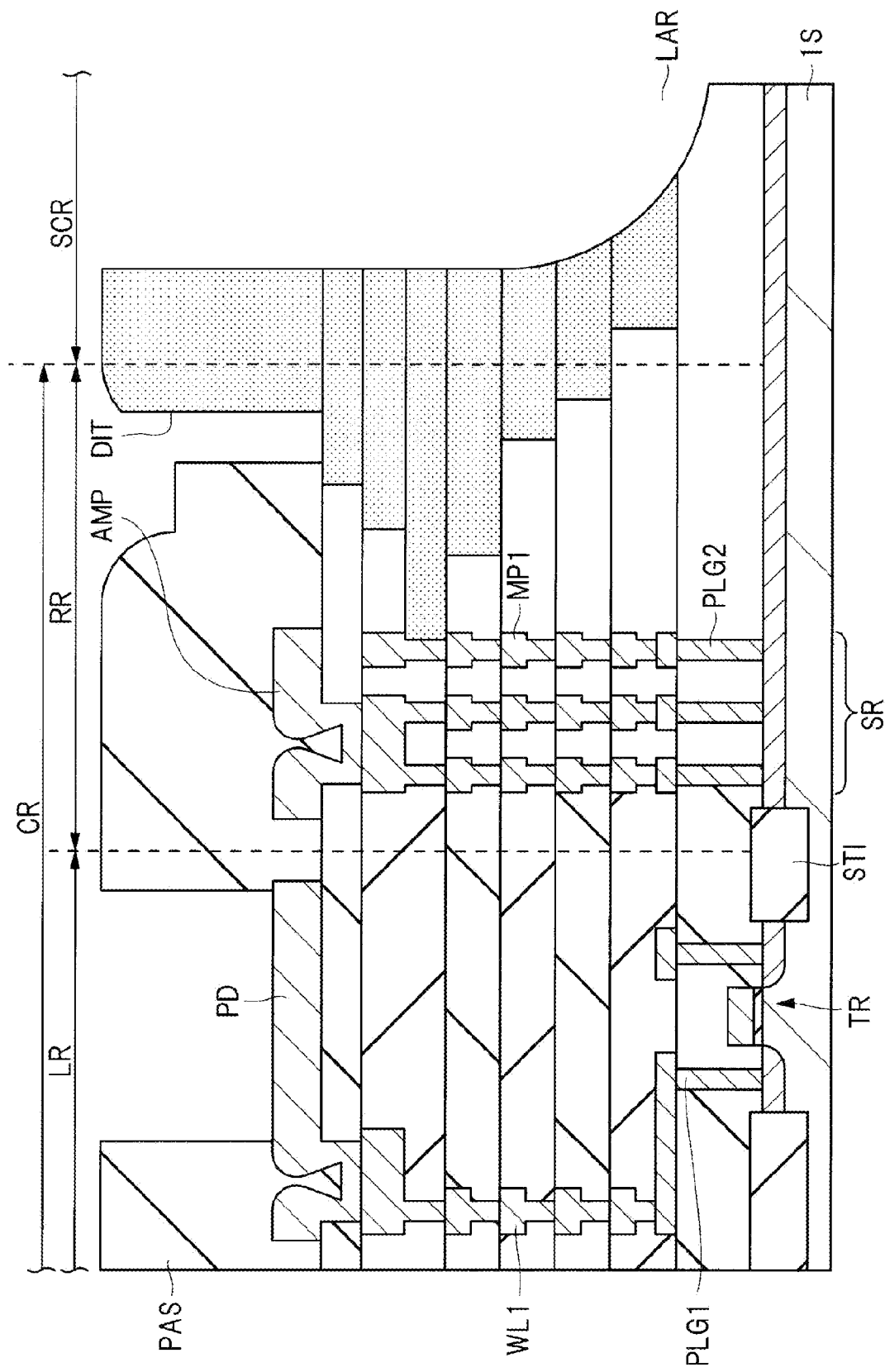
FIG. 6 is a cross-sectional view showing the room for improvement in the dicing step in which a scribe region is cut off by irradiating the scribe region of the semiconductor wafer with a laser light.

In addition, in the dicing step, there also exists a technology (laser dicing) of cutting the semiconductor wafer by irradiating the scribe region SCR with a laser light LAR, for example, as shown in FIG. 6, in addition to a method for cutting the semiconductor wafer using the dicing blade DB, for example, as shown in FIGS. 4 and 5.

FIG. 6 is a cross-sectional view showing a room for improvement in the dicing step in which the scribe region SCR is cut by irradiating the scribe region SCR of the semiconductor wafer with the laser light LAR. In FIG. 6, a technology called laser dicing is the technology in which the semiconductor wafer is irradiated with the laser light LAR to heat an irradiation region, and thereby the irradiation region of the semiconductor wafer is burned to be cut off. In this case, since not only the region irradiated with the laser light LAR but a peripheral region of the irradiation region is heated, a film burns and disappears also in the peripheral region. At this time, flammability of the film differs due to a film type formed at the semiconductor wafer, and heating distribution. From this, for example, as shown in FIG. 6, a cut surface by laser dicing is likely to be a concavo-convex shape due to a difference in flammability of the film formed at the semiconductor wafer. As a result of this, foreign substances (dust) easily occur(s) from the concavo-convex shaped cut surface.

Particularly, in recent years, for example, a low-dielectric film whose dielectric constant is lower than a silicon oxide film typified by an SiOC film may be used for the interlayer insulating film in order to reduce a parasitic capacitance of the interlayer insulating film. For example, in a case of the SiOC film, the interlayer insulating film is easy to burn since it includes carbon. Accordingly, it is conceived that when the low-dielectric film is used for a part of the interlayer insulating film, there is a remarkable difference inflammability of the film formed over the semiconductor wafer, and as a result, convexoconcave of the cut surface by the laser dicing becomes remarkable.

From the discussion described above, it can be seen that there exists the room for improvement in the related art in structures of the semiconductor chip and the semiconductor wafer from a viewpoint of improving reliability of the semiconductor chip obtained through the dicing step. Consequently, devising in the room for improvement that exists in the above-mentioned related art is made in the present first embodiment. Hereinafter, there will be explained the technical idea in the present first embodiment in which the devising has been made.

Figure 7:
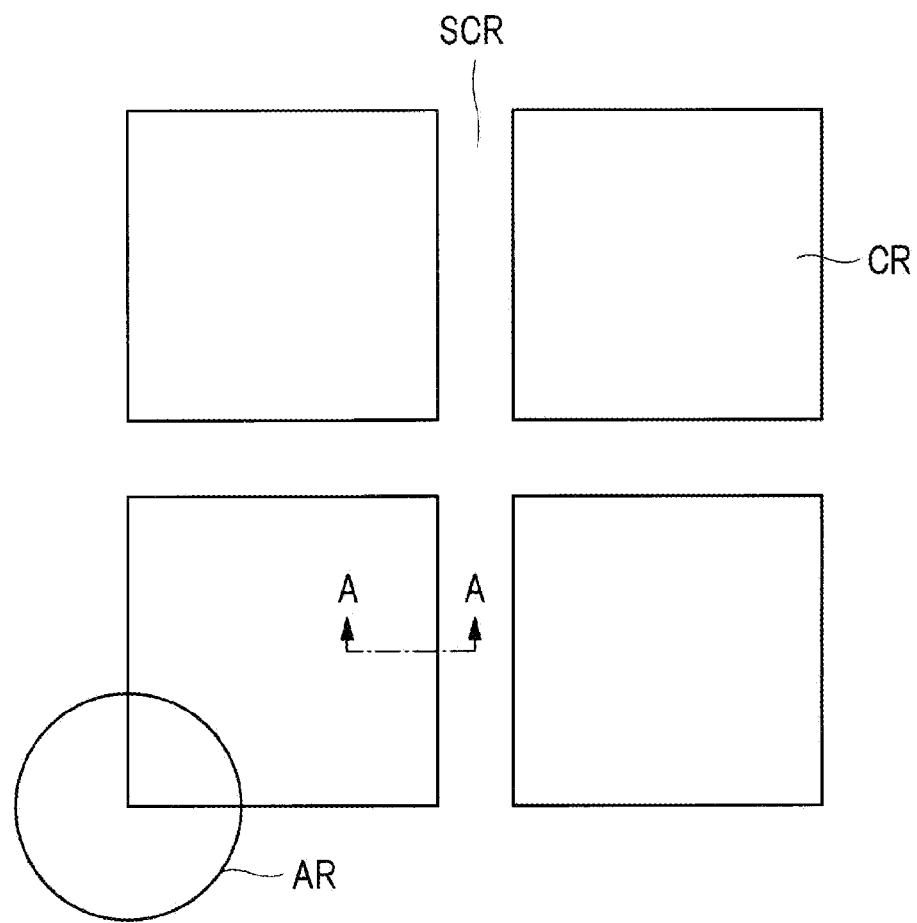
FIG. 7 is an enlarged view showing a partial region of the semiconductor wafer shown in FIG. 1.

<Configuration of Semiconductor Device in First Embodiment>FIG. 7 is an enlarged view showing a partial region of the semiconductor wafer WF shown in FIG. 1. Specifically, FIG. 7 shows an enlarged view of a region surrounded with a dashed line of FIG. 1. In FIG. 7, it can be seen that four chip regions CR are shown, and that the scribe region SCR is formed so as to partition these four chip regions CR. Additionally, the four chip regions CR shown in FIG. 7 are separated into mutually independent four semiconductor chips by dicing the semiconductor wafer WF along the scribe region SCR.

Figure 8:
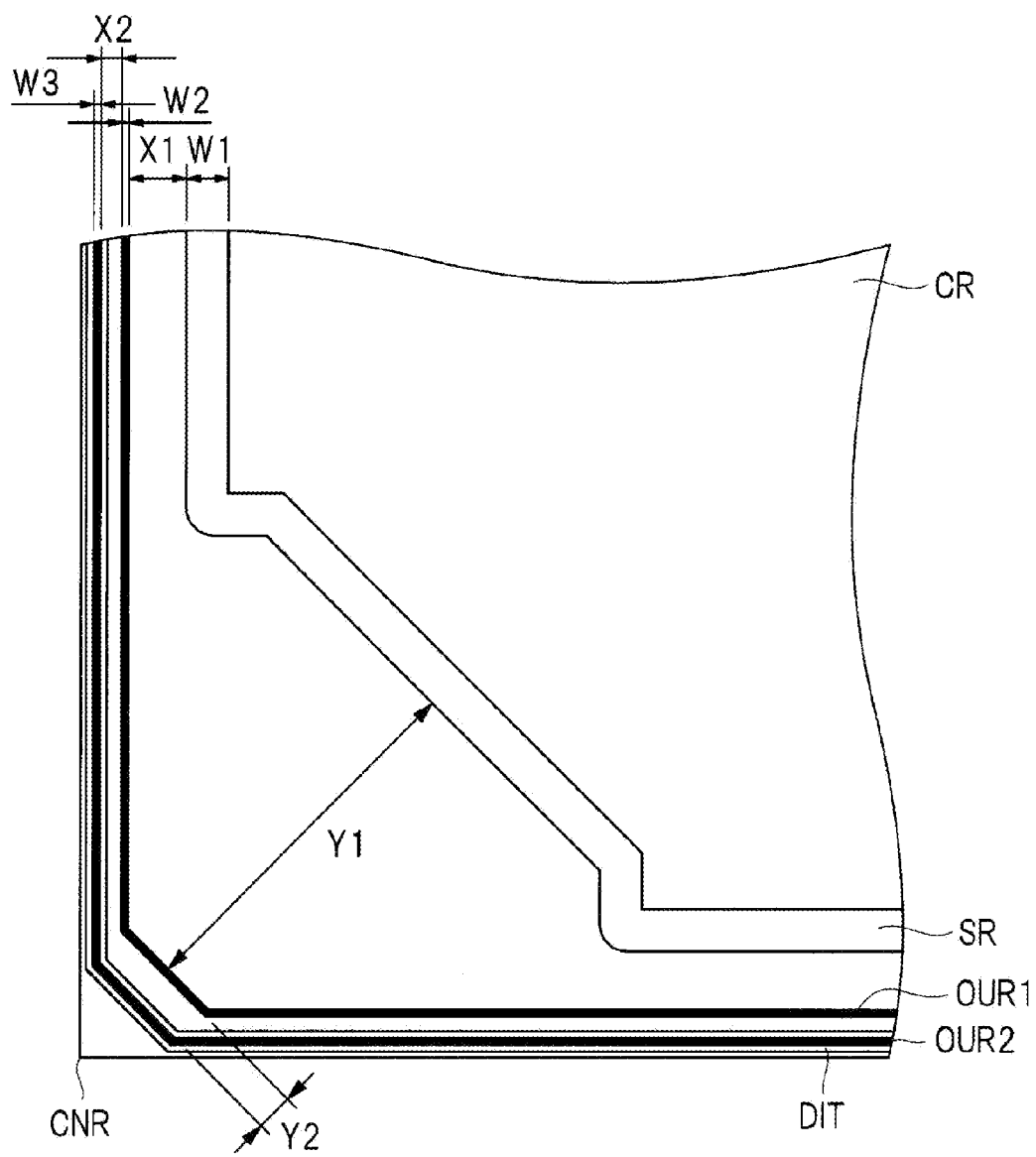
FIG. 8 is an enlarged plan view showing a partial region shown in FIG. 7, and is the view showing a planar layout configuration near a corner of a chip region.

FIG. 8 is an enlarged plan view showing a region AR shown in FIG. 7, and is the view showing a planar layout configuration near a corner CNR of a chip region CR. As shown in FIG. 8, the seal ring SR is formed in the chip region CR having the corner CNR. This seal ring SR is arranged so as to extend along an outer peripheral line of the chip region CR in a region other than the corner CNR, and it is arranged so as to be spaced apart from the corner CNR in the corner CNR. Namely, the seal ring SR is, as shown in FIG. 8, arranged so that a distance between the corner CNR and the seal ring SR is larger than a distance between the outer peripheral line of the chip region CR in the region other than the corner CNR and the seal ring SR.

Here, in the present specification, an arrangement configuration of the seal ring SR in the corner CNR is referred to as an inclined pattern. There will be explained a reason hereinafter that the seal ring SR has the inclined pattern in the corner CNR of the chip region CR. Namely, a crack easily occurs in the corner CNR of the chip region CR compared with an outer peripheral region other than the corner CNR. Particularly, a crack easily occurs that goes to an inside of the chip region CR from the corner CNR. In this case, for example, when the distance between the corner CNR and the seal ring SR is small, a crack having occurred at the corner CNR easily reaches the seal ring SR. As a result of this, the seal ring SR is destroyed by the crack, and the seal ring SR does not fulfill a function as a moisture protection barrier. Thereby, moisture also enters the circuit region, which is an inner region of the seal ring SR, which exerts a harmful influence on operational reliability of the integrated circuit formed in the circuit region.

From this, it is configured such that the seal ring SR has the inclined pattern in the corner CNR of the chip region CR in the present first embodiment. In this case, since the distance between the corner CNR and the seal ring SR is large, a crack can be suppressed from reaching even the seal ring SR even though the crack occurs at the corner CNR and progresses in an inner direction of the chip region CR. As a result of this, even if the crack occurs at the corner CNR in which the crack easily occurs, a potential of the seal ring SR being destroyed by the crack can be reduced. Namely, since the function of the seal ring SR as the moisture protection barrier can be maintained even if the crack occurs at the corner CNR, moisture can be prevented from entering even the circuit region, which is the inner region of the seal ring SR. Thereby, the operational reliability of the integrated circuit formed in the circuit region can be improved.

Subsequently, in the present first embodiment, the groove portion (slit) DIT is arranged along the outer peripheral line of the chip region CR. Specifically, as shown in FIG. 8, the groove portion DIT extends along the outer peripheral line of the chip region CR including the corner CNR. At this time, the groove portion DIT is arranged outside the seal ring SR in plan view. That is, the groove portion DIT is arranged so as to be sandwiched between the outer peripheral line of the chip region CR and the seal ring SR in plan view.

Additionally, in the present first embodiment, in plan view, an outer ring OUR1 is provided between the groove portion DIT and the seal ring SR, and the outer ring OUR1 also extends along the outer peripheral line of the chip region CR. Furthermore, in the present first embodiment, an outer ring OUR2 is provided outside the outer ring OUR1, and the outer ring OUR2 also extends along the outer peripheral line of the chip region CR. Particularly, the outer ring OUR2 is arranged so as to overlap with the groove portion DIT in plan view.

Here, as shown in FIG. 8, a width W1 of the seal ring SR is larger than a width W2 of the outer ring OUR1 and a width W3 of the outer ring OUR2, and the width W2 of the outer ring OUR1 and the width W3 of the outer ring OUR2 are the same as each other. In other words, the width W2 of the outer ring OUR1 and the width W3 of the outer ring OUR2 are smaller than the width W1 of the seal ring SR. Although in the present first embodiment, the width W2 of the outer ring OUR1 and the width W3 of the outer ring OUR2 are set to be the same as each other, most suitable widths can be appropriately selected as the width W2 of the outer ring OUR1 and the width W3 of the outer ring OUR2 as long as they are smaller than the width W1 of the seal ring SR.

In addition, in the region other than the corner CNR, a distance X1 between the seal ring SR and the outer ring OUR1 is larger than a distance X2 between the outer ring OUR1 and the outer ring OUR2. In other words, the distance X2 between the outer ring OUR1 and the outer ring OUR2 is smaller than the distance X1 between the seal ring SR and the outer ring OUR1.

Similarly, also in the corner CNR, a distance Y1 between the seal ring SR and the outer ring OUR1 is larger than a distance Y2 between the outer ring OUR1 and the outer ring OUR2. In other words, the distance Y2 between the outer ring OUR1 and the outer ring OUR2 is smaller than the distance Y1 between the seal ring SR and the outer ring OUR1.

At this time, the distance X1 and the distance Y1 between the seal ring SR and the outer ring OUR1 are a distance between an outer peripheral line of the seal ring SR and an inner peripheral line of the outer ring OUR1, and the distance X2 and the distance Y2 between the outer ring OUR1 and the outer ring OUR2 are a distance between an outer peripheral line of the outer ring OUR1 and an inner peripheral line of the outer ring OUR2.

Figure 9:
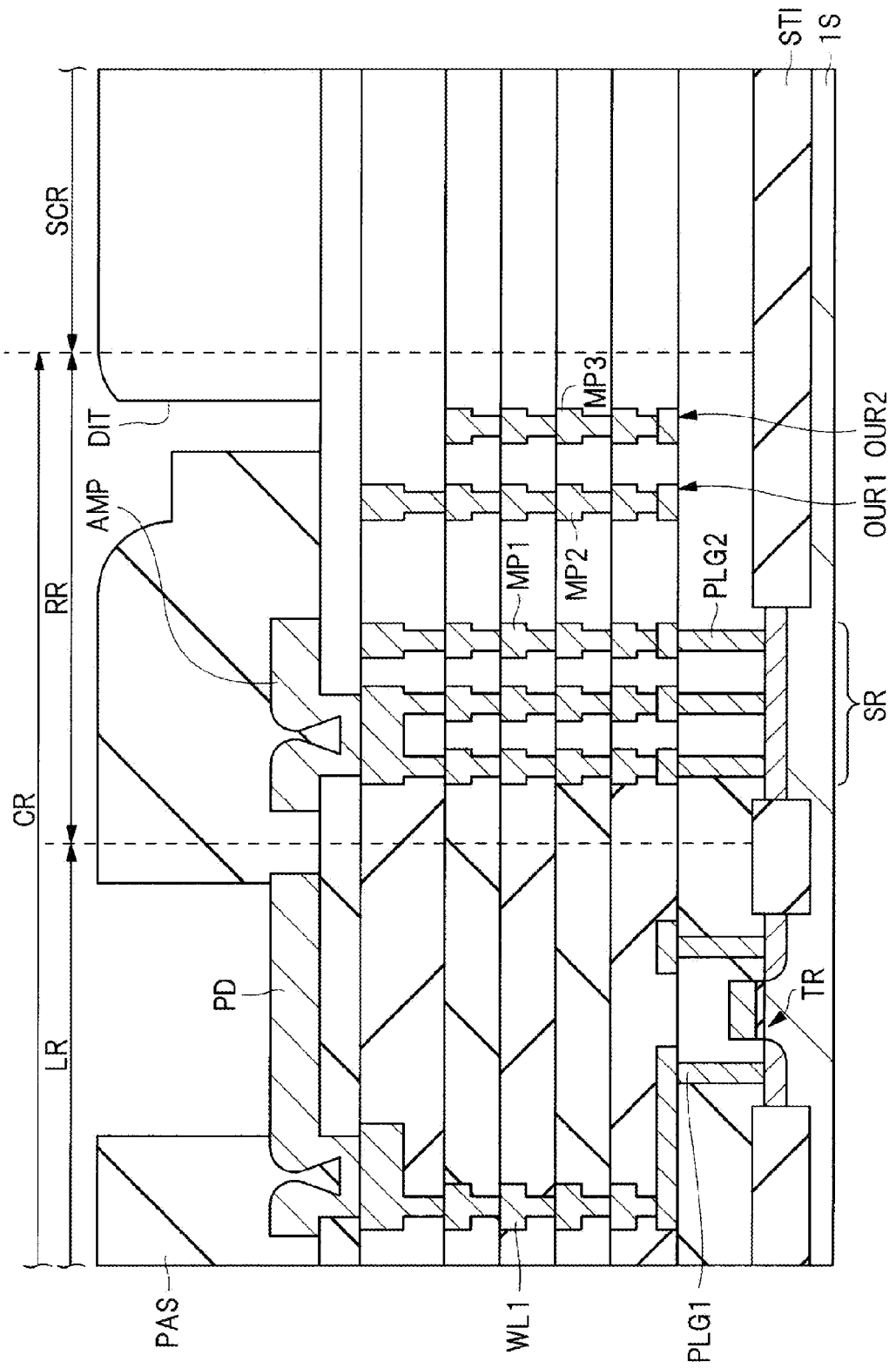
FIG. 9 is a cross-sectional view taken along a line A-A of FIG. 7.

Next, FIG. 9 is a cross-sectional view taken along a line A-A of FIG. 7. As shown in FIG. 9, the scribe region SCR is formed in an outer region of the chip region CR, and this chip region CR is, for example, configured so as to include the circuit region LR in which the integrated circuit has been formed, and the ring region RR formed outside the circuit region LR.

In the circuit region LR shown in FIG. 9, the field insulating film STI is formed on the semiconductor substrate 1S and, for example, the field effect transistor TR is formed in the active region partitioned by the field insulating film STI. Additionally, the multi-layered interlayer insulating film is formed so as to cover the field effect transistor TR, and the plugs PLG1 connected to the field effect transistor TR, and the wirings WL1 electrically connected to the plugs PLG1 are formed in this interlayer insulating film. This wiring WL1, for example, includes the copper wiring, and is formed in the interlayer insulating film in the multi-layered manner. For example, the pad PD including the aluminum film is formed over the wiring WL1 formed in the top layer, and the surface protection film PAS is formed so as to cover the pad PD. Additionally, the opening is formed in the surface protection film PAS, and the part of the pad PD is exposed from this opening. The wire including metal is connected to the exposed pad PD, for example, in a wire bonding step.

Subsequently, the seal ring SR is formed in the ring region RR shown in FIG. 9 so as to be connected to the semiconductor substrate 1S. This seal ring SR, for example, includes plugs PLG2 connected to the semiconductor substrate 1S, and metal patterns MP1 connected to the plugs PLG2. That is, the interlayer insulating film is formed over the semiconductor substrate 1S also in the ring region RR, the plugs PLG2 and the multi-layered metal pattern MP1 are formed in this interlayer insulating film, and the metal patterns MP1 adjacent to each other in the lamination direction are connected with the plugs.

The metal pattern MP1 is, for example, formed from the copper pattern and, for example, a metal pattern AMP including the aluminum film is formed over the metal pattern MP1 of the top layer. The seal ring SR configured as described above includes: the plugs PLG2; the multi-layered metal pattern MP1; the plugs that couple the metal patterns to each other; and the metal pattern AMP, and constitutes a kind of protection barrier. Accordingly, moisture entering from the outside of the ring region RR is suppressed from entering the circuit region LR by the seal ring SR that functions as the protection barrier. Namely, the seal ring SR formed in the ring region RR has the function to prevent entering of the moisture from the outside to the circuit region LR. Thereby, according to the present first embodiment, since entering of the moisture to the circuit region LR can be suppressed by the seal ring SR formed in the ring region RR, reliability of the semiconductor device (semiconductor chip) can be improved.

Furthermore, in the present first embodiment, as shown in FIG. 9, the surface protection film PAS is formed over the interlayer insulating film including the portion over the seal ring SR, and the groove portion DIT that reaches the interlayer insulating film is formed in the surface protection film PAS. Namely, in the present first embodiment, the groove portion DIT is formed outside the seal ring SR in plan view from above a main surface side of the semiconductor substrate 1S (refer to FIG. 8).

In addition, in the present first embodiment, as shown in FIG. 9, the outer ring OUR1 is formed outside the seal ring SR, and the outer ring OUR2 is formed outside this outer ring OUR1. In detail, in plan view from above the main surface side of the semiconductor substrate 1S, the outer ring OUR1 is arranged between the seal ring SR and the groove portion DIT, and the outer ring OUR2 is arranged so as to overlap with the groove portion DIT (refer to FIG. 8). These outer rings OUR1 and OUR2 are, as shown in FIG. 9, arranged above the field insulating film STI, and are arranged spaced apart from the field insulating film STI. Namely, the outer ring OUR1 and the outer ring OUR2 are not connected to the field insulating film STI with a plug.

Additionally, the outer ring OUR1 includes the metal pattern MP2. Namely, the field insulating film STI is formed on the semiconductor substrate 1S, and the interlayer insulating film is formed over the field insulating film STI. Additionally, the multi-layered metal pattern MP2 is formed in the interlayer insulating film, and the metal patterns MP2 adjacent to each other in the lamination direction are connected with the plugs. Similarly, the outer ring OUR2 includes the metal pattern MP3. Namely, the field insulating film STI is formed on the semiconductor substrate 1S, and the interlayer insulating film is formed over the field insulating film STI. Additionally, the multi-layered metal pattern MP3 is formed in the interlayer insulating film, and the metal patterns MP3 adjacent to each other in the lamination direction are connected with plugs. As described above, the outer ring OUR1 includes a laminated structure including the plurality of metal patterns MP2 arranged in a laminated manner so as to overlap with each other in plan view, and the plurality of plugs that mutually connects the metal patterns MP2 adjacent to each other in the lamination direction. Similarly, the outer ring OUR2 includes a laminated structure including the plurality of metal patterns MP3 arranged in a laminated manner so as to overlap with each other in plan view, and the plurality of plugs that mutually connects the metal patterns MP3 adjacent to each other in the lamination direction.

Next, as shown in FIG. 9, the scribe region SCR is formed outside the ring region RR in which the seal ring SR, the groove portion DIT, the outer ring OUR1, and the outer ring OUR2 have been formed.

In the scribe region SCR shown in FIG. 9, the field insulating film STI is formed over the semiconductor substrate 1S, and the interlayer insulating film is formed over the field insulating film STI. The surface protection film PAS is formed over this interlayer insulating film. It is to be noted that although, for example, a TEG pattern may be formed in the scribe region SCR, illustration of the TEG pattern is omitted in the present first embodiment.

<Features in First Embodiment> The semiconductor wafer (semiconductor device) in the present first embodiment is configured as described above, and feature points thereof will be explained hereinafter. A first feature point of the present first embodiment lies in the point that in the ring region RR, the outer ring OUR1 is provided outside the seal ring SR, and the outer ring OUR2 is provided outside the outer ring OUR1.

Thereby, for example, when the scribe region SCR located outside the ring region RR is cut by a dicing blade, a crack can be prevented from reaching even the seal ring SR that exists in the ring region RR. That is, in the present first embodiment, since the outer rings OUR1 and OUR2 are provided outside the seal ring SR, the crack reaches the outer ring OUR1 or the outer ring OUR2 before reaching the seal ring SR, and stops there. As a result of this, according to the present first embodiment, a crack occurring in the dicing step can be prevented from reaching even the seal ring SR that exists in the ring region RR.

Figure 10:
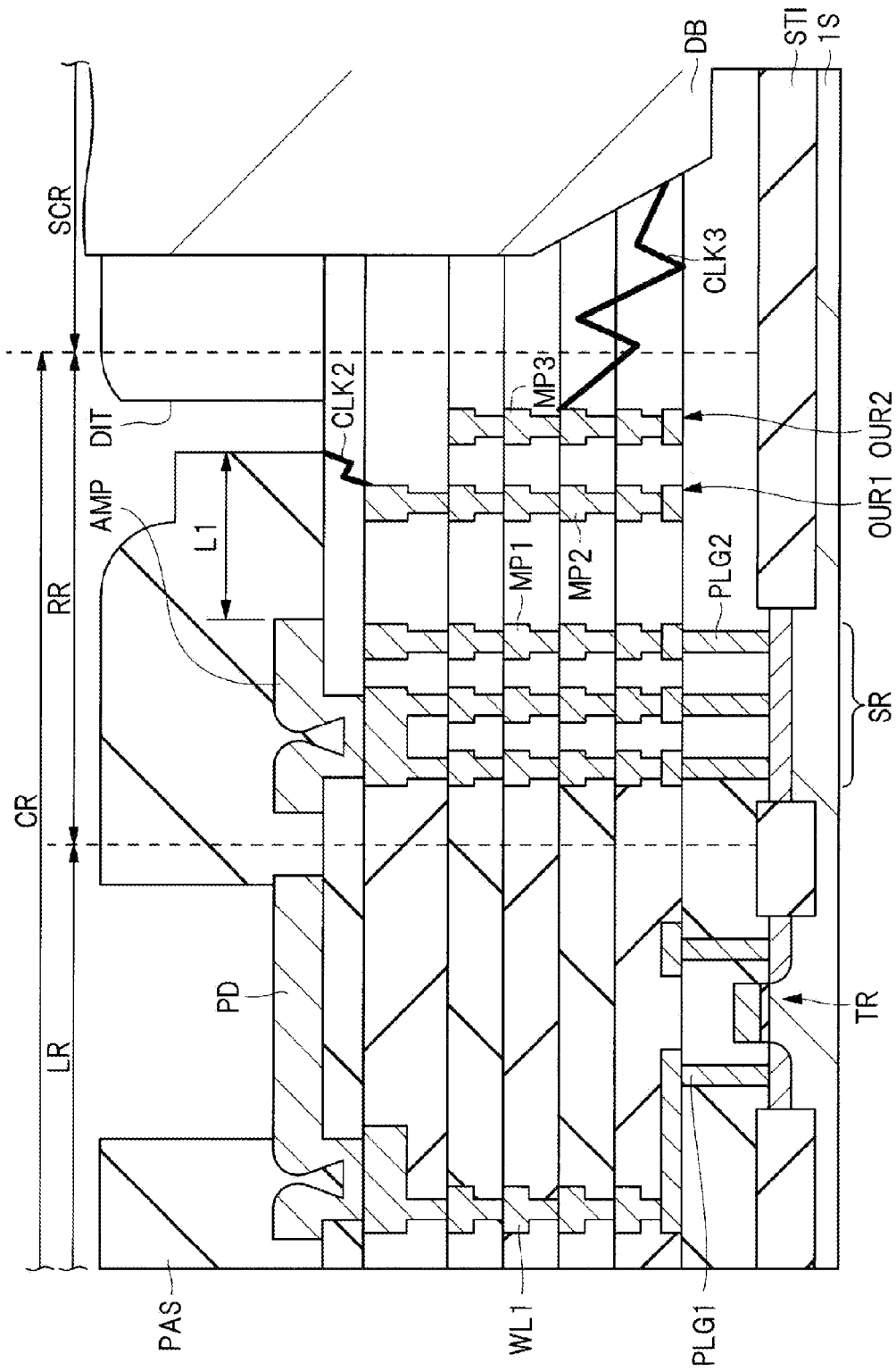
FIG. 10 is a cross-sectional view showing a step of dicing a semiconductor wafer in a first embodiment.

Hereinafter, this point will be explained in detail. FIG. 10 is a cross-sectional view showing a step of dicing the semiconductor wafer in the present first embodiment. In FIG. 10, shown is a state where the scribe region SCR is cut by the rotating dicing blade DB.

In FIG. 10, for example, when the scribe region SCR is cut by the dicing blade DB, a force is applied to the semiconductor wafer. At this time, in the semiconductor wafer in the present first embodiment, the groove portion DIT is provided outside the seal ring SR formed in the ring region RR. In this case, for example, as shown in FIG. 10, it is conceived that the crack CLK2 occurring in the dicing step may usually occur with the bottom of the groove portion DIT being as the starting point, the bottom being intentionally formed so as to be easily broken.

However, there is conceived not only a case where the crack CLK2 having occurred with the bottom of the groove portion DIT being as the starting point progresses toward the scribe region SCR outside the ring region RR, but a case where it progresses toward the seal ring SR arranged inside the groove portion DIT. That is, even though the easily broken groove portion DIT is intentionally provided, the progressing direction of the crack CLK2 having occurred at the bottom of the groove portion DIT cannot be controlled. As a result of this, as shown in FIG. 10, there is conceived the case where the crack CLK2 having occurred at the bottom of the groove portion DIT progresses toward the seal ring SR.

On this point, the outer ring OUR1 is provided between the seal ring SR and the groove portion DIT in the present first embodiment. For this reason, even if, as shown in FIG. 10, the crack CLK2 having occurred at the bottom of the groove portion DIT progresses toward the seal ring SR, the crack CLK2 inevitably reaches the outer ring OUR1 before reaching the seal ring SR. Namely, in the present first embodiment, the outer ring OUR1 is provided in an inner region closer to a seal ring SR side than the groove portion DIT. Thereby, progress of the crack CLK2 stops at a stage of having reached the outer ring OUR1.

That is, according to the present first embodiment, even though the crack CLK2 with the bottom of the groove portion DIT being as the starting point progresses to the seal ring SR side, the bottom being intentionally formed so as to be easily broken, the crack stops at the outer ring OUR1 serving as a barrier before reaching the seal ring SR. For this reason, destruction of the seal ring SR by the crack CLK2 can be prevented.

Accordingly, according to the present first embodiment, destruction of the seal ring SR due to the crack CLK2 can be effectively prevented by providing the outer ring OUR1 between the seal ring SR and the groove portion DIT. As a result of this, according to the present first embodiment, entering of moisture to the circuit region LR due to destruction of the seal ring SR by the crack CLK2 can be reliably prevented, and thereby reliability of the semiconductor wafer and the semiconductor chip (semiconductor device) obtained by dicing the semiconductor wafer can be improved.

As described above, in the present first embodiment, the feature lies in the point that the outer ring OUR1 is provided outside the seal ring SR and inside the groove portion DIT. For example, when the outer ring OUR1 is formed outside the groove portion DIT even though the outer ring OUR1 is formed outside the seal ring SR, the outer ring OUR1 does not become any barrier with respect to the crack CLK2 that progresses to the seal ring SR side with the bottom of the groove portion DIT being as the starting point. In contrast with this, as in the present first embodiment, precisely because the outer ring OUR1 is located outside the seal ring SR, and is formed inside the groove portion DIT, the outer ring OUR1 functions as the barrier to stop the progress of the crack CLK2 to the seal ring SR with respect to the crack CLK2 that progresses to the seal ring SR side with the bottom of the groove portion DIT being as the starting point. Namely, destruction of the seal ring SR due to the crack CLK2 reaching the seal ring SR can be prevented only by providing the outer ring OUR1 outside the seal ring SR and inside the groove portion DIT.

Subsequently, in the present first embodiment, the outer ring OUR2 is provided outside the outer ring OUR1 so as to overlap with the groove portion DIT in plan view. Thereby, advantages shown hereinafter can also be obtained. Namely, when the force (stress) applied to the semiconductor wafer in the dicing step is too strong, for example, as shown in FIG. 10, there is a case where the bottom of the groove portion DIT may not serve as the starting point of occurrence of a crack CLK3, but a contact region of the dicing blade DB and the semiconductor wafer may serve as the starting point. In this case, the crack CLK3 progresses toward the seal ring SR, and when the crack CLK3 reaches the seal ring SR, the seal ring SR may be destroyed.

On this point, the outer ring OUR2 is provided outside the outer ring OUR1 in the present first embodiment. For this reason, even if, as shown in FIG. 10, the crack CLK3 with the contact region of the dicing blade DB and the semiconductor wafer being as a starting point occurs, the crack CLK3 inevitably reaches the outer ring OUR2 before reaching the seal ring SR. Namely, the outer ring OUR2 is provided outside the seal ring in the present first embodiment. Thereby, progress of the crack CLK3 stops at a stage of having reached the outer ring OUR2.

Accordingly, according to the present first embodiment, destruction of the seal ring SR due to the crack CLK3 can be effectively prevented by providing the outer ring OUR2 outside the seal ring SR. As a result of this, according to the present first embodiment, entering of moisture to the circuit region LR due to destruction of the seal ring SR by the crack CLK3 can be reliably prevented, and thereby reliability of the semiconductor wafer and the semiconductor chip (semiconductor device) obtained by dicing the semiconductor wafer can be improved.

Here, a main reason that the outer ring OUR1 is provided outside the seal ring SR and inside the groove portion DIT is to prevent from reaching even the seal ring SR the crack CLK2 that progresses to the seal ring SR side with the bottom of the groove portion DIT being as the starting point. Furthermore, it is conceived that the outer ring OUR1 also has a function to prevent the progress of the crack CLK3 to the seal ring SR side even if the crack CLK3 with the contact region of the dicing blade DB and the semiconductor wafer being as the starting point. That is, it can be conceived that as long as the outer ring OUR1 is provided, there is no need to provide the outer ring OUR2.

However, the outer ring OUR2 is provided outside the outer ring OUR1 in the present first embodiment. Hereinafter, this reason will be explained. For example, when the force (stress) applied to the semiconductor wafer in the dicing step is too strong, there is the case where the bottom of the groove portion DIT may not serve as the starting point of occurrence of the crack CLK3, but the contact region of the dicing blade DB and the semiconductor wafer may serve as the starting point. Namely, it is conceived that the crack CLK3 that occurs with the contact region of the dicing blade DB and the semiconductor wafer being as the starting point may be caused by a strong stress (force) in many cases. In this case, the crack CLK3 becomes large, and only with the configuration in which only the outer ring OUR1 is provided, a possibility increases that the large crack CLK3 breaks through the outer ring OUR1, reaches even the seal ring SR located inside the outer ring OUR1, and destroys the seal ring SR.

Consequently, the outer ring OUR2 is provided outside the outer ring OUR1 in the present first embodiment. In this case, the crack CLK3 that occurs with the contact region of the dicing blade DB and the semiconductor wafer being as the starting point first progresses from the scribe region SCR to the ring region RR, and reaches the outer ring OUR2. Although hopefully the crack CLK3 stops at this stage, it is assumed that the crack CLK3 breaks through the outer ring OUR2 depending on a size of the crack CLK3. However, the outer ring OUR1 is provided inside the outer ring OUR2 in the present first embodiment. As a result of this, according to the present first embodiment, it is conceived that even though the crack CLK3 breaks through the outer ring OUR2, it reaches the outer ring OUR1 arranged inside the outer ring OUR2, and stops at the outer ring OUR1. Namely, in the present first embodiment, it is configured such that the crack CLK3 occurring by a comparatively strong stress is stopped at either the outer ring OUR2, which is a first barrier, or the outer ring OUR1, which is a second barrier. That is, in the present first embodiment, it is configured such that even the crack CLK3 occurring by the comparatively strong stress becomes difficult to reach even the seal ring SR formed inside the outer ring OUR1 by a double barrier structure of the outer ring OUR2 and the outer ring OUR1. From this, the configuration in which the outer ring OUR2 is provided outside the outer ring OUR1 is the useful configuration from a viewpoint of preventing destruction of the seal ring SR due to the crack CLK3 occurring by the comparatively strong stress.

From the above-mentioned reason, the outer ring OUR2 is provided outside the outer ring OUR1 in the present first embodiment. Additionally, this outer ring OUR2 is arranged so as to overlap with the groove portion DIT in plan view.

Hereinafter, this reason will be explained. For example, when the outer ring OUR2 is arranged outside the groove portion DIT, it is necessary to secure a space to arrange the outer ring OUR2 outside the groove portion DIT in the ring region RR. This means that a width of the ring region RR becomes large, and a size of the chip region CR including the ring region RR increases. Consequently, in the present first embodiment, the outer ring OUR2 is provided in the region that overlaps with the groove portion DIT in plan view in order to reduce the size of the ring region RR. In this case, increase of the size of the ring region RR by providing the outer ring OUR2 can be suppressed.

Meanwhile, it is also conceived that the outer ring OUR2 is also arranged inside the groove portion DIT together with the outer ring OUR1. That is, it is conceived that the outer ring OUR1 and the outer ring OUR2 are provided between the seal ring SR and the groove portion DIT. In this case, a distance between the outer ring OUR2, and a boundary line between the scribe region SCR and the ring region RR becomes large. As a result of this, for example, as shown in FIG. 10, although progress of the crack CLK3 occurring with the contact region of the dicing blade DB and the semiconductor wafer being as the starting point stops at the outer ring OUR2, when the above-mentioned distance between the boundary line and the outer ring OUR2 becomes large, a part of the crack CLK3 remains in the semiconductor chip (in the ring region RR) even after the chip region CR is separated into the semiconductor chips in the dicing step. Although the semiconductor chip is packaged in a subsequent step, it can also be conceived that the remaining crack CLK3 grows by a heat load or a stress applied in a packaging step, and eventually reaches even the seal ring SR to destroy the seal ring SR. Accordingly, the crack CLK3 that remains in the semiconductor chip is desirably as small as possible. Thereby, it is useful that the outer ring OUR2 is arranged as close as possible to the above-mentioned boundary line. The reason is that the smaller becomes the above-mentioned distance between the boundary line and the outer ring OUR2, the smaller becomes a size of the crack CLK3 that remains in the separated semiconductor chip (in the ring region RR), and the larger also becomes a distance between the remaining crack CLK3 and the seal ring SR. As a result of this, even if the heat load and a heat stress in the subsequent packaging step are applied, a possibility of the grown crack CLK3 reaching the seal ring SR can be reduced. For this reason, in the present first embodiment, the outer ring OUR2 is provided outside the outer ring OUR1, and this outer ring OUR2 is arranged so as to overlap with the groove portion DIT in plan view.

From the discussion described above, in the present first embodiment, destruction of the seal ring SR due to the crack CLK2 can be effectively prevented by providing the outer ring OUR1 between the seal ring SR and the groove portion DIT. Furthermore, in the present first embodiment, the outer ring OUR2 is provided outside the outer ring OUR1, and this outer ring OUR2 is arranged so as to overlap with the groove portion DIT in plan view. As a result of this, according to the present first embodiment, a possibility can be increased that the crack CLK3 occurring by the comparatively strong stress stops at either the outer ring OUR2, which is the first barrier, or the outer ring OUR1, which is the second barrier. From this, according to the present first embodiment, destruction of the seal ring SR due to the crack CLK3 occurring by the comparatively strong stress can also be prevented. As a result of this, in the present first embodiment, entering of moisture to the circuit region LR due to destruction of the seal ring SR by the crack CLK2 and the crack CLK3 can be reliably prevented, and thereby reliability of the semiconductor wafer and the semiconductor chip (semiconductor device) obtained by dicing the semiconductor wafer can be improved.

Furthermore, according to the present first embodiment, the size of the chip region CR including the ring region RR can be reduced while preventing destruction of the seal ring SR due to the cracks CLK2 and CLK3. For example, in a case of a configuration in which the outer rings OUR1 and OUR2 are not provided, there is a need to increase the distance L1 shown in FIG. 10 in order to prevent destruction of the seal ring SR due to the crack CLK2 that progresses to the seal ring SR side with the bottom of the groove portion DIT being as the starting point. This means that the size of the ring region RR becomes large, and since the ring region RR constitutes a part of the chip region CR, eventually, the size of the chip region CR becomes large. As a result of this, the number of the semiconductor chips obtained from a single semiconductor wafer decreases, and thereby there is concern over the rise of manufacturing cost of the semiconductor device.

In contrast with this, in the present first embodiment, as shown in FIG. 10, the outer ring OUR1 is provided between the seal ring SR and the groove portion DIT, and the outer ring OUR2 is provided outside the outer ring OUR1 so as to planarly overlap with the groove portion DIT. These outer rings OUR1 and OUR2 have a function to stop the progress of the cracks CLK2 and CLK3, and to prevent destruction of the seal ring SR by the cracks CLK2 and CLK3 reaching even the seal ring SR. Namely, although it is desirable to largely secure the distance L1 between the seal ring SR and the groove portion DIT from a viewpoint of effectively preventing destruction of the seal ring SR, the outer rings OUR1 and OUR2 are provided in the present first embodiment, and thus destruction of the seal ring SR due to the cracks CLK2 and CLK3 can be fully prevented even if the distance L1 shown in FIG. 10 is reduced.

That is, when a probability of the seal ring SR being destroyed is made the same in the present first embodiment and the related art, the configuration in which the outer rings OUR1 and OUR2 are provided is employed in the semiconductor wafer (or the semiconductor device) in the present first embodiment, and thus the above-mentioned distance L1 can be reduced in the present embodiment as compared with the related art. This means that the size of the ring region RR can be reduced while destruction of the seal ring SR due to the cracks CLK2 and CLK3 is effectively prevented, and that eventually, the size of the chip region CR can be reduced. As a result of this, according to the present first embodiment, destruction of the seal ring SR due to the cracks CLK2 and CLK3 is prevented, and the number of chip regions CR that can be formed at a single semiconductor wafer can be increased. Namely, according to the technical idea in the present first embodiment, it is possible to obtain a prominent effect that can reduce the manufacturing cost of the semiconductor device while improving reliability of the semiconductor wafer and the semiconductor device.

When viewed from an opposite side, in the present first embodiment, when the distance L1 between the seal ring SR and the groove portion DIT is maintained to be substantially a same length as the related art, the probability of the seal ring SR being destroyed due to the cracks CLK2 and CLK3 can be significantly reduced by means of a synergetic effect of an effect that the distance L1 becomes large, and a barrier effect by the outer rings OUR1 and OUR2.

From the discussion described above, according to the technical idea in the present first embodiment, from a viewpoint of giving priority to a viewpoint that reduces a destruction probability of the seal ring SR, and reduces the manufacturing cost of the semiconductor device, the configuration can be employed in which the distance L1 between the seal ring SR and the groove portion DIT is made smaller than the related art. Meanwhile, from a viewpoint of significantly reducing the destruction probability of the seal ring SR due to the cracks CLK2 and CLK3, and giving priority to further improvement in reliability of the semiconductor device, while the outer rings OUR1 and OUR2 are provided, a configuration can be employed in which the distance L1 between the seal ring SR and the groove portion DIT is set to be substantially the same as the related art. As described above, in the technical idea in the present first embodiment, it is possible to obtain a prominent effect that can also achieve the improvement of a degree of freedom of design according to an object.

It is to be noted that in the present first embodiment, the seal ring SR, and the outer rings OUR1 and OUR2 are common in terms of all including a laminated structure that functions as a protection barrier. However, the seal ring SR, and the outer rings OUR1 and OUR2 originally differ in functions.

Namely, the seal ring SR has a function as the protection barrier that prevents moisture from entering the circuit region LR that exists inside the ring region RR. Accordingly, from a viewpoint of effectively preventing the entering of the moisture, it is necessary to prevent the destruction of the seal ring SR by the cracks CLK2 and CLK3. That is, the seal ring SR is a component provided on a premise of not being destroyed. The reason is that when the seal ring SR is destroyed, it becomes impossible to prevent the entering of the moisture from the ring region RR to the circuit region LR, and thereby a harmful influence is exerted on the operational reliability of the integrated circuit formed in the circuit region LR, which eventually causes the decrease of the reliability of the semiconductor device.

In contrast with this, the outer rings OUR1 and OUR2 in the present first embodiment have functions to stop the progress of the cracks CLK2 and CLK3. Accordingly, as for the outer rings OUR1 and OUR2 in the present first embodiment, destruction of the outer rings OUR1 and OUR2 themselves is not cared about as long as the progress of the cracks CLK2 and CLK3 can be stopped. The reason is that as long as progress of the cracks CLK2 and CLK3 is stopped at the outer rings OUR1 and OUR2, the cracks CLK2 and CLK3 do not reach even the seal ring SR arranged inside the outer ring OUR1, and destruction of the seal ring SR is prevented.

From this, the outer rings OUR1 and OUR2 in the present first embodiment differ from the seal ring SR on the premise of not being destroyed in a point of having the components whose destruction is not cared about. As described above, while the seal ring SR, and the outer rings OUR1 and OUR2 have the configurations including the same laminated structure, there are features specific to the outer rings OUR1 and OUR2 from the above-mentioned difference in the function. Hereinafter, the feature points will be explained.

A second feature point in the present first embodiment is the point where a height of a top surface of the outer ring OUR1 is configured higher than a height of a top surface of the outer ring OUR2. Specifically, as shown in FIG. 10, for example, the outer ring OUR1 includes a laminated structure including the first-layer metal pattern MP2 to the sixth-layer metal pattern MP2 that overlap with one another in plan view, and the plugs that connect the metal patterns MP2 adjacent to each other in the lamination direction. Meanwhile, the outer ring OUR2 includes a laminated structure including the first-layer metal pattern MP3 to the fifth-layer metal pattern MP3 that overlap with one another in plan view, and the plugs that connect the metal patterns MP3 adjacent to each other in the lamination direction. Accordingly, since the top surface of the outer ring OUR1 is a top surface of the sixth-layer metal pattern MP2, and the top surface of the outer ring OUR2 is a top surface of the fifth-layer metal pattern MP3, the height of the outer ring OUR1 is higher than that of the outer ring OUR2.

Here, there will be explained a reason for making high the height of the top surface of the outer ring OUR1. For example, in FIG. 10, the groove portion DIT is formed in the surface protection film PAS, and the crack CLK2 occurs with the bottom of the groove portion DIT being as the starting point. At this time, when the height of the top surface of the outer ring OUR1 is configured to be low, the crack CLK2 passes through above the outer ring OUR1, and a probability of the crack CLK2 reaching even the seal ring SR increases. Namely, when the height of the top surface of the outer ring OUR1 is low, a gap between the groove portion DIT and the top surface of the outer ring OUR1 is large, and the crack CLK2 is easy to pass through the gap. In other words, when the height of the top surface of the outer ring OUR1 is low, the crack CLK2 progresses to the seal ring SR side with the bottom of the groove portion DIT being as the starting point. That is, when the height of the top surface of the outer ring; OUR1 is high, prevention of the progress to the seal ring SR side of the crack CLK2 having occurred at the bottom of the groove portion DIT becomes less effective.

Consequently, the height of the top surface of the outer ring OUR1 is made high in the present first embodiment. Namely, the progress to the seal ring SR side of the crack CLK2 having occurred at the bottom of the groove portion DIT can be effectively prevented by setting the top surface of the outer ring OUR1 to be the top surface of the sixth-layer metal pattern MP2.

Note that it is conceived here that if the top surface of the outer ring OUR1 is made high, the outer ring OUR1 is configured so as to include not only the sixth-layer metal pattern MP2 but also a metal pattern in a same layer as the metal pattern AMP. However, in the present first embodiment, the outer ring OUR1 is not configured so as to include a metal pattern in a same layer as the metal pattern AMP formed in a top layer of the seal ring SR.

This is based on a reason shown below. Namely, for example, the second-layer metal pattern MP2 to the sixth-layer metal pattern MP2 include a fine copper pattern formed by the damascene method. Meanwhile, the metal pattern AMP formed in the top layer of the seal ring SR is formed by patterning an aluminum film. Additionally, in the same layer as the metal pattern AMP formed in the top layer of the seal ring SR, formed are a pad PD and the like that are formed in the circuit region LR, and a wiring formed with a relatively large-sized coarse pattern, such as a power supply wiring. Accordingly, patterning of the aluminum film formed in the top layer of the seal ring SR is carried out with an accuracy more moderate than the fine copper pattern formed in a lower layer by the damascene method. That is, a size of the metal pattern AMP formed in the top layer of the seal ring SR is much larger than that of the copper pattern formed in the lower layer.

From this, for example, when the outer ring OUR1 is configured so as to also include the metal pattern in the same layer as the metal pattern AMP, a width of the metal pattern of the top layer of the outer ring OUR1 is also much larger than widths of the first-layer metal pattern MP2 to the sixth-layer metal pattern MP2.

This means that the width of the outer ring OUR1 becomes large, and that thereby the distance L1 between the seal ring SR and the groove portion DIT shown in FIG. 10 becomes large. As a result of this, since the size of the ring region RR becomes large, and the ring region RR constitutes the part of the chip region CR, eventually, the size of the chip region CR becomes large. Thereby, the number of the semiconductor chips obtained from a single semiconductor wafer decreases, and thereby there is concern over the rise of manufacturing cost of the semiconductor device. Accordingly, in the present first embodiment, from a viewpoint of suppressing the increase of the size of the ring region RR, the outer ring OUR1 is not configured so as to include the metal pattern in the same layer as the metal pattern AMP formed in the top layer of the seal ring SR.

From the discussion described above, in the present first embodiment, the configuration is employed in which the increase of the size of the ring region RR is suppressed while the progress of the crack CLK2 having occurred at the bottom of the groove portion DIT to the seal ring SR side. Specifically, the outer ring OUR1 in the present first embodiment, for example, as shown in FIG. 10, includes the laminated structure including the first-layer metal pattern MP2 to the sixth-layer metal pattern MP2 that overlap with one another in plan view, and the plugs that connect the metal patterns MP2 adjacent to each other in the lamination direction. In other words, the outer ring OUR1 in the present first embodiment is configured so as not to directly come into contact with the surface protection film PAS.

Subsequently, in the present first embodiment, the height of the top surface of the outer ring OUR2 is made lower than the height of the top surface of the outer ring OUR1. Hereinafter, this reason will be explained. For example, the outer ring OUR2 is arranged so as to overlap with the groove portion DIT in plan view (refer to FIG. 8). For this reason, for example, in FIG. 10, it is conceived that when the height of the top surface of the outer ring OUR2 is made high, the top surface of the outer ring OUR2 is exposed from the bottom surface of the groove portion DIT. In this case, the groove portion DIT and the outer ring OUR2 directly come into contact with each other.

Here, the groove portion DIT is provided with the purpose of allowing easily to occur the crack CLK2 with the bottom of the groove portion DIT being as the starting point in the dicing step.

However, when it is configured such that the height of the top surface of the outer ring OUR2 is high, and that the top surface of the outer ring OUR2 is exposed from the bottom of the groove portion DIT, the bottom of the groove portion DIT cannot be made into the starting point where the crack CLK2 occurs. That is, in order to make the bottom of the groove portion DIT into the starting point of the crack CLK2, it is needed that the bottom of the groove portion DIT and the top surface of the outer ring OUR2 are spaced apart from each other, and that the interlayer insulating film is interposed in a region therebetween. In other words, in order to make the groove portion DIT into the starting point of the crack CLK2, the semiconductor chip needs to be configured such that the top surface of the outer ring OUR2 is not exposed from the bottom of the groove portion DIT.

Particularly, a distance between the bottom surface of the groove portion DIT and the top surface of outer ring OUR2, for example, needs approximately 100 nm. From this, the outer ring OUR2 in the present first embodiment, for example, as shown in FIG. 10, includes a laminated structure including the first-layer metal pattern MP3 to the fifth-layer metal pattern MP3 that overlap with one another in plan view, and the plugs that connect the metal patterns MP3 adjacent to each other in the lamination direction. As a result of this, the height of the top surface of the outer ring OUR2 in the present first embodiment is lower than the height of the top surface of the outer ring OUR1.

Next, a third feature point in the present first embodiment lies in a point where, for example, as shown in FIG. 10, in the ring region RR, whereas the seal ring SR is configured to be connected to the semiconductor substrate 1S, the outer rings OUR1 and OUR2 are arranged above the field insulating film STI formed at the semiconductor substrate 1S, and are arranged spaced apart from the field insulating film STI.

Specifically, the plugs PLG2 are included in the seal ring SR, and the seal ring SR and the semiconductor substrate 1S are connected to each other by these plugs PLG2. There will be explained a reason to connect the seal ring SR and the semiconductor substrate 1S with the plugs PLG2. Namely, the seal ring SR has a function to prevent entering of moisture to the circuit region LR. Accordingly, it is needed that the seal ring SR is configured as a protection barrier without a gap that moisture enters. From this, the seal ring SR is configured to include the plugs PLG2, and to be connected to the semiconductor substrate 1S with these plugs PLG2. From this, entering of the moisture from a surface of the semiconductor substrate 15 is blocked by the plugs PLG2 constituting a part of the seal rings SR. From the discussion described above, the seal ring SR in the present first embodiment is configured so as to be connected to the semiconductor substrate 15 from a viewpoint of effectively preventing entering of the moisture to the circuit region LR. At this time, for example, a reference potential may be supplied to a semiconductor region of the semiconductor substrate 1S connected to the seal ring SR through the plugs PLG2, and in this case, the reference potential is applied to the seal ring SR.

Meanwhile, as shown in FIG. 10, the outer rings OUR1 and OUR2 in the present first embodiment are arranged above the field insulating film STI formed on the semiconductor substrate 1S, and are arranged spaced apart from the field insulating film STI.

Hereinafter, this reason will be explained. Namely, the outer rings OUR1 and OUR2 in the present first embodiment are mainly intended to prevent progress of the crack CLK2 or CLK3 occurring in the dicing step to the seal ring SR side. That is, unlike the seal ring SR, the outer rings OUR1 and OUR2 in the present first embodiment are not mainly intended to prevent entering of the moisture to the circuit region LR. For this reason, the outer rings OUR1 and OUR2 in the present first embodiment are arranged above the field insulating film STI formed on the semiconductor substrate 1S, and are arranged spaced apart from the field insulating film STI. However, particularly from the viewpoint of suppressing the progress of the crack CLK3 to the seal ring SR side, it seems that the outer rings OUR1 and OUR2 may also be, for example, better to be connected to the semiconductor substrate 1S through the plugs.

However, for example, when the outer rings OUR1 and OUR2 are also configured so as to be connected to the semiconductor substrate 1S, in the ring region RR, the surface of the semiconductor substrate 1S forms a uniform flat surface from a lower layer of the seal ring SR to a lower layer of the outer rings OUR1 and OUR2. That is, the surface of the semiconductor substrate 1S is flat in the ring region RR. In this case, since particularly moisture and foreign substances easily enter along a flat surface, from the viewpoint of effectively suppressing entering of the moisture to the circuit region LR, it should be avoided to configure also the outer rings OUR1 and OUR2 to be connected to the semiconductor substrate 1S.

Consequently, in the present first embodiment, in order to avoid that the surface of the semiconductor substrate 1S is formed as the uniform flat surface in the ring region RR, while a configuration is employed in which the seal ring SR is connected to the semiconductor substrate 1S, the field insulating film STI is formed in the lower layer of the outer rings OUR1 and OUR2. In this case, since a height of a surface of the field insulating film STI differs from a height of the surface of the semiconductor substrate 1S, it can be suppressed that the uniform flat surface is formed over the ring region RR. Namely, in the present first embodiment, in the ring region RR, not the uniform flat surface but a concavo-convex shaped surface is formed by the surface of the semiconductor substrate 1S and the surface of the field insulating film STI that mutually differ in height. For this reason, according to the present first embodiment, entering of moisture and foreign substances to the circuit region LR can be effectively suppressed. As described above, in the present first embodiment, the surface of the semiconductor substrate 1S and the surface of the field insulating film STI mixedly exist in the ring region RR. Particularly, from a viewpoint of effectively preventing entering of the moisture and the foreign substances from the surface of the semiconductor substrate 1S, a region in which the surface of the semiconductor substrate 1S is exposed like an island shape may be provided inside the field insulating film STI. In this case, since a further concavo-convex shape is formed on the surface of the field insulating film STI, entering of the moisture and the foreign substances to the circuit region LR can be effectively prevented. In the present first embodiment, the surface of the field insulating film STI is formed higher than the surface of the semiconductor substrate 1S, and thereby it is suppressed that the flat surface is formed. However, the present invention is not limited to the above height relation, and the surface of the field insulating film STI is formed lower than the surface of the semiconductor substrate 1S, and thereby it is also possible to suppress that the flat surface is formed Here, in the present first embodiment, it is configured such that the field insulating film STI is formed in the lower layer of the outer rings OUR1 and OUR2 from a viewpoint of not forming the uniform flat surface. On this point, furthermore, on a premise of the above-mentioned configuration, particularly from a viewpoint of blocking a route for the crack CLK3 to progress to the seal ring SR side, there is conceived a configuration in which the outer rings OUR1 and OUR2 are, for example, connected to the field insulating film STI with the plugs.

However, in a case of this configuration, for example, a contact hole is formed in an interlayer insulating film by using an etching technology, and a plug is formed by burying a conductive material in this contact hole.

At this time, for example, when the contact hole is formed in the interlayer insulating film over the semiconductor substrate 1S by the etching technology like the seal ring SR, an etching selectivity can be secured since materials of an insulating film (for example, a silicon oxide film) constituting the interlayer insulating film, and of the semiconductor substrate 1S (silicon) are different from each other. For this reason, when the contact holes are formed over the semiconductor substrate 1S, bottoms of the plurality of contact holes are aligned at the surface of the semiconductor substrate 1S. As a result of this, the plugs PLG2 constituting the part of the seal rings SR can be accurately formed.

In contrast with this, for example, when a contact hole is formed in the interlayer insulating film over the field insulating film STI by the etching technology like the outer rings OUR1 and OUR2, the etching selectivity cannot be secured since materials of an insulating film (for example, a silicon oxide film) constituting the interlayer insulating film, and of a field insulating film (silicon oxide film) are a same kind. For this reason, when the contact holes are formed over the field insulating film STI, the bottoms of the contact holes reach even an inside of the field insulating film STI, and scatter. As a result of this, the plugs that connect the outer rings OUR1 and OUR2, and the field insulating film STI differ in size depending on products, and uniformity between the products is impaired. Accordingly, in the present first embodiment, from a viewpoint of securing uniformity between the products, a configuration is not employed in which the outer rings OUR1 and OUR2 are, for example, connected to the field insulating film STI with the plugs.

From the discussion described above, in the present first embodiment, in the ring region RR, whereas the seal ring SR is configured to be connected to the semiconductor substrate 1S, the outer rings OUR1 and OUR2 are configured to be arranged above the field insulating film STI formed on the semiconductor substrate 1S, and to be arranged spaced apart from the field insulating film STI.

Subsequently, a fourth feature point in the present first embodiment is, for example, as shown in FIG. 8, the point where the width W2 of the outer ring OUR1 and the width W3 of the outer ring OUR2 are smaller than the width W1 of the seal ring SR. Thereby, even if the outer rings OUR1 and OUR2 are provided in the chip region CR, increase of the size of the chip region CR can be suppressed to a minimum. For example, since the seal ring SR has the function as the protection barrier for preventing moisture and foreign substances from entering the circuit region, it is necessary to increase the width W1 of the seal ring SR to some extent. In contrast with this, the outer rings OUR1 and OUR2 may just stop the progress of the crack to the seal ring SR side, and they are not mainly intended to have the function to prevent entering of the moisture and the foreign substances. Rather, increasing the width W2 of the outer ring OUR1 and the width W3 of the outer ring OUR2 leads to the increase of the chip region CR. As a result of this, in the present first embodiment, the width W2 of the outer ring OUR1 and the width W3 of the outer ring OUR2 are made smaller than the width W1 of the seal ring SR. Specifically, for example, as shown in FIG. 10, the seal ring SR is configured to include the metal pattern AMP formed as the coarse pattern. In contrast with this, the outer ring OUR1 is configured not to include the metal pattern in the same layer as the metal pattern AMP constituting the part of the seal ring SR, while to include the first-layer metal pattern MP2 to the sixth-layer metal pattern MP2 that are formed as the fine pattern. Similarly, the outer ring OUR2 is configured not to include the metal pattern in the same layer as the metal pattern AMP constituting the part of the seal ring SR, while to include the first-layer metal pattern MP3 to the fifth-layer metal pattern MP3 that are formed as the fine pattern.

It is to be noted that the width W1 of the seal ring SR shown in FIG. 8 is defined as a width of a widest metal pattern of the metal patterns constituting the seal ring SR shown in FIG. 10. For example, since a width of the metal pattern AMP formed at the top layer is the largest in the seal ring SR shown in FIG. 10, the width W1 of the seal ring SR shown in FIG. 8 means a width of the metal pattern AMP shown in FIG. 10.

Meanwhile, the width W2 of the outer ring OUR1 shown in FIG. 8 is defined as a width of a widest metal pattern of the metal patterns constituting the outer ring OUR1 shown in FIG. 10. For example, since widths of the first-layer to sixth-layer metal patterns MP2 are the same as one another in the outer ring OUR1 shown in FIG. 10, the width W2 of the outer ring OUR1 shown in FIG. 8 means the width of the metal pattern MP2 constituting any of the first layer to the sixth layer shown in FIG. 10.

Similarly, the width W3 of the outer ring OUR2 shown in FIG. 8 is defined as a width of a widest metal pattern of the metal patterns constituting the outer ring OUR2 shown in FIG. 10. For example, since widths of the first-layer to fifth-layer metal patterns MP3 are the same as one another in the outer ring OUR2 shown in FIG. 10, the width W3 of the outer ring OUR2 shown in FIG. 8 means the width of the metal pattern MP3 constituting any of the first layer to the fifth layer shown in FIG. 10.

Next, a fifth feature point in the present first embodiment is, for example, as shown in FIG. 8, the point where the distance X1 between the seal ring SR and the outer ring OUR1 is larger than the distance X2 between the outer ring OUR1 and the outer ring OUR2. In other words, the fifth feature point in the present first embodiment can be said to be the point where the distance X2 between the outer ring OUR1 and the outer ring OUR2 is smaller than the distance X1 between the seal ring SR and the outer ring OUR1. Furthermore, since the outer ring OUR2 overlaps with the groove portion DIT in plan view, it can be also said that in the above-mentioned fifth feature point, the distance X1 between the seal ring SR and the outer ring OUR1 is larger than a distance between the outer ring OUR1 and the groove portion DIT. In addition, as shown in FIG. 8, in the present first embodiment, the distance X1 between the seal ring SR and the outer ring OUR1 is larger than a distance between the outer ring OUR1 and the outer peripheral line of the chip region CR.

This is a result of taking into consideration that since the seal ring SR needs to more reliably prevent entering of the moisture and the foreign substances to the circuit region LR, and to prevent destruction due to the crack, it is desirably arranged in a region away from the outer peripheral line of the chip region CR as far as possible and near the circuit region LR. Furthermore, this is the result of taking into consideration of necessity of stopping the progress of the crack in an early stage where the crack has occurred since the outer ring OUR1 has the function to prevent the progress of the crack to the seal ring SR side. From the discussion described above, in the present first embodiment, the seal ring SR, the outer ring OUR1, the outer ring OUR2, and the groove portion DIT are arranged so that the above-mentioned relation of the fifth feature point is established. Although the above relation has been explained in the region other than the corner CNR of the chip region CR, a relation in the corner CNR of the chip region CR will be explained hereinafter.

In FIG. 8, also in the corner CNR, the distance Y1 between the seal ring SR and the outer ring OUR1 is larger than the distance Y2 between the outer rings OUR1 and OUR2. However, as shown in FIG. 8, a first space between the seal ring SR and the outer ring OUR1 in the corner CNR is much larger than a second space between the seal ring SR and the outer ring OUR1 other than the corner CNR.

This takes into consideration that a crack easily occurs at the corner CNR. Namely, the crack easily occurs at the corner CNR of the chip region CR compared with the outer peripheral region other than the corner CNR. Particularly, the crack easily occurs that goes to the inside of the chip region CR from the corner CNR. In this case, for example, when the distance Y1 between the corner CNR and the seal ring SR is small, the crack having occurred at the corner CNR easily reaches the seal ring SR. As a result of this, the seal ring SR is destroyed by the crack, and the seal ring SR does not fulfill the function as the moisture protection barrier. Thereby, moisture also enters the circuit region, which is the inner region of the seal ring SR, which exerts the harmful influence on operational reliability of the integrated circuit formed in the circuit region.

From this, it is configured such that the seal ring SR has the inclined pattern in the corner CNR of the chip region CR in the present first embodiment. In this case, since the distance Y1 between the corner CNR and the seal ring SR is large, a crack can be suppressed from reaching even the seal ring SR even though the crack occurs at the corner CNR and progresses in the inner direction of the chip region CR. As a result of this, even if the crack occurs at the corner CNR in which the crack easily occurs, the potential of the seal ring SR being destroyed by the crack can be reduced. Namely, since the function of the seal ring SR as the moisture protection barrier can be maintained even if the crack occurs at the corner CNR, moisture can be prevented from entering even the circuit region LR, which is the inner region of the seal ring SR. From this, the operational reliability of the integrated circuit formed in the circuit region LR can be improved.

Meanwhile, as shown in FIG. 8, in the corner CNR, unlike the seal ring SR, the outer rings OUR1 and OUR2 are arranged even near the corner CNR. This results from a fact that the outer rings OUR1 and OUR2 have the function to stop the progress of the crack, and that there is no problem if the crack stops even though it is destroyed. Namely, in order to early stop the crack having occurred at the corner CNR, also in the corner CNR, the outer rings OUR1 and OUR2 are arranged even near the corner CNR. Thereby, according to the present first embodiment, since the progress of the crack can be stopped early at the outer rings OUR1 and OUR2 also in the corner CNR, destruction of the seal ring SR due to the crack can be prevented. As a result of this, according to the present first embodiment, reliability of the semiconductor wafer and the semiconductor chip (semiconductor device) obtained by dicing the semiconductor wafer can be improved.

It is to be noted that in the present first embodiment, as shown in FIG. 8, the distance X1 between the seal ring SR and the outer ring OUR1 is defined as the distance between the outer peripheral line of the seal ring SR and the inner peripheral line of the outer ring OUR1. Similarly, the distance X2 between the outer ring OUR1 and the outer ring OUR2 is defined as the distance between the outer peripheral line of the outer ring OUR1 and the inner peripheral line of the outer ring OUR2. Furthermore, although not shown in FIG. 8, a distance between the outer ring OUR1 and the groove portion DIT is defined as the distance between the outer peripheral line of the outer ring OUR1 and the inner peripheral line of the groove portion DIT.

Figure 11:
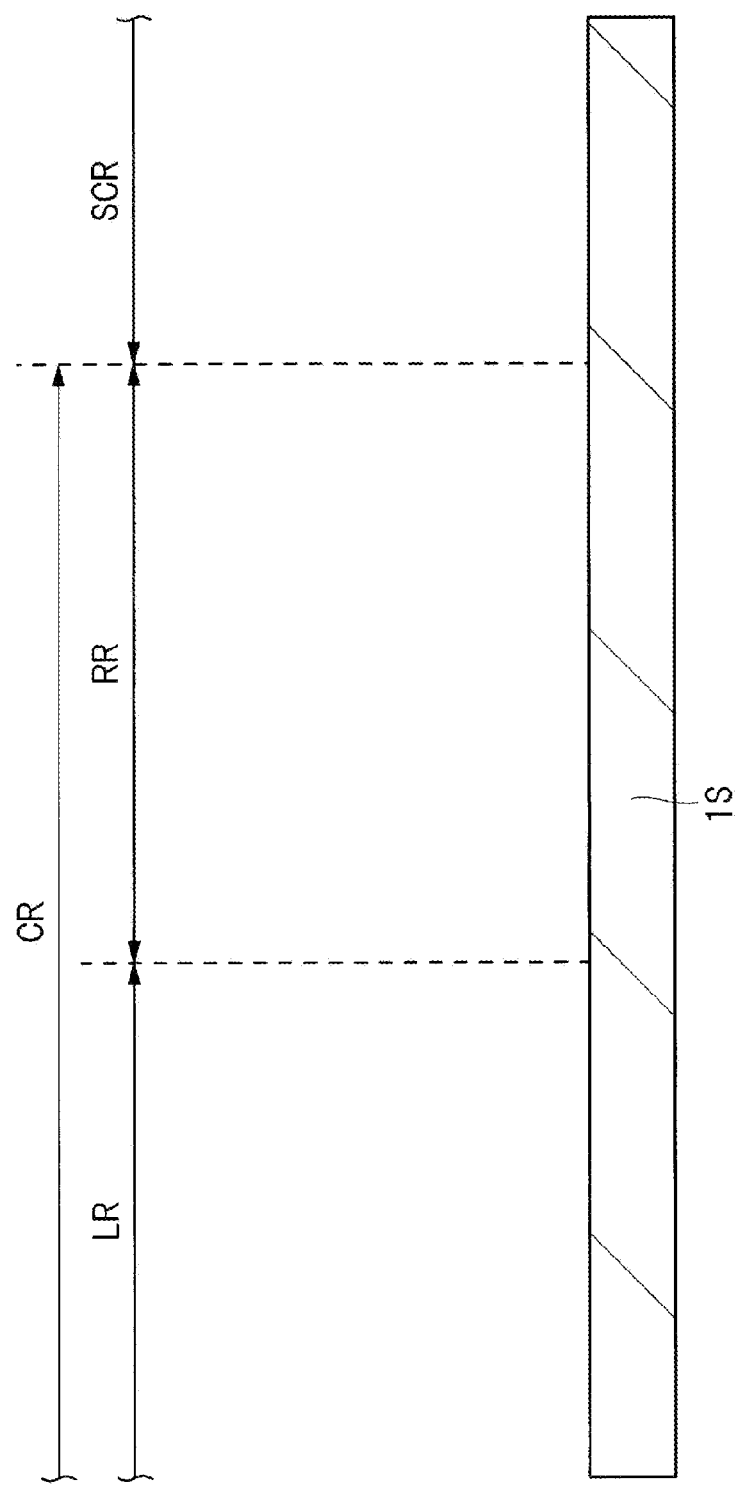
FIG. 11 is a cross-sectional view showing a manufacturing step of a semiconductor device in the first embodiment.

<Manufacturing Method of Semiconductor Device in First Embodiment>Subsequently, a manufacturing method of a semiconductor device in the present first embodiment will be explained with reference to the drawings. First, as shown in FIG. 11, for example, the semiconductor substrate 1S including silicon single crystals is prepared. The semiconductor substrate 1S is a substantially disk-shaped semiconductor wafer shown in FIG. 1, has the plurality of chip regions CR, and the chip regions CR are partitioned by the scribe region SCR. It is to be noted that as shown in FIG. 11, the chip region CR has the circuit region LR and the ring region RR, and the scribe region SCR is formed outside the ring region RR.

Figure 12:
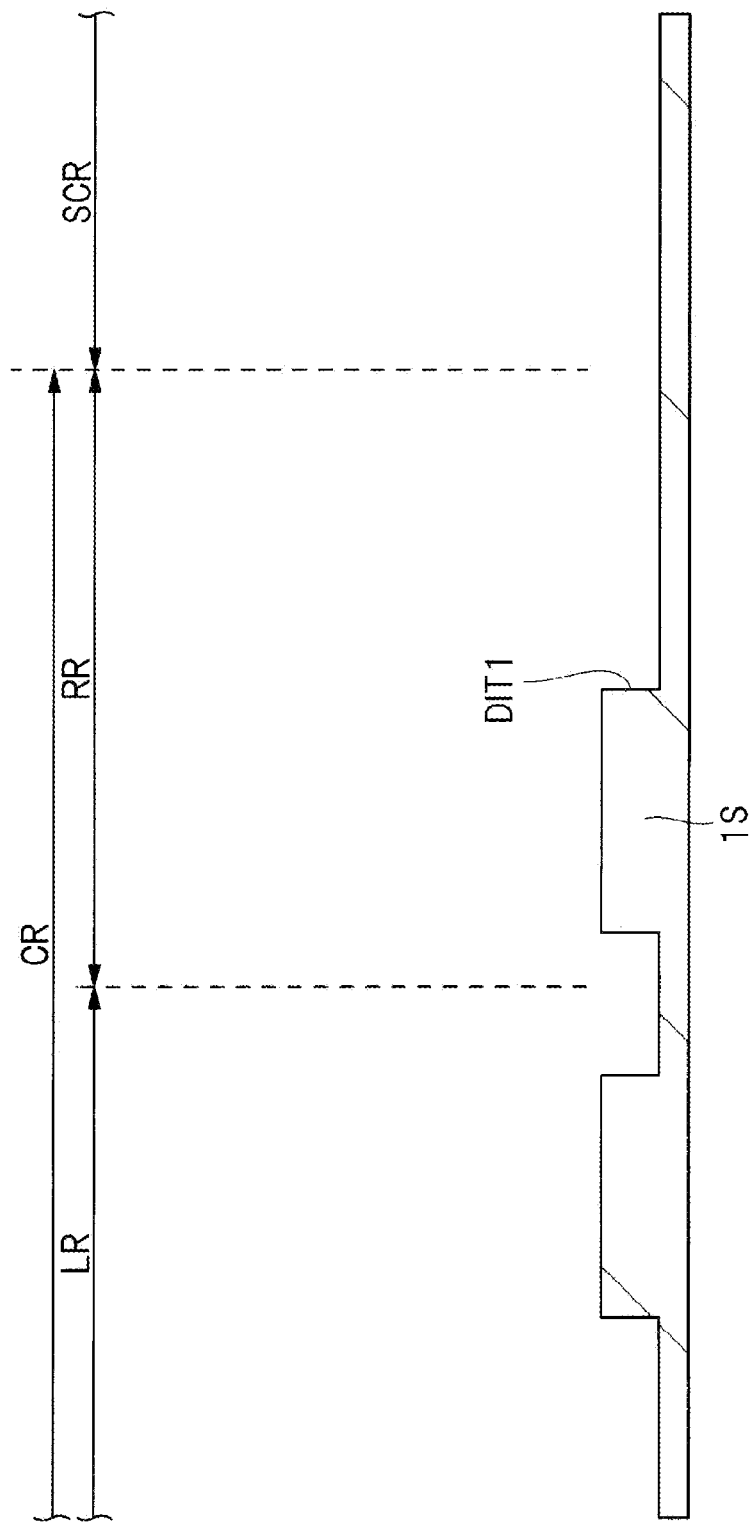
FIG. 12 is a cross-sectional view showing a manufacturing step of the semiconductor device following FIG. 11.
Figure 13:
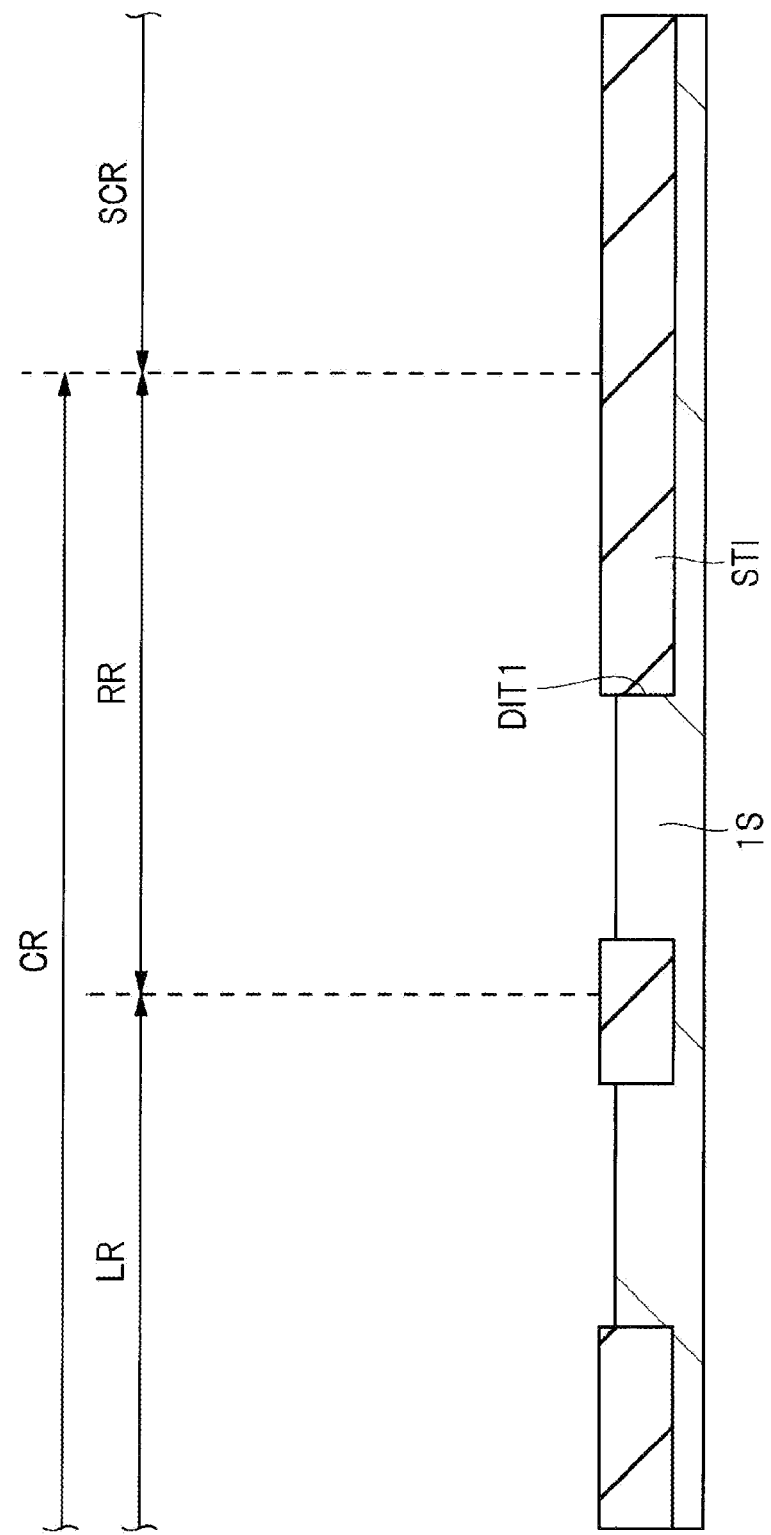
FIG. 13 is a cross-sectional view showing a manufacturing step of the semiconductor device following FIG. 12.

Next, as shown in FIG. 12, a groove DIT1 is formed in the semiconductor substrate 1S by using a photolithography technology and the etching technology. Additionally, as shown in FIG. 13 for example, an insulating film including a silicon oxide film is deposited over the semiconductor substrate 1S in which the groove DIT1 has been formed, after that, CMP (Chemical Mechanical Polishing) is used for the deposited insulating film, and thereby an unnecessary insulating film is polished. As a result of this, the field insulating film STI can be formed as shown in FIG. 13. At this time, the surface of the semiconductor substrate 1S is lower than the surface of the field insulating film STI, and a step is formed between the semiconductor substrate 1S and the field insulating film STI.

Figure 14:
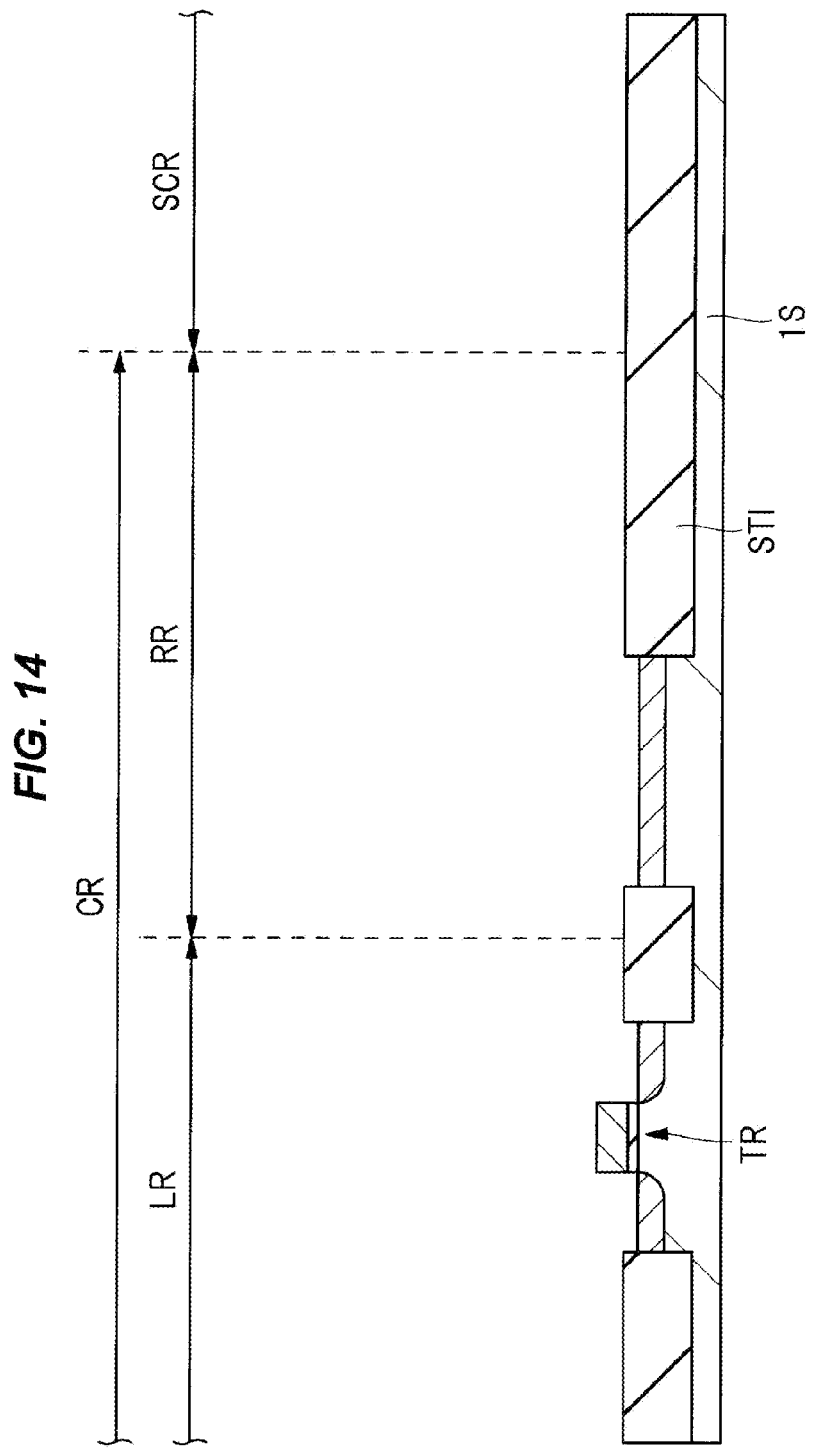
FIG. 14 is a cross-sectional view showing a manufacturing step of the semiconductor device following FIG. 13.

After that, a field effect transistor TR is formed in the circuit region LR as shown in FIG. 14. Specifically, over the semiconductor substrate 1S, for example, formed is a gate insulating film including a silicon oxide film and a high dielectric constant film whose dielectric constant is higher than the silicon oxide film, and over the gate insulating film, for example, formed is a gate electrode including a polysilicon film. Additionally, conductivity type impurities are introduced in the semiconductor substrate 1S matched to the gate electrode using an ion implantation method, and thereby a source region and a drain region are formed. In a manner described above, the field effect transistor TR can be formed in the circuit region LR.

Figure 15:
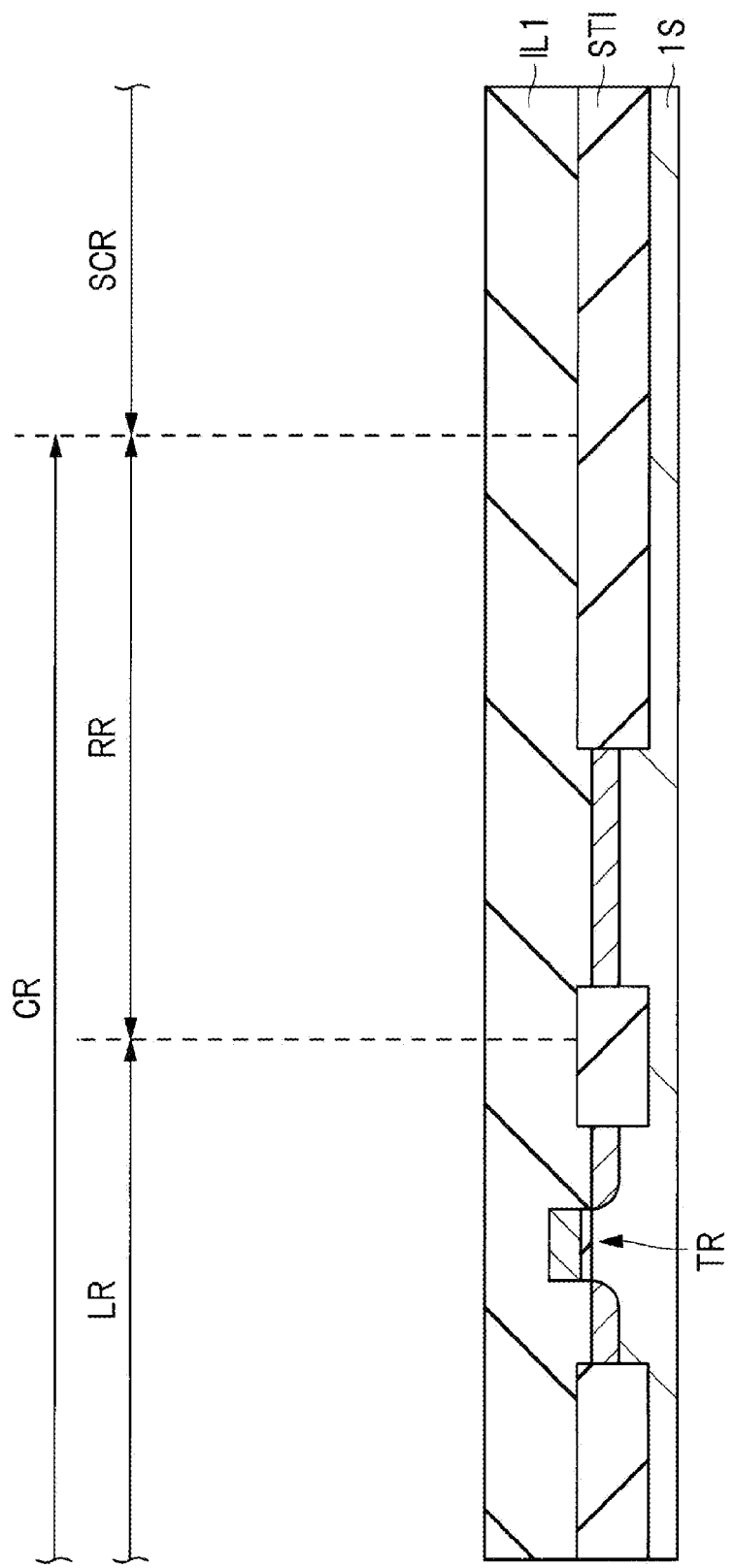
FIG. 15 is a cross-sectional view showing a manufacturing step of the semiconductor device following FIG. 14.

Subsequently, as shown in FIG. 15, an interlayer insulating film IL1 is formed over the semiconductor substrate 1S over which the field effect transistor TR has been formed. The interlayer insulating film IL1 is formed all over the main surface of the semiconductor substrate 1S including the chip region CR and the scribe region SCR.

Figure 16:
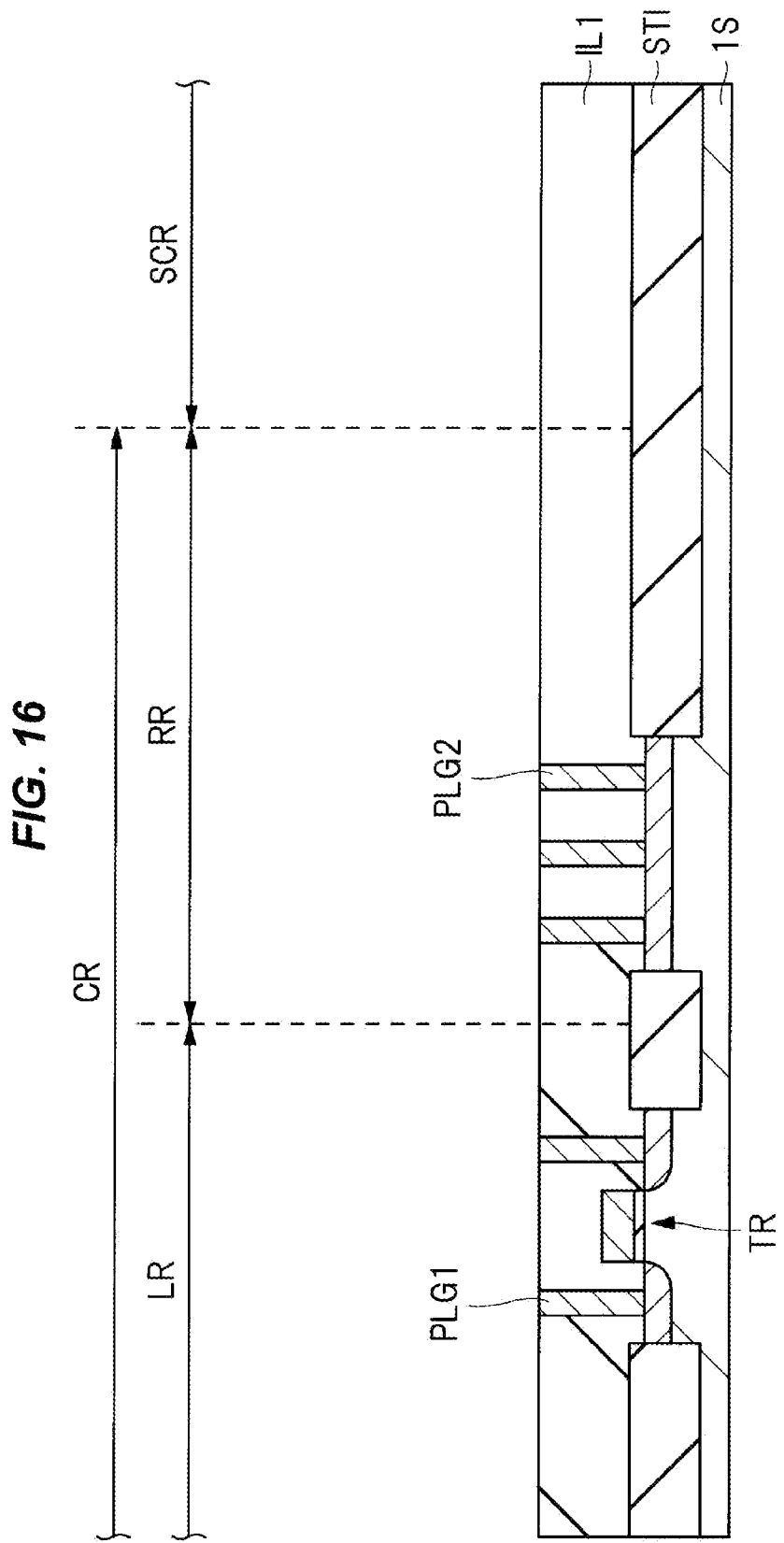
FIG. 16 is a cross-sectional view showing a manufacturing step of the semiconductor device following FIG. 15.

Next, as shown in FIG. 16, contact holes are formed in the circuit region LR and the ring region RR by using the photolithography technology and the etching technology, for example, a conductive material including tungsten is buried, and thereby the plugs PLG1 and PLG2 are formed. For example, the plugs PLG1 formed in the circuit region LR are connected to the source region and the drain region of the field effect transistor TR, and the plugs PLG2 formed in the ring region RR are connected to the semiconductor substrate 1S.

Figure 17:
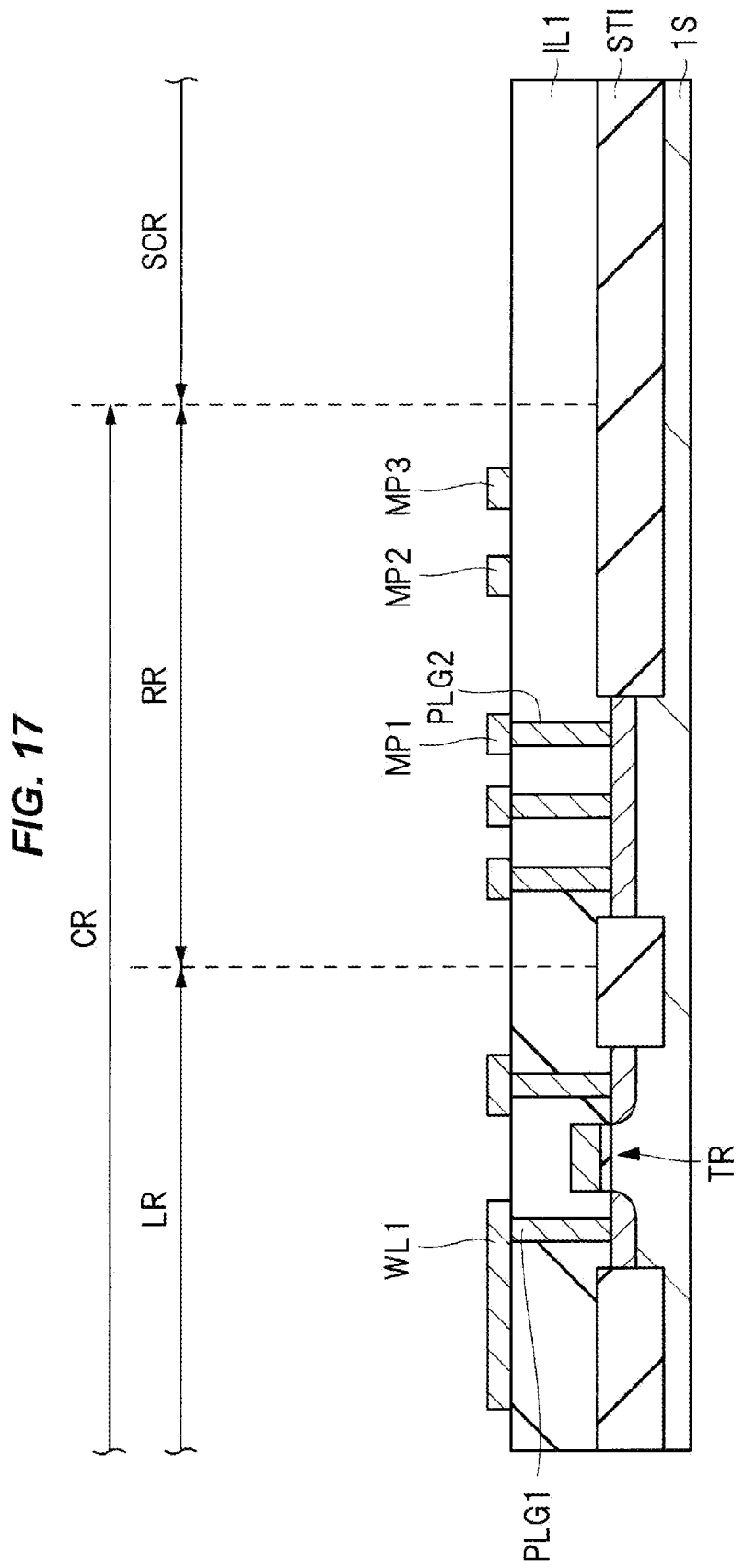
FIG. 17 is a cross-sectional view showing a manufacturing step of the semiconductor device following FIG. 16.

After that, as shown in FIG. 17, a conductor film is formed over the interlayer insulating film IL1 in which the plugs PLG1 and PLG2 have been formed, and the conductor film is patterned by using the photolithography technology and the etching technology. Thereby, the wirings WL1 connected to the plugs PLG1 are formed in the circuit region LR. Similarly, the metal patterns MP1 connected to the plugs PLG2 are formed in the ring region RR, and the metal patterns MP2 and MP3 are formed above the field insulating film STI formed in the ring region RR. The wirings WL1 and the metal patterns MP1 to MP3 are formed in a same layer.

Figure 18:
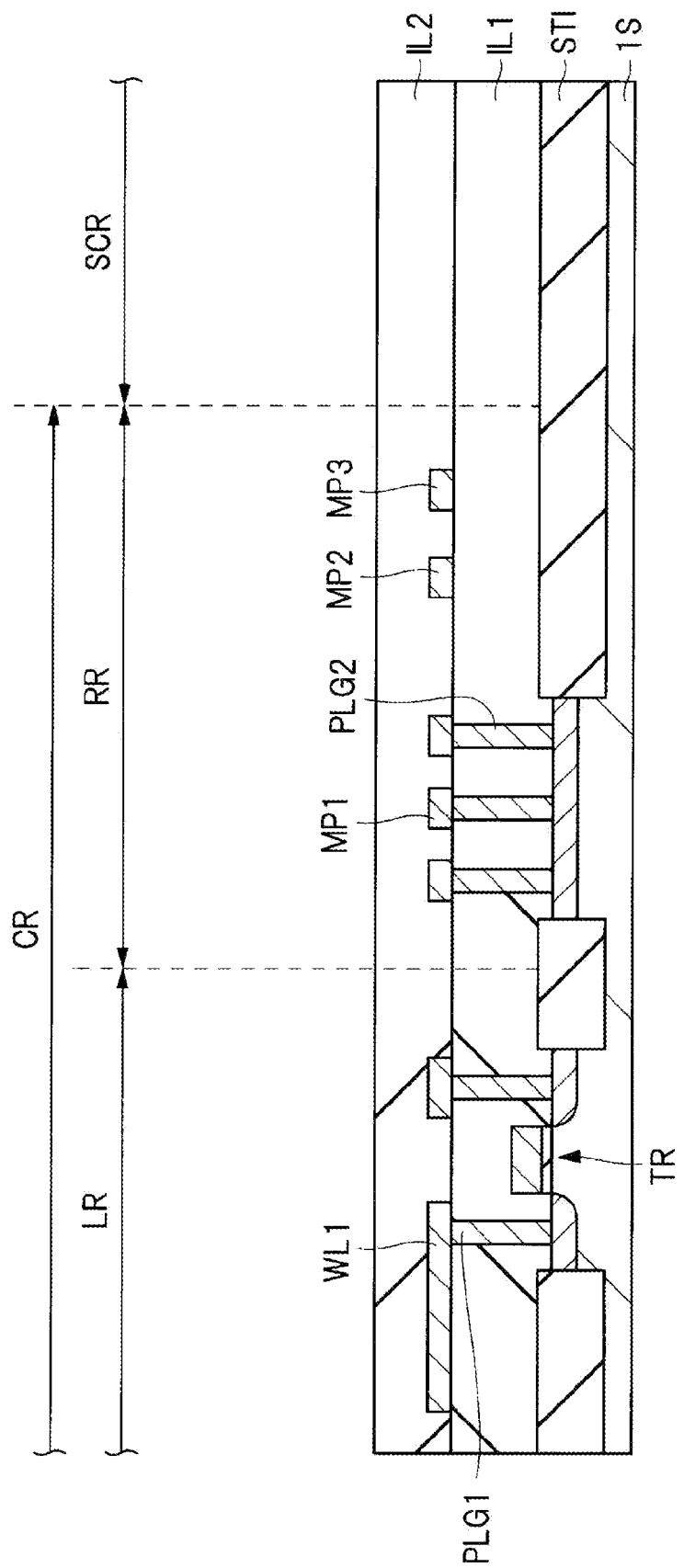
FIG. 18 is a cross-sectional view showing a manufacturing step of the semiconductor device following FIG. 17.
Figure 19:
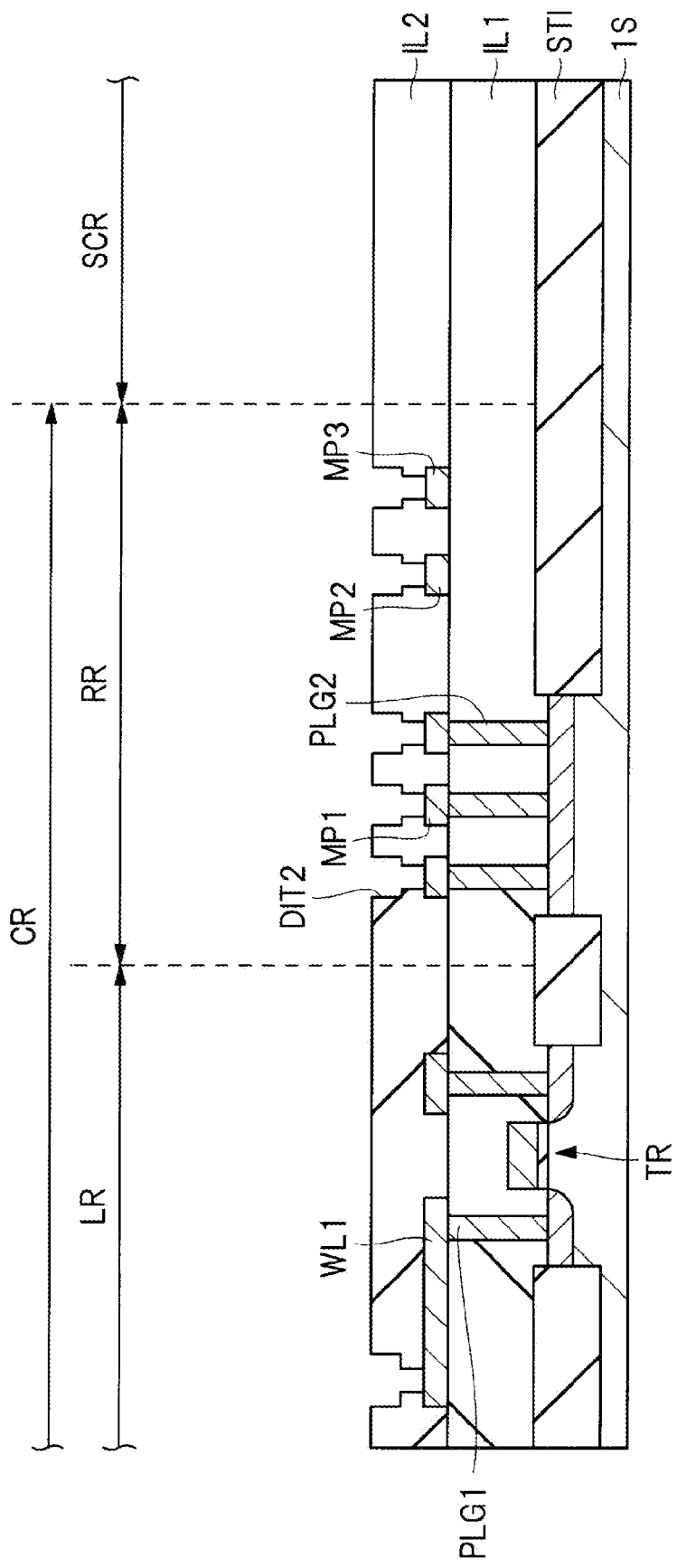
FIG. 19 is a cross-sectional view showing a manufacturing step of the semiconductor device following FIG. 18.

Subsequently, as shown in FIG. 18, an interlayer insulating film IL2 is formed over the interlayer insulating film IL1 in which the wirings WL1 and the metal patterns MP1 to MP3 have been formed. Additionally, as shown in FIG. 19, a groove DIT2 is formed in the interlayer insulating film IL2 by using the photolithography technology and the etching technology. The groove DIT2 is formed in the circuit region LR and the ring region RR, and in the circuit region LR, the groove DIT2 is formed so that a part of a surface of the wiring WL1 is exposed. Similarly, also in the ring region RR, the grooves DIT2 are formed so that parts of the surfaces of the metal patterns MP1 to MP3 are exposed.

Figure 20:
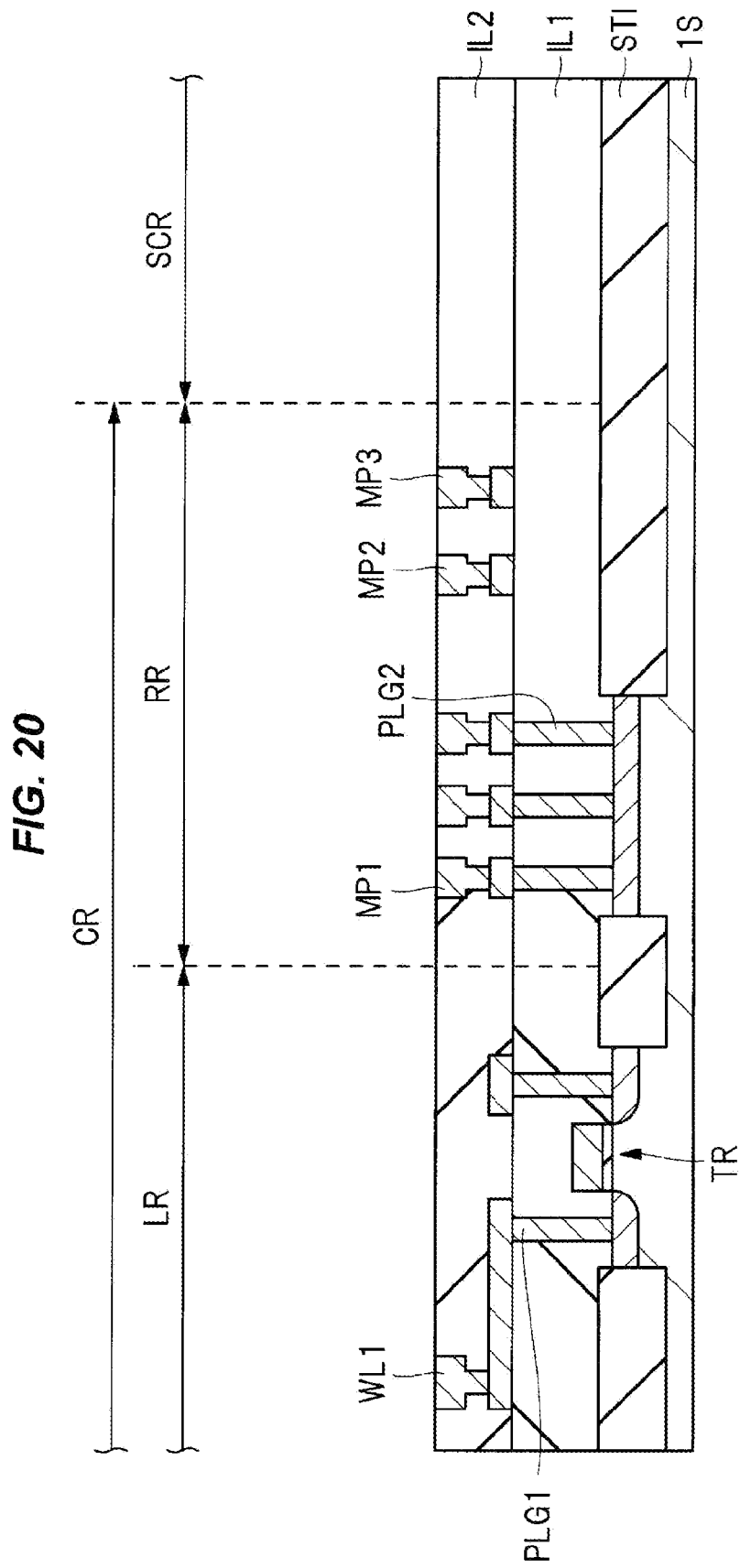
FIG. 20 is a cross-sectional view showing a manufacturing step of the semiconductor device following FIG. 19.

Next, as shown in FIG. 20, for example, a copper film is formed over the interlayer insulating film IL2 in which the grooves DIT2 have been formed, and the copper film is buried inside the grooves DIT2. After that, the unnecessary copper film formed over a surface of the interlayer insulating film IL2 is removed by a CMP method. Thereby, the second-layer wiring WL1 connected to the first-layer wiring WL1 can be formed in the circuit region LR. Similarly, in the ring region RR, can be formed the second-layer metal patterns MP1 connected to the first-layer metal patterns MP1, the second-layer metal pattern MP2 connected to the first-layer metal pattern MP2, and the second-layer metal pattern MP3 connected to the first-layer metal pattern MP3.

Figure 21:
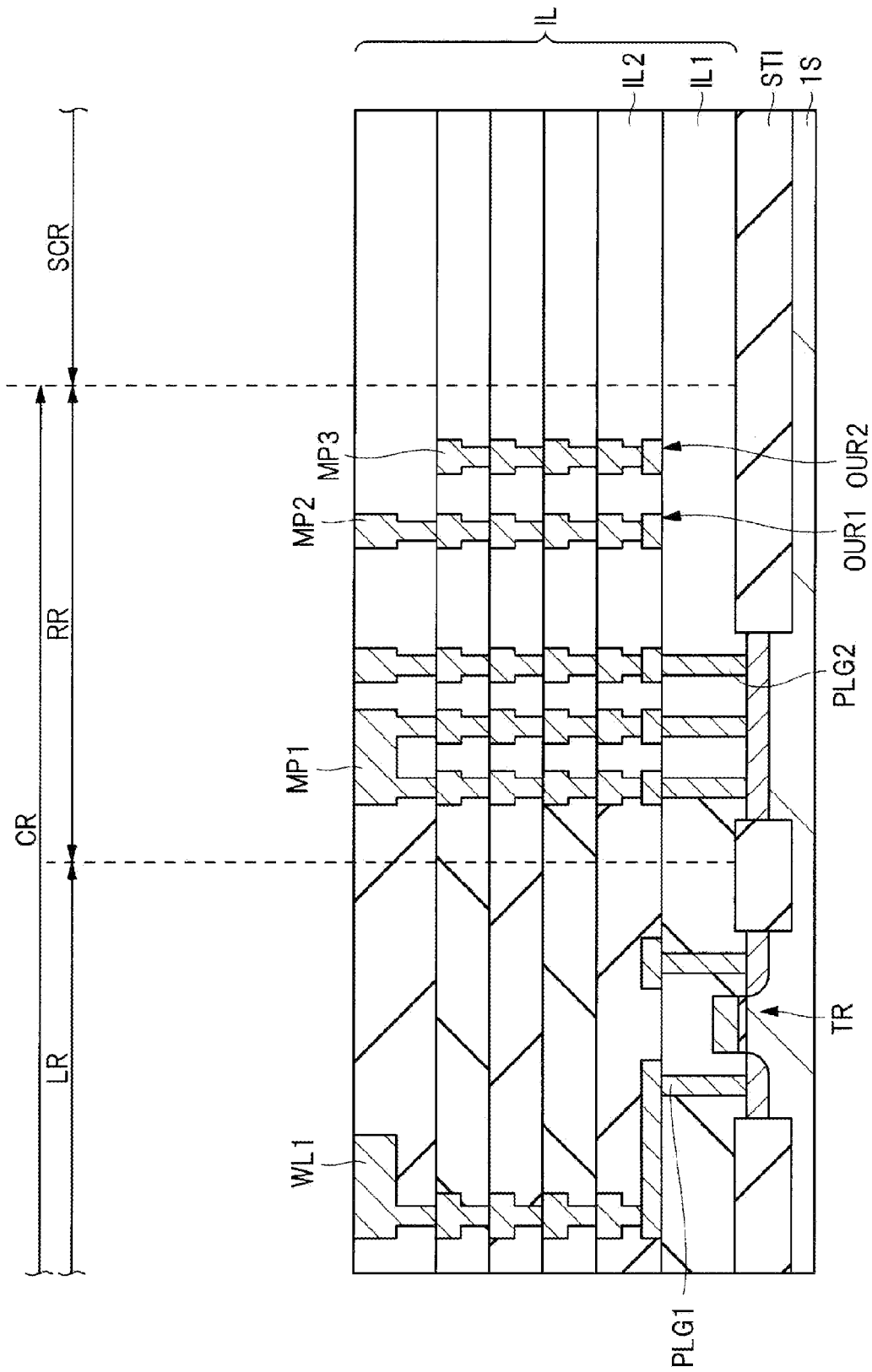
FIG. 21 is a cross-sectional view showing a manufacturing step of the semiconductor device following FIG. 20.

After that, as shown in FIG. 21, the first-layer wiring WL1 to the sixth-layer wiring WL1 are formed in the interlayer insulating film IL in the circuit region LR by repeating similar steps. Meanwhile, the first-layer metal patterns MP1 to the sixth-layer metal patterns MP1 are formed in the ring region RR. Furthermore, in the ring region RR, the first-layer metal pattern MP2 to the sixth-layer metal pattern MP2 are formed, and the outer ring OUR1 including the first-layer to sixth-layer metal patterns MP2 is formed. Similarly, in the ring region RR, the first-layer metal pattern MP3 to the sixth-layer metal pattern MP3 are formed, and the outer ring OUR2 including the first-layer to fifth-layer metal patterns MP3 is formed.

Figure 22:
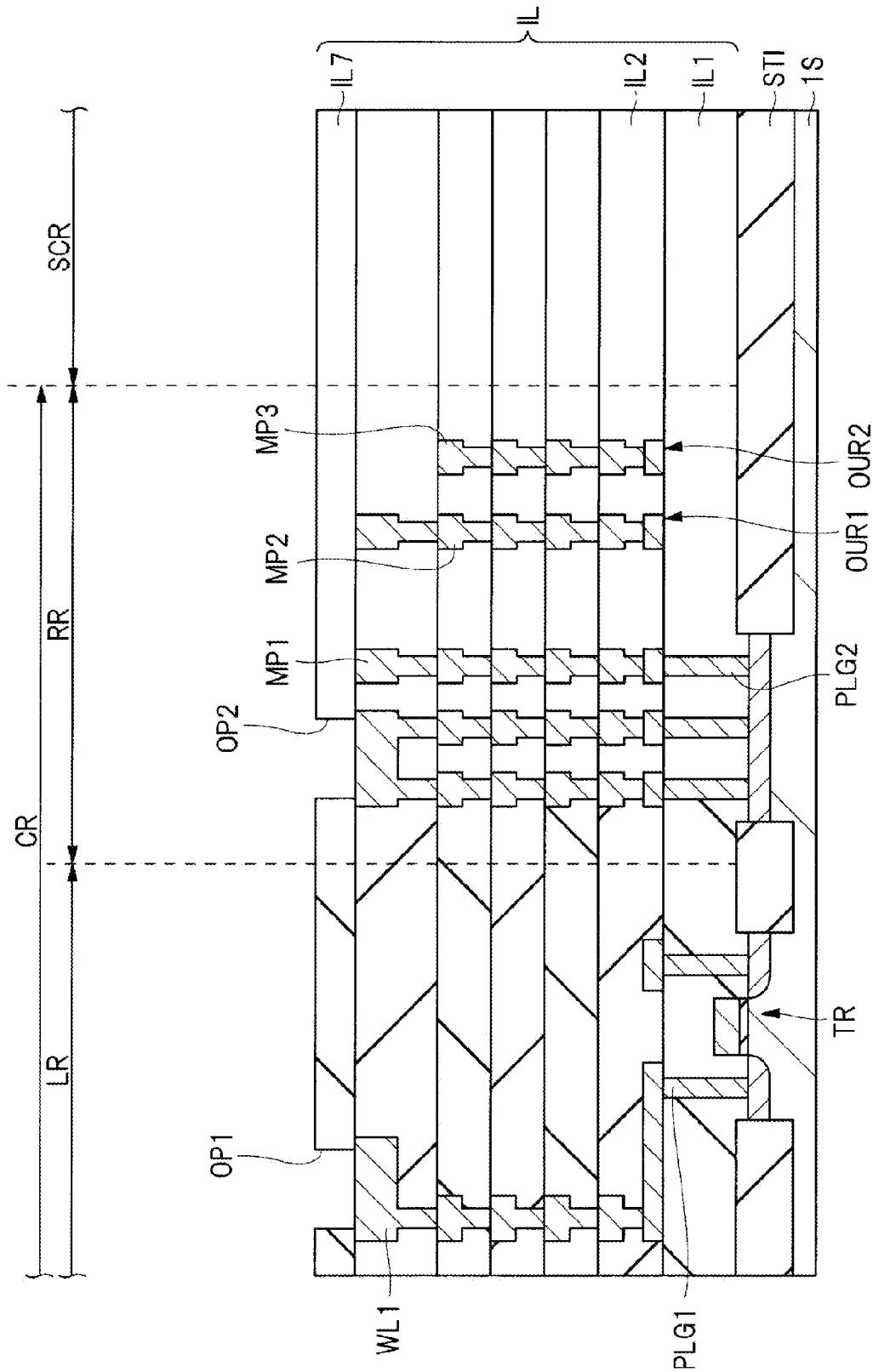
FIG. 22 is a cross-sectional view showing a manufacturing step of the semiconductor device following FIG. 21.

Additionally, as shown in FIG. 22, after an interlayer insulating film IL7 is formed, by using the photolithography technology and the etching technology, an opening OP1 is formed in the interlayer insulating film IL7 formed in the circuit region LR, and an opening OP2 is formed in the interlayer insulating film IL7 formed in the ring region RR. The opening OP1 is formed so that a part of a surface of the sixth-layer wiring WL1 is exposed, and the opening OP2 is formed so that parts of surfaces of the sixth-layer metal patterns MP1 are exposed.

Figure 23:
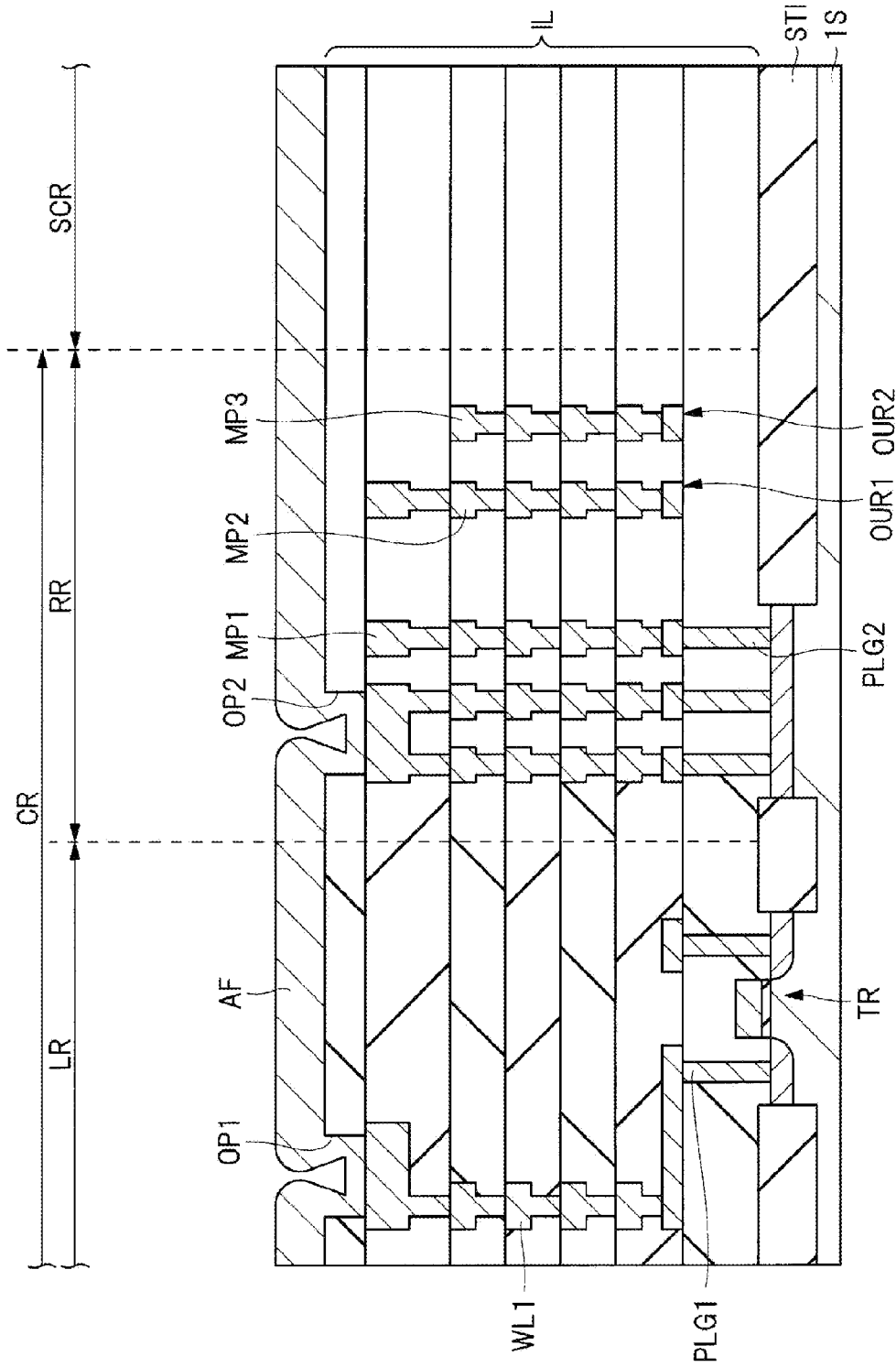
FIG. 23 is a cross-sectional view showing a manufacturing step of the semiconductor device following FIG. 22.
Figure 24:
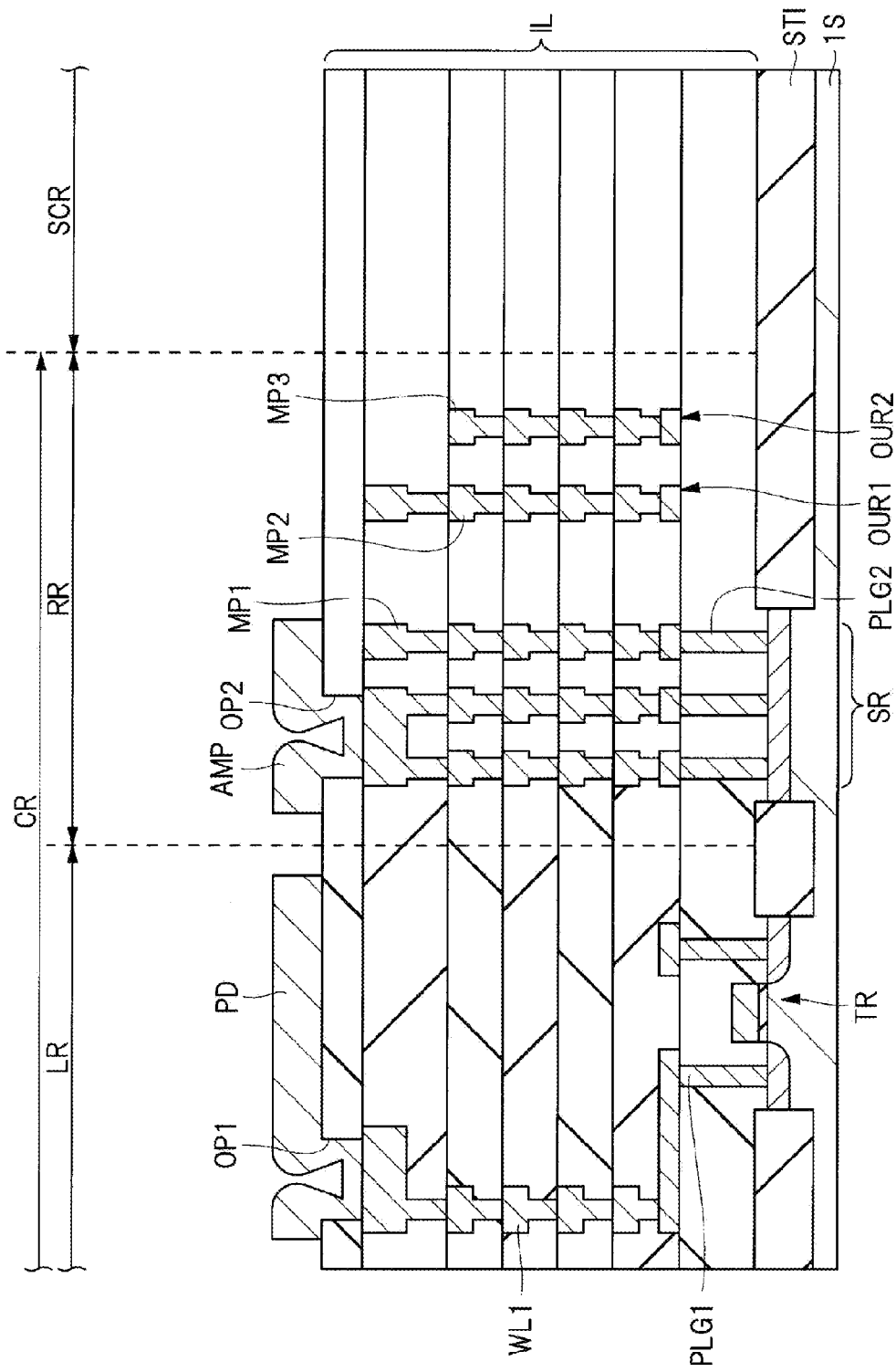
FIG. 24 is a cross-sectional view showing a manufacturing step of the semiconductor device following FIG. 23.

Subsequently, as shown in FIG. 23, for example, a conductor film including an aluminum film AF is formed over the interlayer insulating film IL7 in which the openings OP1 and OP2 have been formed. After that, as shown in FIG. 24, the aluminum film AF is patterned by using the photolithography technology and the etching technology. Thereby, the pad PD connected to the sixth-later wiring WL1 is formed in the circuit region LR, and the metal pattern AMP connected to the sixth-layer metal pattern MP1 is formed in the ring region RR. As a result of this, in the ring region RR, formed is the seal ring SR including the plugs PLG2, the first-layer to sixth-layer metal patterns MP1, and the metal pattern AMP formed in an upper layer of the sixth-layer metal pattern MP1.

Figure 25:
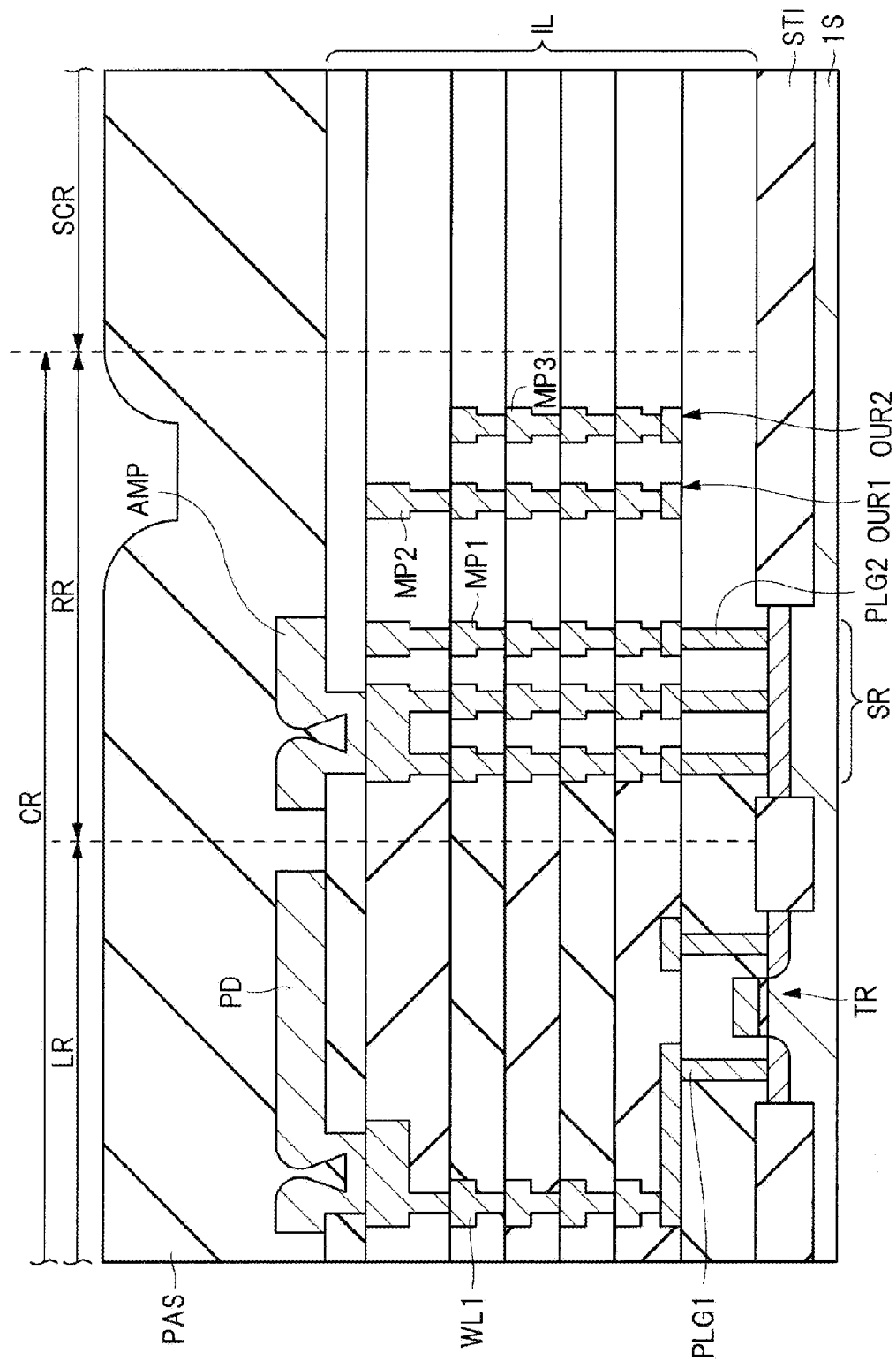
FIG. 25 is a cross-sectional view showing a manufacturing step of the semiconductor device following FIG. 24.

After that, as shown in FIG. 25, the surface protection film (passivation film) PAS is formed over the interlayer insulating film IL in which the pad PD and the metal pattern AMP have been formed. Additionally, as shown in FIG. 9, the surface protection film PAS is processed using the photolithography technology and the etching technology, and thereby a part of a surface of the pad PD is exposed in the circuit region LR, and the groove portion DIT that penetrates the surface protection film PAS is formed in the ring region RR. The groove portion DIT is formed at a position that overlaps with the outer ring OUR2 in plan view, the position being outside the outer ring OUR1. According to such a manner as described above, the semiconductor wafer in the present first embodiment can be manufactured.

Next, the scribe region SCR formed at the semiconductor wafer is cut off, for example, by a rotating dicing blade, and thereby the plurality of chip regions CR is separated to produce the plurality of semiconductor chips. At this time, in the present first embodiment, in the scribe region SCR located outside the ring region RR being cut off by the dicing blade, a crack can be prevented from reaching even the seal ring SR that exists in the ring region RR. That is, in the present first embodiment, since the outer rings OUR1 and OUR2 are provided outside the seal ring SR, the crack reaches the outer ring OUR1 or the outer ring OUR2 before reaching the seal ring SR, and stops there. As a result of this, according to the present first embodiment, the crack occurring in the dicing step can be prevented from reaching even the seal ring SR that exists in the ring region RR. As a result of this, according to the present first embodiment, even if the crack occurs due to the dicing step, destruction of the seal ring SR due to the crack can be prevented. Thereby, according to the present first embodiment, since entering of moisture and foreign substances to the circuit region LR can be suppressed by the seal ring SR, reliability of the semiconductor chip can be improved. After that, the semiconductor device in the present first embodiment can be manufactured through the packaging step.

(Second Embodiment) In the present second embodiment, there will be explained an example where the width of the outer ring OUR2 is larger than the width of the groove portion DIT, and an outer peripheral line of the outer ring OUR2 is located more inside than an outer peripheral side surface of the groove portion DIT.

Figure 26:
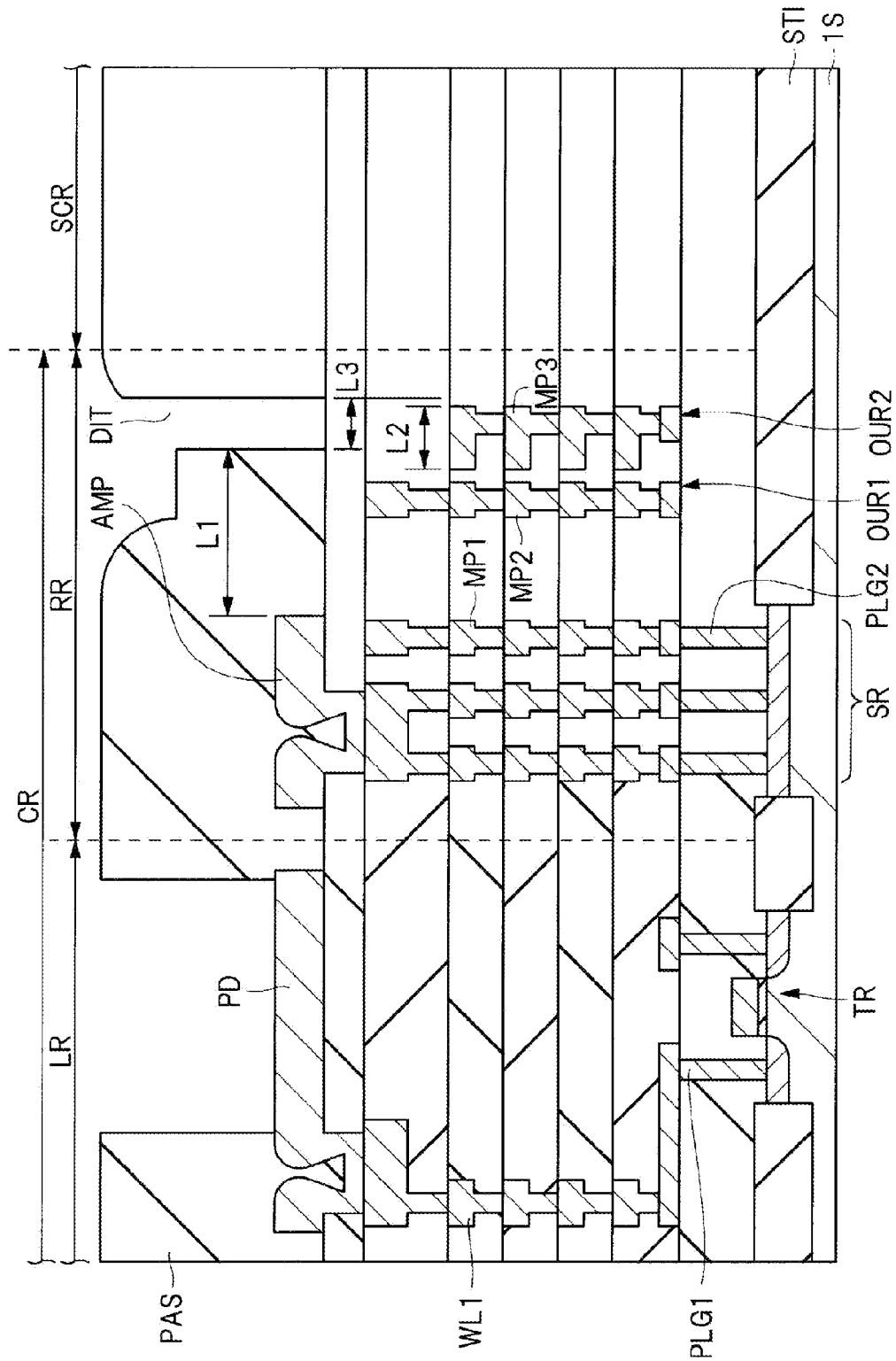
FIG. 26 is a cross-sectional view showing a configuration of a semiconductor wafer in a second embodiment.

FIG. 26 is a cross-sectional view showing a configuration of a semiconductor wafer in the present second embodiment. In FIG. 26, since the semiconductor wafer in the present second embodiment has a substantially similar configuration to the semiconductor wafer in the first embodiment shown in FIG. 9, differences will be mainly explained.

A feature of the present second embodiment lies in the point that the width L2 of the outer ring OUR2 is larger than the width L3 of the groove portion DIT as shown in FIG. 26. At this time, the outer ring OUR2 is configured to include the first-layer to fifth-layer metal patterns MP3, and the width of the metal pattern MP3 corresponds to the width L2 of the outer ring OUR2. Additionally, as shown in FIG. 26, in the present second embodiment, on a premise that the width L2 of the outer ring OUR2 is larger than the width L3 of the groove portion DIT, the outer peripheral line of the outer ring OUR2 is arranged more inside than the outer peripheral side surface of the groove portion DIT.

Thereby, for example, in the dicing step, a possibility can be made higher that a crack that progresses to the seal ring SR side with the bottom of the groove portion DIT being as the starting point bumps against the outer ring OUR2 with a large width L2, and then stops. Namely, although the crack that progresses to the seal ring SR side with the bottom of the groove portion DIT being as the starting point has a high probability to mainly stop at the outer ring OUR1 arranged inside the groove portion DIT, furthermore, in the present second embodiment, the outer ring OUR2 that overlaps with the groove portion DIT protrudes inside the groove portion DIT in plan view. For this reason, the crack that progresses to the seal ring SR side with the bottom of the groove portion DIT being as the starting point can be stopped also by the outer ring OUR2. That is, with the configuration of the present second embodiment, since the probability is high to stop the crack that progresses to the seal ring SR side with the bottom of the groove portion DIT being as the starting point not only by the outer ring OUR1 but by the outer ring OUR2, destruction of the seal ring SR due to the crack can be effectively prevented.

Furthermore, in the present second embodiment, since the widths of the first-layer to fifth-layer metal patterns MP3 constituting the outer ring OUR2 are set to be large, for example, it also becomes possible to connect the metal patterns MP3 arranged in layers adjacent to each other in the lamination direction with the plurality of plugs. This means that improved is a strength of a laminated structure including the plugs that connect the first-layer to fifth-layer metal patterns MP3 and the metal patterns MP3 adjacent to each other in the lamination direction. In this case, for example, also with respect to a crack that occurs with the contact region of the dicing blade and the semiconductor wafer being as the starting point since a force (stress) applied to the semiconductor wafer in the dicing step is too strong, progress of the crack can be stopped by the outer ring OUR2 whose strength is enhanced. That is, according to the present second embodiment, since a reaching probability of the crack to the seal ring SR can be significantly reduced by a point where a structural strength of the outer ring OUR2 has been improved, and a synergetic effect of a double protection barrier structure of the outer ring OUR2 and the outer ring OUR1, destruction of the seal ring SR due to the crack can be effectively prevented.

(Third Embodiment) In the present third embodiment, there will be explained an example where the outer ring OUR1 is configured to include not only the plugs that connect the first-layer to sixth-layer metal patterns MP2 and the metal patterns MP2 adjacent to each other in the lamination direction, but metal patterns in an upper layer of the sixth-layer metal patterns MP2.

Figure 27:
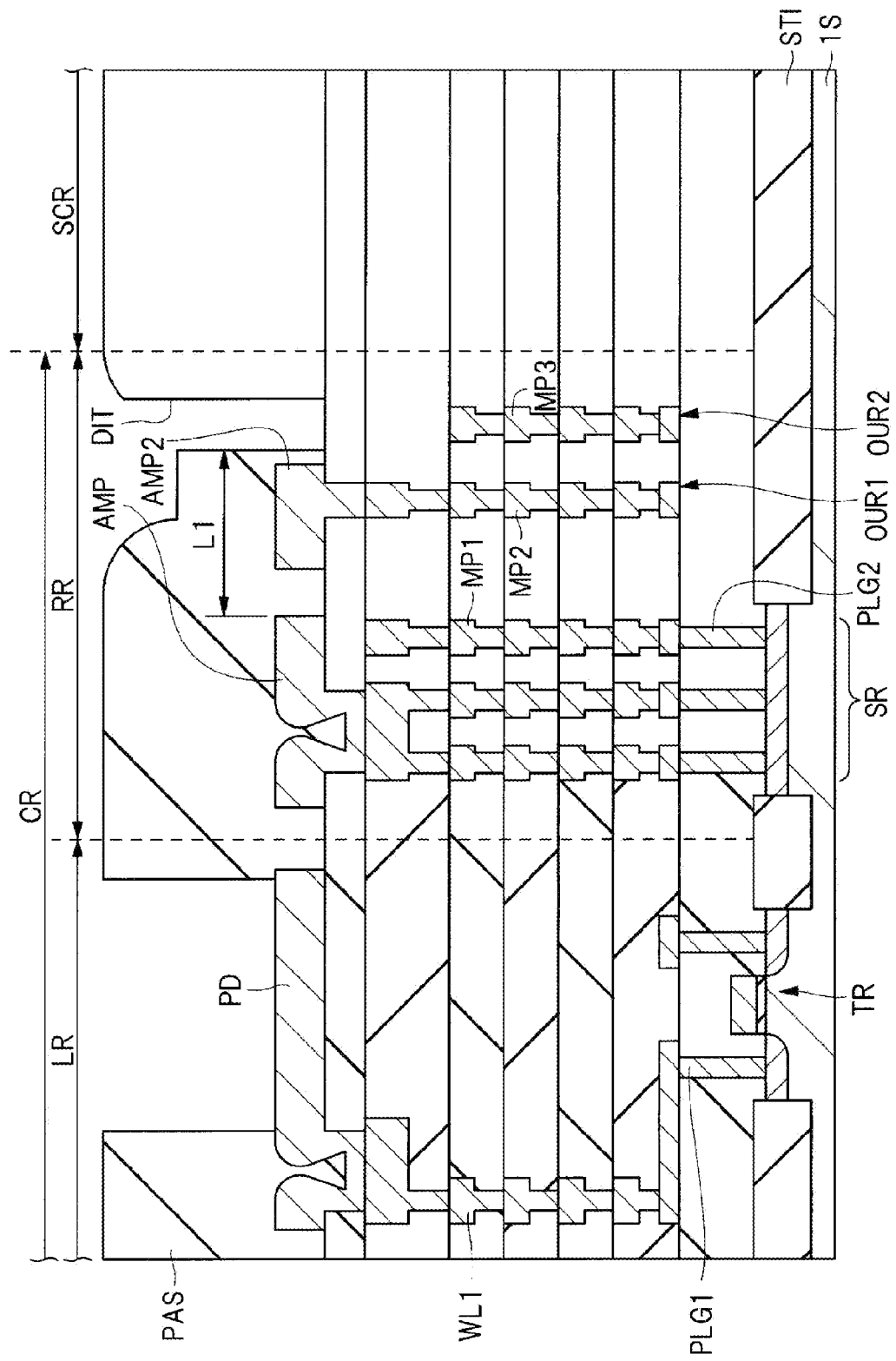
FIG. 27 is a cross-sectional view showing a configuration of a semiconductor wafer in a third embodiment.

FIG. 27 is a cross-sectional view showing a configuration of a semiconductor wafer in the present third embodiment. In FIG. 27, since the semiconductor wafer in the present third embodiment has a substantially similar configuration to the semiconductor wafer in the first embodiment shown in FIG. 9, differences will be mainly explained.

In FIG. 27, a feature of the present third embodiment lies in the point that the outer ring OUR1 is configured to include also a metal pattern AMP2. That is, the outer ring OUR1 is configured to include the metal pattern AMP2 formed in a same layer as the pad PD formed in the circuit region LR and the metal pattern AMP constituting the top layer of the seal ring SR.

In this case, the outer ring OUR1 is configured to directly come into contact with the surface protection film PAS by the metal pattern AMP2. Additionally, in the present third embodiment, since the top surface of the outer ring OUR1 serves as a top surface of the top-layer metal pattern AMP2, the top surface of the outer ring OUR1 is higher than the bottom surface of the groove portion DIT. As a result of this, according to the present third embodiment, a probability can be increased that the crack that progresses to the seal ring SR side with the bottom of the groove portion DIT being as the starting point is blocked by the outer ring OUR1 to stop.

(Fourth Embodiment) In the present fourth embodiment, there will be explained an example where the groove portion DIT penetrates the surface protection film PAS to be formed halfway through the interlayer insulating film.

Figure 28:
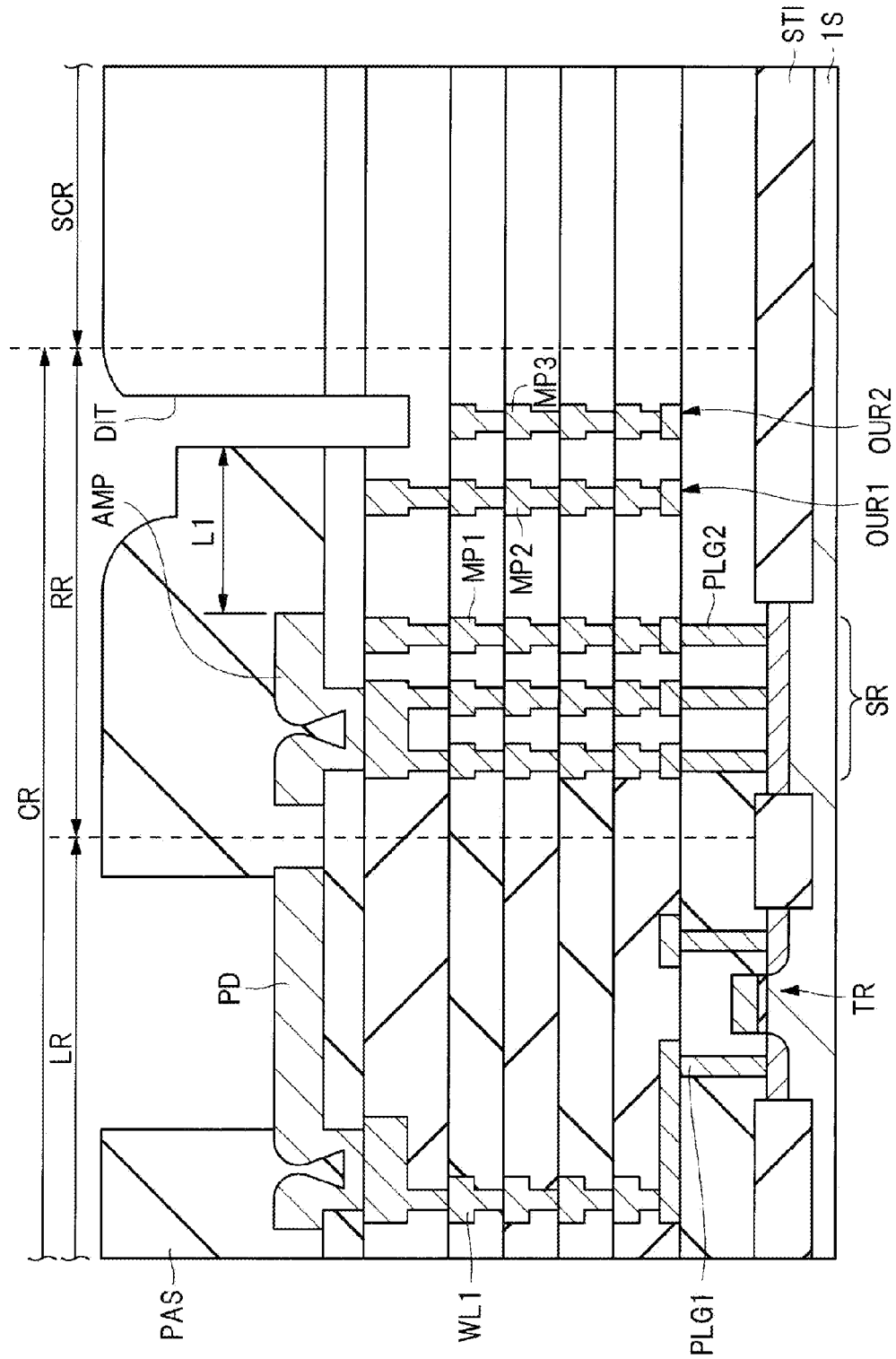
FIG. 28 is a cross-sectional view showing a configuration of a semiconductor wafer in a fourth embodiment.

FIG. 28 is a cross-sectional view showing a configuration of a semiconductor wafer in the present fourth embodiment. In FIG. 28, since the semiconductor wafer in the present fourth embodiment has a substantially similar configuration to the semiconductor wafer in the first embodiment shown in FIG. 9, differences will be mainly explained.

In FIG. 28, a feature of the present fourth embodiment lies in the point that the groove portion DIT penetrates the surface protection film PAS to be formed halfway through the interlayer insulating film. As a result of this, in the present fourth embodiment, the top surface of the outer ring OUR1 is higher than the bottom surface of the groove portion DIT. Thereby, according to the present fourth embodiment, the probability can be increased that the crack that progresses to the seal ring SR side with the bottom of the groove portion DIT being as the starting point is blocked by the outer ring OUR1 to stop.

Here, the configuration of the present fourth embodiment and the configuration of the third embodiment are common in a point where the top surface of the outer ring OUR1 is made higher than the bottom surface of the groove portion DIT, but when the viewpoint of suppressing the increase of the chip region CR is taken into consideration, the configuration of the present fourth embodiment has superiority to the configuration of the third embodiment.

Namely, in the above-described third embodiment, the metal pattern AMP2 is formed in the top layer of the outer ring OUR1, and thereby the top surface of the outer ring OUR1 is made higher than the bottom surface of the groove portion DIT. The metal pattern AMP2 is the pattern with a large size formed of an aluminum film in a same layer as the pad PD, and when the outer ring OUR1 is configured to include the metal pattern AMP2 with the large size, inevitably, the size of the ring region RR becomes large.

In contrast with this, in the present fourth embodiment, while the top layer of the outer ring OUR1 includes the fine sixth-layer metal pattern MP2, the groove portion DIT is deeply formed halfway through the interlayer insulating film, and thereby the top surface of the outer ring OUR1 is made higher than the bottom surface of the groove portion DIT. As described above, in the present fourth embodiment, as compared with the above-described third embodiment, the top surface of the outer ring OUR1 can be made higher than the bottom surface of the groove portion DIT, while the width of the outer ring OUR1 is reduced. As a result of this, according to the present fourth embodiment, while increase of the size of the chip region CR including the ring region RR is suppressed, the probability can be increased that the crack that progresses to the seal ring SR side with the bottom of the groove portion DIT being as the starting point is stopped by the outer ring OUR1.

(Fifth Embodiment) In the present fifth embodiment, there will be explained an example where a depth of the groove portion DIT is made much deeper than in the fourth embodiment.

Figure 29:
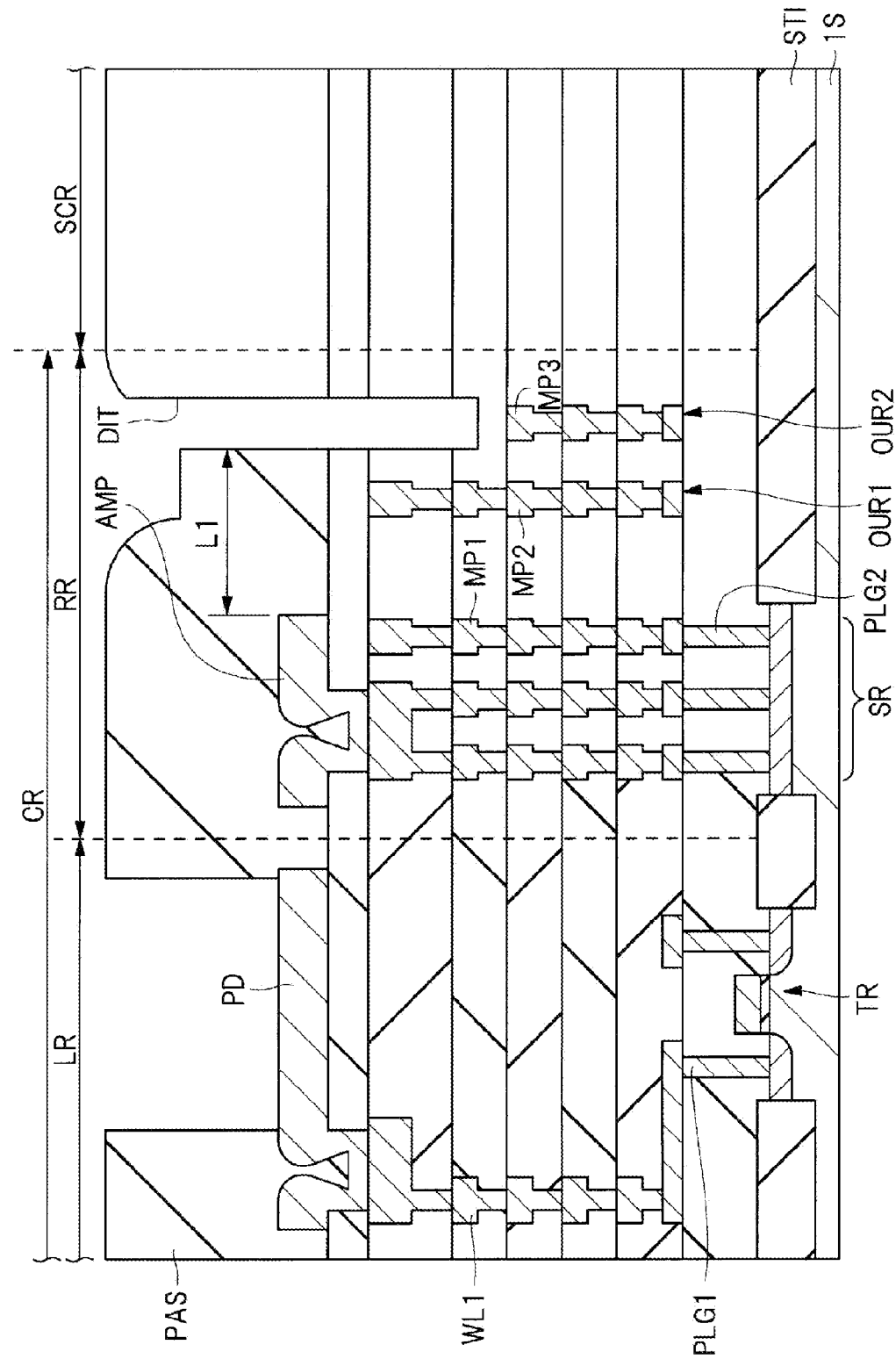
FIG. 29 is a cross-sectional view showing a configuration of a semiconductor wafer in a fifth embodiment.

FIG. 29 is a cross-sectional view showing a configuration of a semiconductor wafer in the present fifth embodiment. In FIG. 29, since the semiconductor wafer in the present fifth embodiment has a substantially similar configuration to the semiconductor wafer in the first embodiment shown in FIG. 9, differences will be mainly explained.

In FIG. 29, a feature of the present fifth embodiment lies in the point that the depth of the groove portion DIT is made deeper than in the fourth embodiment. Specifically, in the above-described fourth embodiment shown in FIG. 28, the bottom of the groove portion DIT is located above the outer ring OUR2 including the first-layer to fifth-layer metal patterns MP3. In contrast with this, in the present fifth embodiment shown in FIG. 29, the bottom of the groove portion DIT is located above the outer ring OUR2 including the first-layer to fourth-layer metal patterns MP3. Accordingly, the bottom of the groove portion DIT in the present fifth embodiment is formed deeper by approximately one layer as compared with the bottom of the groove portion DIT in the fourth embodiment.

Also in the present fifth embodiment configured as described above, the top surface of the outer ring OUR1 is higher than the bottom surface of the groove portion DIT similarly to the above-described fourth embodiment. Thereby, also according to the present fifth embodiment, the probability can be increased that the crack that progresses to the seal ring SR side with the bottom of the groove portion DIT being as the starting point is blocked by the outer ring OUR1 to stop.

Here, the present fifth embodiment has the configuration in which since the depth of the groove portion DIT is deeper as compared with the fourth embodiment, a crack easily occurs from the bottom of the groove portion DIT. Namely, the crack occurs more easily from the bottom of the groove portion DIT of the present fifth embodiment than in the bottom of the groove portion DIT of the fourth embodiment. On this point, although the groove portion DIT is provided to intentionally make the crack occur from the bottom of the groove portion DIT, nonetheless, there is no need to increase an occurrence probability of the crack. That is, as long as the crack does not occur, there is no possibility that the seal ring SR is destroyed by the crack, and thus there is no need to purposely increase the occurrence probability of the crack. Namely, the depth of the groove portion DIT may just be specified at a level where the groove portion DIT is more easily broken than the other region, and there is no need to purposely increase the occurrence probability of the crack by unnecessarily making deeper the depth of the groove portion DIT. When the above is taken into consideration, the fourth embodiment can be said to have superiority to present fifth embodiment from a viewpoint of reducing the occurrence probability of the crack.

However, in the present fifth embodiment, although the crack with the bottom of the groove portion DIT being as the starting point easily occurs, a difference in height of the top surface of the outer ring OUR1 and the bottom surface of the groove portion DIT is large, and thus the probability can be increased that the crack that progresses to the seal ring SR side with the bottom of the groove portion DIT being as the starting point is blocked by the outer ring OUR1 to stop.

(Sixth Embodiment) In the present sixth embodiment, there will be explained an example where the outer rings OUR1 and OUR2 are connected to the field insulating film STI.

Figure 30:
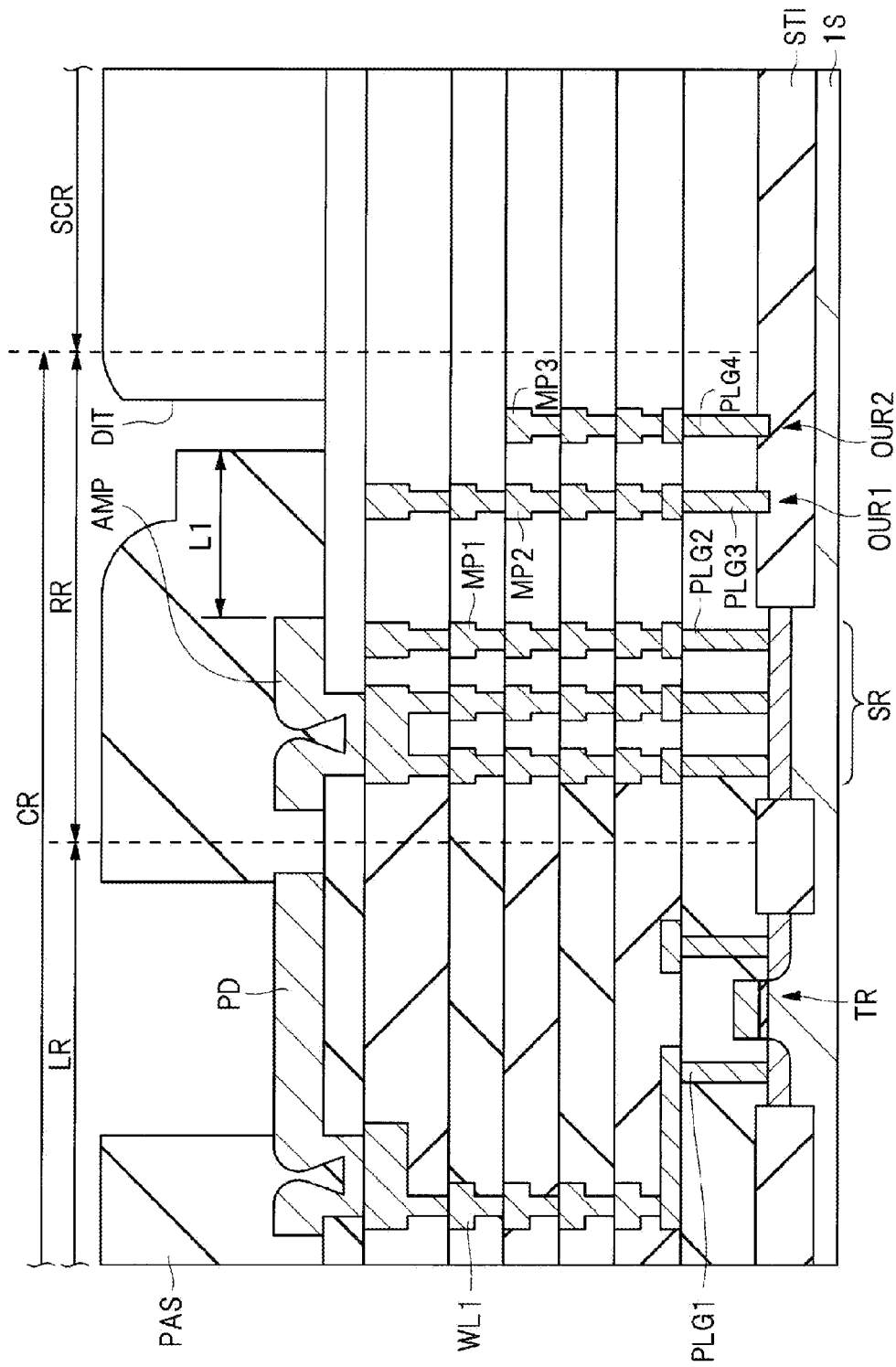
FIG. 30 is a cross-sectional view showing a configuration of a semiconductor wafer in a sixth embodiment.

FIG. 30 is a cross-sectional view showing a configuration of a semiconductor wafer in the present sixth embodiment. In FIG. 30, since the semiconductor wafer in the present sixth embodiment has a substantially similar configuration to the semiconductor wafer in the first embodiment shown in FIG. 9, differences will be mainly explained.

In FIG. 30, a feature of the present sixth embodiment lies in the point that the outer ring OUR1 is connected to the field insulating film STI by a plug PLG3, and that the outer ring OUR2 is connected to the field insulating film STI by a plug PLG4.

In this case, entering of moisture and foreign substances to the circuit region LR can be effectively prevented by the outer rings OUR1 and OUR2. That is, although the outer rings OUR1 and OUR2 are formed mainly for the purpose of stopping the progress of the crack, in the present sixth embodiment, furthermore, the outer rings OUR1 and OUR2 increase an effect of preventing entering of the moisture or the foreign substances. Particularly, in the present sixth embodiment, entering of the moisture to the circuit region LR can be effectively prevented by a synergetic effect of a point where the seal ring SR is provided, a point where a step is formed between the surface of the semiconductor substrate 1S to which the seal ring SR has been connected and the surface of the field insulating film STI, and a point where the outer rings OUR1 and OUR2 are connected to the field insulating film STI.

However, as explained in the above-described first embodiment, when the outer rings OUR1 and OUR2, and the field insulating film STI are connected by the plugs PLG3 and PLG4, sizes of the plugs PLG3 and PLG4 differ depending on products, and uniformity among the products is impaired. For this reason, the configuration of the present sixth embodiment is the particularly useful configuration when entering of the moisture and the foreign substances to the circuit region LR is reliably prevented to give priority to the improvement in reliability of the semiconductor device even though the uniformity among the products is impaired to some extent.

It is to be noted that for example, there is a technology, for example, called SAC (Self Align Contact), in a manufacturing technology of a semiconductor device. In the technology called SAC, after the field effect transistor TR is formed, a silicon nitride film is formed so as to cover the field effect transistor TR, and after that, a silicon oxide film that serves as the interlayer insulating film is formed over the silicon nitride film. Accordingly, when the technology called SAC is used, in FIG. 30, a laminated film of a silicon nitride film and a silicon oxide film is formed also over the field insulating film STI in the ring region RR. Accordingly, first, when the silicon oxide film, which is the interlayer insulating film, is etched to form a contact hole, the silicon nitride film that exists at a lower layer serves as an etching stopper. Subsequently, when the silicon nitride film is etched, the field insulating film STI that exists at the lower layer of the silicon nitride film is formed of the silicon oxide film, and thus the field insulating film STI serves as an etching stopper. From this, when the technology called SAC is used, the contact hole that penetrates the interlayer insulating film and the silicon nitride film becomes hard to etch even to the field insulating film STI. This means that it is possible to enhance uniformity of the sizes of the plug PLG3 that connects the outer ring OUR1 and the field insulating film STI, and of the plug PLG4 that connects the outer ring OUR2 and the field insulating film STI. That is, when the technology called SAC is used, without the uniformity among the products being impaired, the outer ring OUR1 and the field insulating film STI can be connected to each other by the plug PLG3, and the outer ring OUR2 and the field insulating film STI can be connected to each other by the plug PLG4. As a result of this, an effect of preventing entering of the moisture and the foreign substances to the circuit region LR can be improved while uniformity among the products is enhanced.

(Seventh Embodiment) In the present seventh embodiment, there will be explained an example where a dummy pattern or a corner reinforcing pattern is provided between the seal ring SR and the outer ring OUR1 in plan view.

Figure 31:
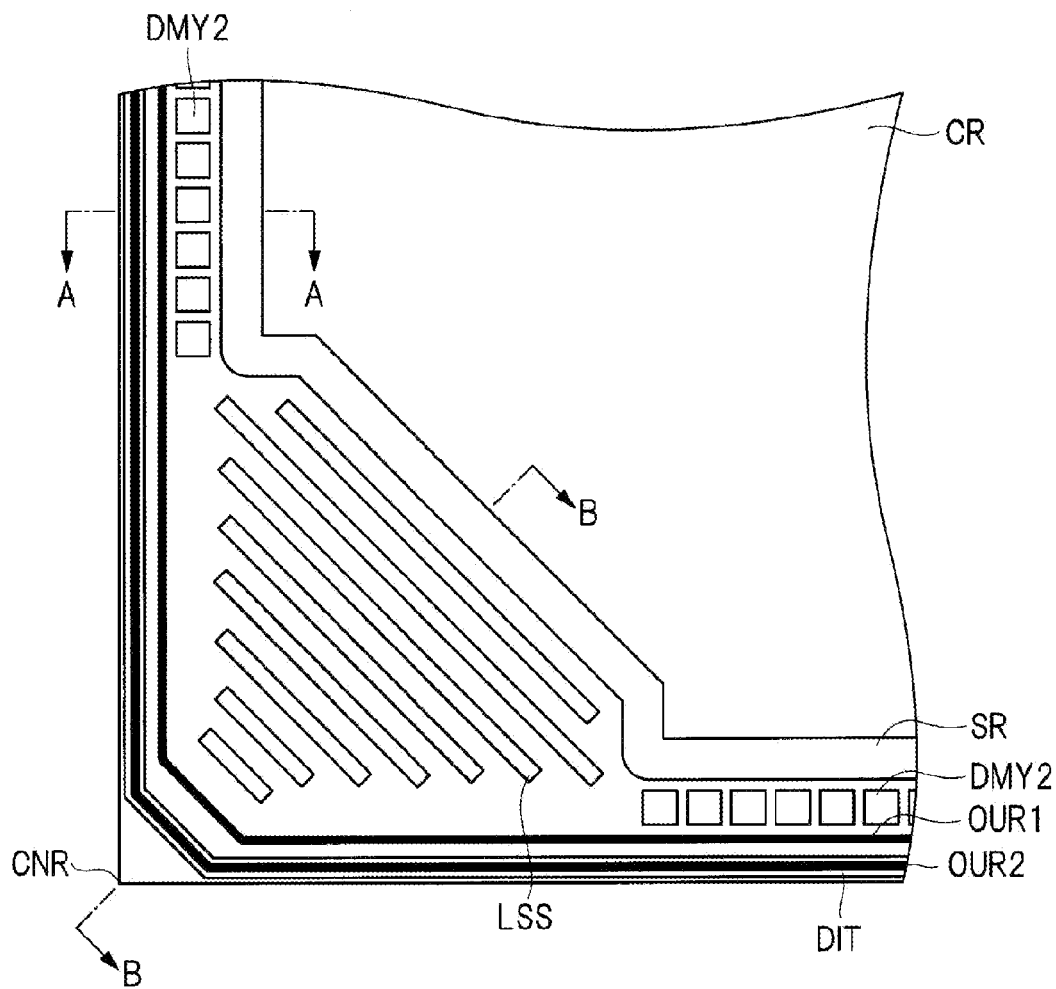
FIG. 31 is a view showing a planar layout configuration near a corner of a chip region in a semiconductor wafer of a seventh embodiment.

FIG. 31 is a view showing a planar layout configuration near the corner CNR of the chip region CR. As shown in FIG. 31, the seal ring SR is formed in the chip region CR having the corner CNR. This seal ring SR is arranged so as to extend along an outer peripheral line of the chip region CR in a region other than the corner CNR, and is arranged so as to be spaced apart from the corner CNR at the corner CNR. Namely, the seal ring SR is, as shown in FIG. 31, arranged so that the distance between the corner CNR and the seal ring SR is larger than the distance between the outer peripheral line of the chip region CR in the region other than the corner CNR and the seal ring SR.

Subsequently, in the present seventh embodiment, the groove portion (slit) DIT is arranged along the outer peripheral line of the chip region CR. Specifically, as shown in FIG. 31, the groove portion DIT extends along the outer peripheral line of the chip region CR including the corner CNR. At this time, the groove portion DIT is arranged outside the seal ring SR in plan view. That is, the groove portion DIT is arranged so as to be sandwiched between the outer peripheral line of the chip region CR and the seal ring SR in plan view.

Additionally, in the present seventh embodiment, in plan view, the outer ring OUR1 is provided between the groove portion DIT and the seal ring SR, and the outer ring OUR1 also extends along the outer peripheral line of the chip region CR. Furthermore, in the present seventh embodiment, the outer ring OUR2 is provided outside the outer ring OUR1, and the outer ring OUR2 also extends along the outer peripheral line of the chip region CR. Particularly, the outer ring OUR2 is arranged so as to overlap with the groove portion DIT in plan view.

Here, a feature of the present seventh embodiment lies in the point that as shown in FIG. 31, a plurality of dummy patterns DMY2 is arranged in a second space between the seal ring SR and the outer ring OUR1 when planarly viewed in a region other than the corner CNR. Furthermore, a feature of the present seventh embodiment lies in the point that near the corner CNR, a plurality of corner reinforcing patterns LSS is arranged in a first space between the seal ring SR and the outer ring OUR1 when planarly viewed. At this time, an area of the first space is larger than that of the second space as shown in FIG. 31. Additionally, the dummy patterns DMY2 arranged in the second space each have a substantially square shape in plan view, and are arranged side by side along the outer peripheral line of the chip region CR. Meanwhile, the corner reinforcing patterns LSS arranged in the first space constitutes a line segment structure having a line segment shape. The plurality of line segment structures (eight in FIG. 31) arranged in the first space is formed side by side in an extending direction of a bisector, while crossing (bisecting) to the bisector of the corner CNR.

According to the present seventh embodiment configured as described above, the following effects can be obtained. Namely, a crack occurs more easily in the corner CNR than in regions of sides other than the corner CNR, and there is a high risk that a crack that progresses in a direction from the corner CNR to the inside of the chip region CR particularly exerts a harmful influence on the reliability of the semiconductor device. For this reason, in the present seventh embodiment, in the region (first space) that goes to the inside of the chip region CR from the corner CNR, formed is the corner reinforcing pattern LSS whose area is larger than the dummy pattern DMY2, and that includes the line segment structures arranged side by side so as to cross the bisector of the corner CNR when planarly viewed. Particularly, in the present seventh embodiment, the corner reinforcing pattern LSS including the line segment structures is formed as large as possible, and thereby crack resistance in the corner CNR can be improved. Meanwhile, in order to improve the crack resistance in the region other than the corner CNR although not so much as the corner CNR, the plurality of dummy patterns DMY2 is arranged in the second space between the seal ring SR and the outer ring OUR1. As a result of this, according to the present seventh embodiment, entering of the crack in an inner direction can be suppressed all over the outer peripheral line of the chip region CR.

Figure 32:
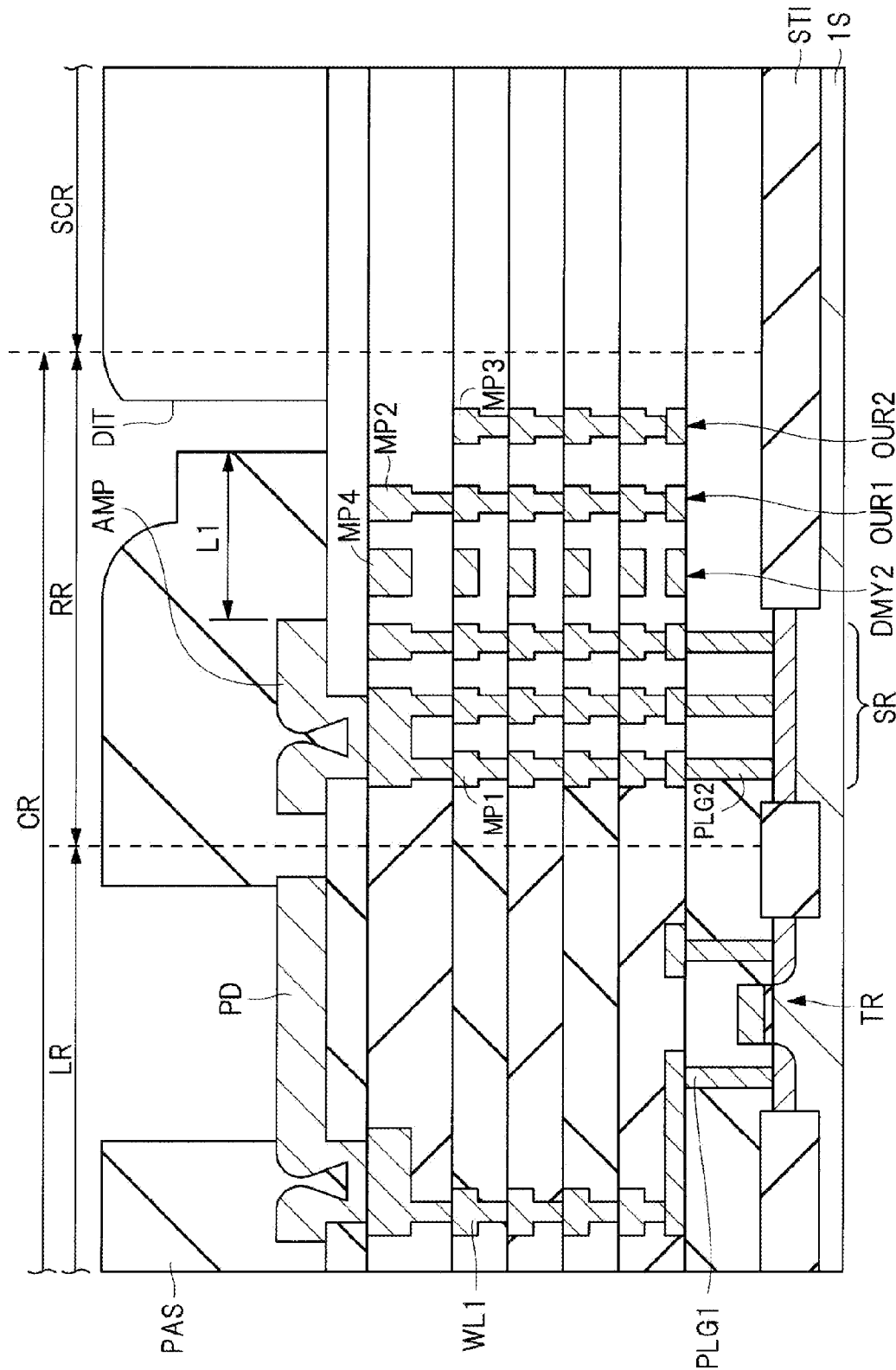
FIG. 32 is a cross-sectional view taken along a line A-A of FIG. 31.

FIG. 32 is a cross-sectional view taken along a line A-A of FIG. 31. In FIG. 32, it can be seen that the dummy pattern DMY2 is formed between the seal ring SR and the outer ring OUR1. The dummy pattern DMY2 includes a first-layer metal pattern MP4 to a sixth-layer metal pattern MP4. At this time, although the first-layer to sixth-layer metal patterns MP4 includes patterns with a same width, they may include patterns with different widths.

As shown in FIG. 32, for example, it is conceived that the crack that progresses to the seal ring SR side with the bottom of the groove portion DIT being as the starting point stops at the outer ring OUR1. However, in the present seventh embodiment, furthermore, since the dummy pattern DMY2 having a function to prevent the progress of the crack is formed between the seal ring SR and the outer ring OUR1, the crack can be stopped by the dummy pattern DMY2 even if the progress of the crack does not stop at the outer ring OUR1. As a result of this, according to the present seventh embodiment, destruction of the seal ring SR due to the crack can be further prevented.

Figure 33:
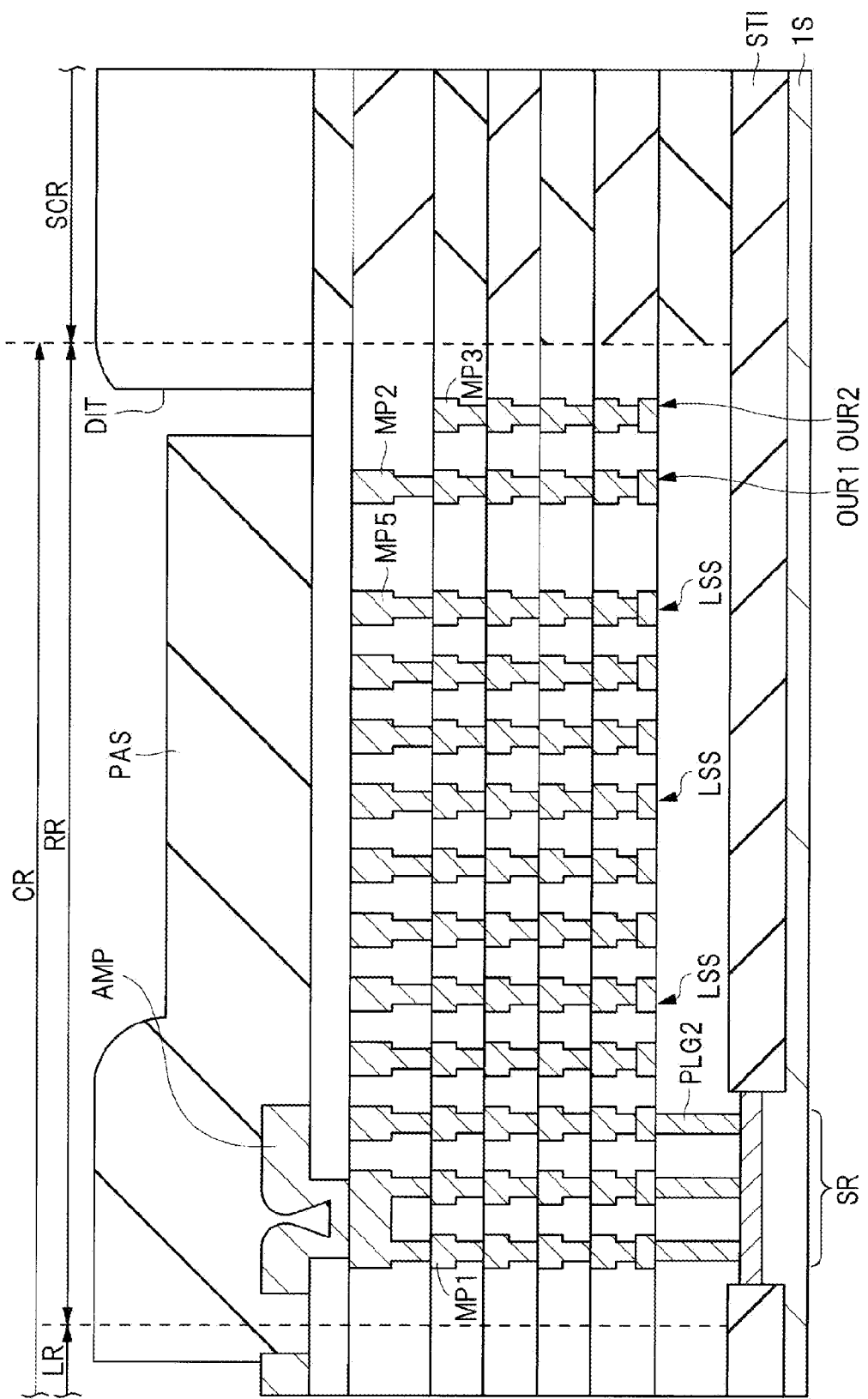
FIG. 33 is a cross-sectional view taken along a line B-B of FIG. 31.

FIG. 33 is a cross-sectional view taken along a line B-B of FIG. 31. As shown in FIG. 33, it can be seen that in a corner, eight corner reinforcing patterns LSS are arranged side by side between the seal ring SR and the outer ring OUR1. Additionally, the individual corner reinforcing pattern LSS includes a first layer to sixth-layer metal patterns MP5, and plugs that connect the metal patterns MP5 in layers adjacent to each other in the lamination direction.

In the corner configured as described above, since eight corner reinforcing patterns LSS are provided further inside, progress of a crack can be reliably stopped by these corner reinforcing patterns LSS even though the crack is the one that cannot be stopped by either the outer ring OUR2, which is the first barrier, or the outer ring OUR1, which is the second barrier. As a result of this, destruction of the seal ring SR particularly due to a large crack that easily occurs in the corner CNR can also be reliably prevented. Thereby, in the present seventh embodiment, entering of moisture to the circuit region LR due to destruction of the seal ring SR by the crack can be reliably prevented, and thereby reliability of the semiconductor wafer and the semiconductor chip (semiconductor device) obtained by dicing the semiconductor wafer can be improved.

(Eighth Embodiment) In the present eighth embodiment, there will be explained an example where a plurality of dummy patterns DMY1 is arranged also outside the corner reinforcing patterns LSS. Since a configuration of the present eighth embodiment is substantially similar to the seventh embodiment, differences will be mainly explained.

Figure 34:
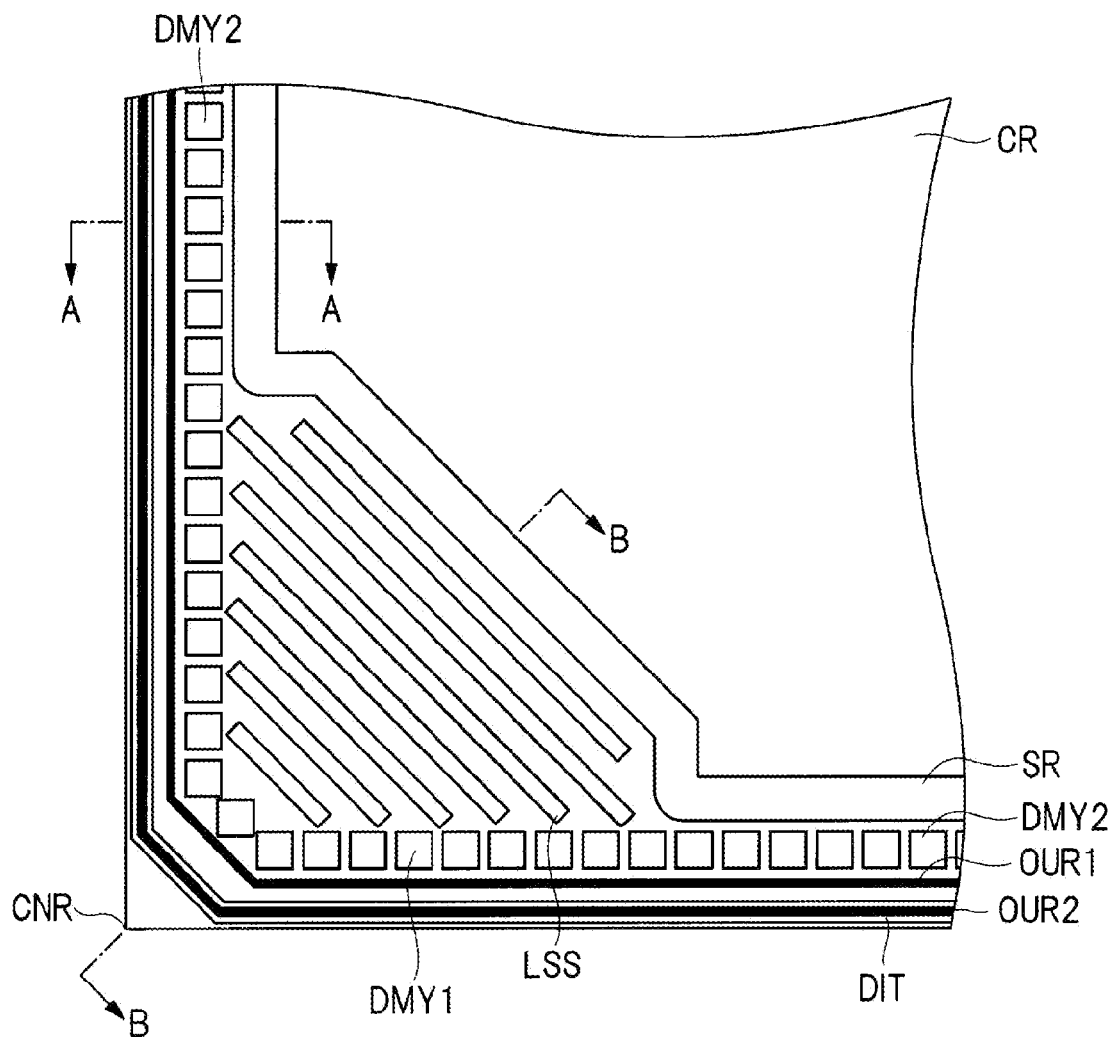
FIG. 34 is a view showing a planar layout configuration near a corner of a chip region in a semiconductor wafer of an eighth embodiment.

FIG. 34 is a view showing a planar layout configuration near the corner CNR of the chip region CR. In FIG. 34, a feature of the present eighth embodiment lies in the point that in the corner CNR, the plurality of corner reinforcing patterns LSS is arranged in the first space between the seal ring SR and the outer ring OUR1, and the plurality of dummy patterns DMY1 is provided also between the corner reinforcing pattern LSS and the outer ring OUR1.

According to the present eighth embodiment configured as described above, the following effects can be obtained. Namely, in the above-described seventh embodiment, although the whole corner CNR can be reinforced, the corner reinforcing pattern LSS planarly has a larger area than the dummy pattern DMY2. For this reason, there is also conceived a case where it is difficult to form the corner reinforcing pattern LSS even near the sides of the chip region CR also in the first space of the corner CNR. Consequently, in order to protect a vicinity of the sides of the chip region CR also in the first space of the corner CNR, and in order to stop a crack at a position away from the seal ring SR as far as possible also in the corner CNR, the plurality of dummy patterns DMY2 is arranged outside the corner reinforcing pattern LSS in the corner CNR. Thereby, according to the present eighth embodiment, the corner reinforcing pattern LSS and the dummy pattern DMY1 are combined with each other in the corner CNR, and thereby the whole corner CNR can be reinforced and the vicinity of the sides near the corner CNR can also be reinforced.

Figure 35:
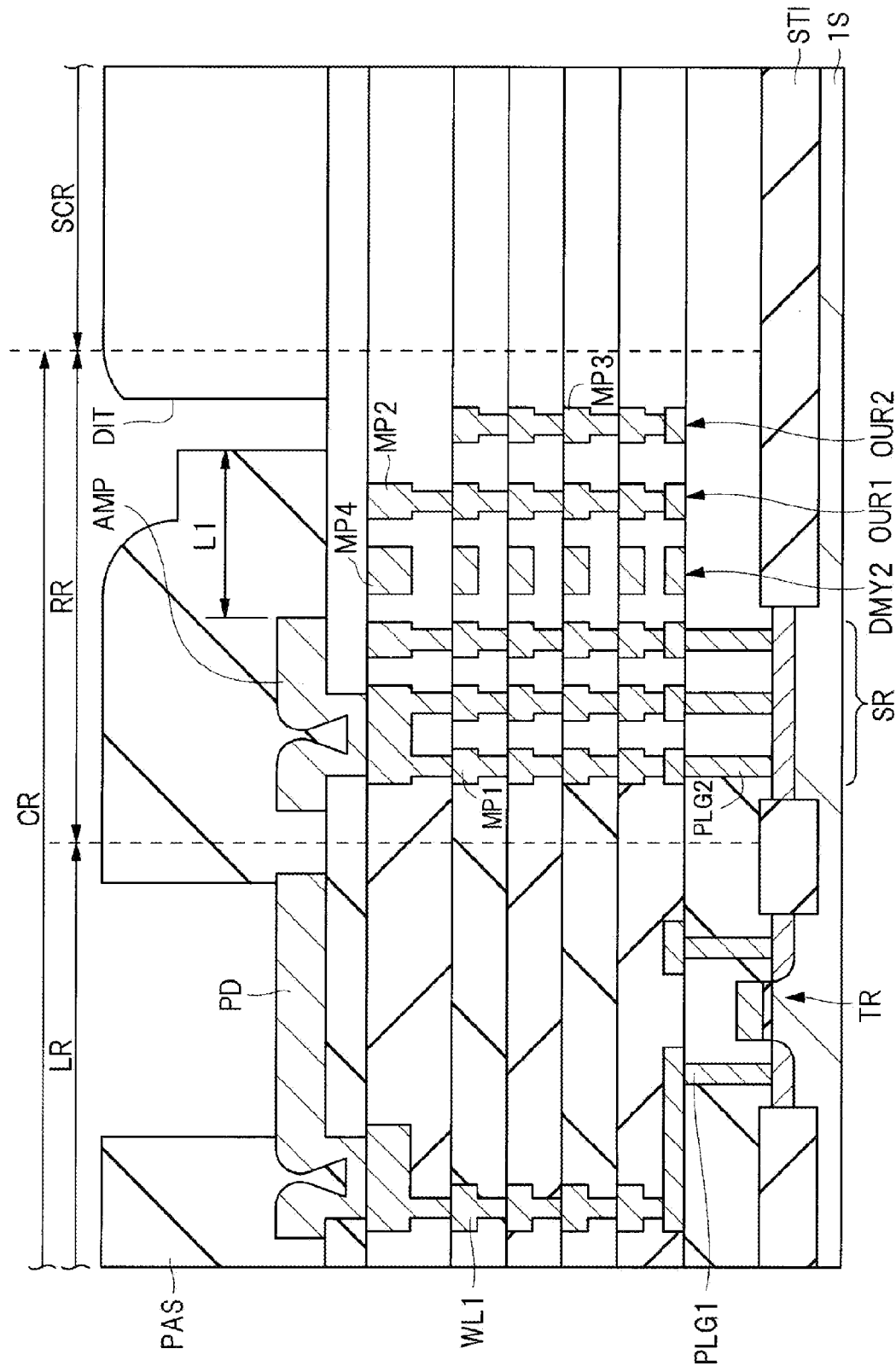
FIG. 35 is a cross-sectional view taken along a line A-A of FIG. 34.

FIG. 35 is a cross-sectional view taken along a line A-A of FIG. 34. In FIG. 35, it can be seen that the dummy pattern DMY2 is formed between the seal ring SR and the outer ring OUR1. The dummy pattern DMY2 includes the first-layer metal pattern MP4 to the sixth-layer metal pattern MP4. At this time, although the first-layer to sixth-layer metal patterns MP4 include patterns with a same width, they may include patterns with different widths.

Figure 36:
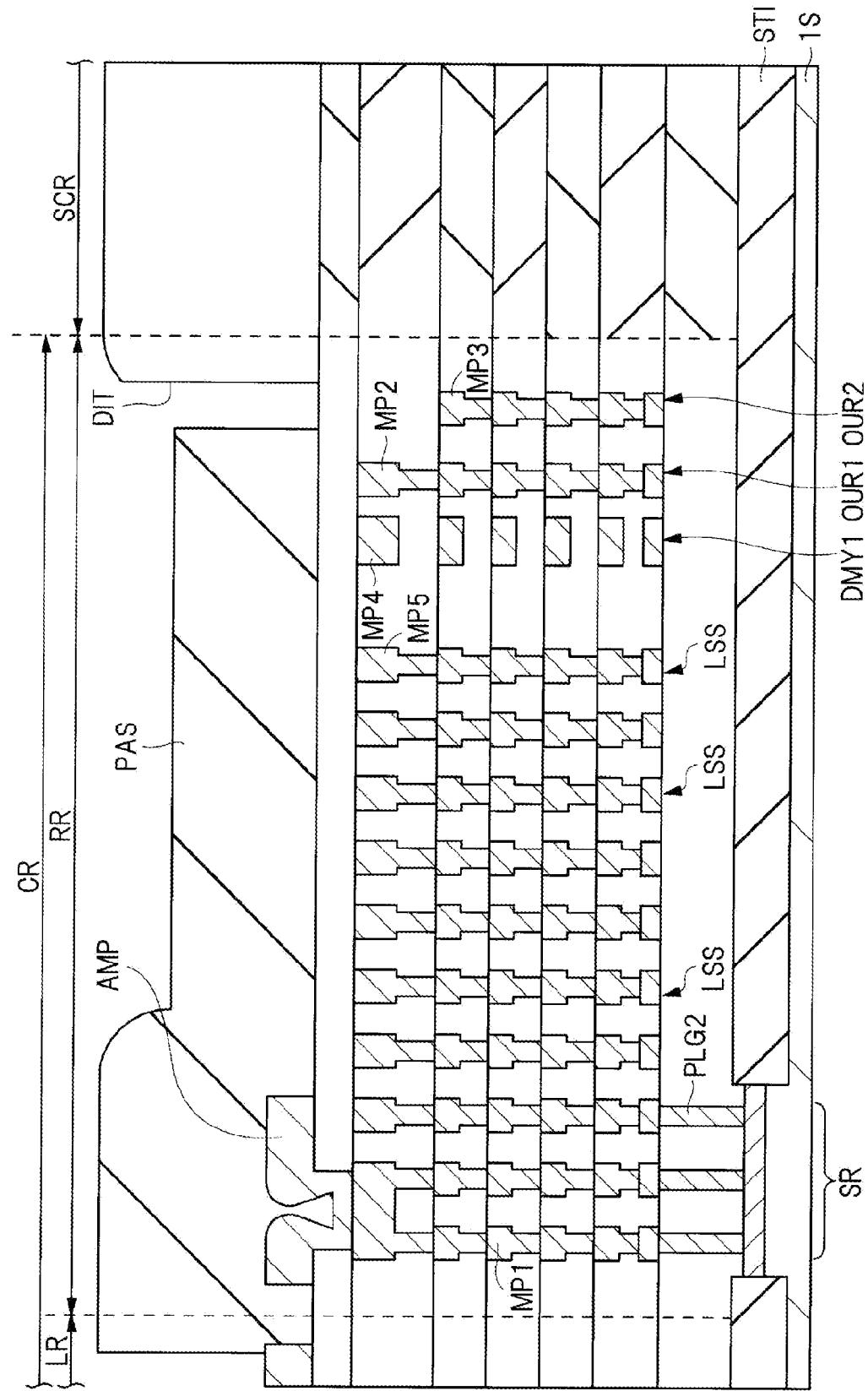
FIG. 36 is a cross-sectional view taken along a line B-B of FIG. 34.

In addition, FIG. 36 is a cross-sectional view taken along a line B-B of FIG. 34. As shown in FIG. 36, it can be seen that in the corner, seven corner reinforcing patterns LSS are arranged side by side between the seal ring SR and the outer ring OUR1. Additionally, the individual corner reinforcing pattern LSS includes the first layer to sixth-layer metal patterns MP5, and plugs that connect the metal patterns MP5 in the layers adjacent to each other in the lamination direction. Additionally, it can be seen that the dummy pattern DMY1 is formed between the corner reinforcing pattern LSS arranged outermost and the outer ring OUR1. The dummy pattern DMY1 includes the first-layer metal pattern MP4 to the sixth-layer metal pattern MP4. At this time, although the first-layer to sixth-layer metal patterns MP4 include patterns with a same width, they may include patterns with different widths.

In the present eighth embodiment, by a synergetic effect by providing the outer rings OUR1 and OUR2, and by providing the corner reinforcing pattern LSS, and the dummy patterns DMY1 and DMY2, entering of moisture to the circuit region LR due to destruction of the seal ring SR by the crack can be reliably prevented. As a result of this, according to the present eighth embodiment, reliability of the semiconductor wafer and the semiconductor chip (semiconductor device) obtained by dicing the semiconductor wafer can be improved.

(Ninth Embodiment) In the present ninth embodiment, there will be explained an example where while the outer ring OUR1 is provided, the outer ring OUR2 is not provided.

Figure 37:
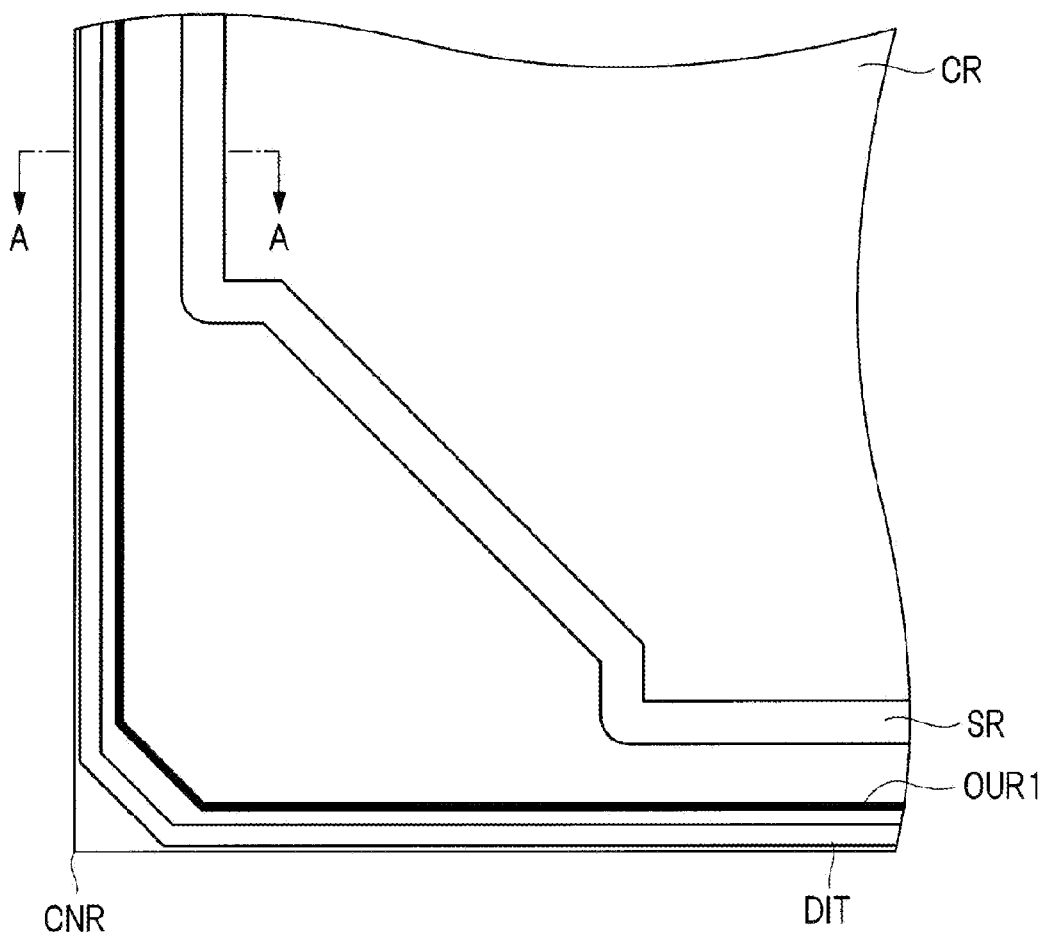
FIG. 37 is a view showing a planar layout configuration near a corner of a chip region in a semiconductor wafer of a ninth embodiment.

FIG. 37 is a view showing a planar layout configuration near the corner CNR of the chip region CR. As shown in FIG. 37, the seal ring SR is formed in the chip region CR having the corner CNR. The seal ring SR is arranged so as to extend along the outer peripheral line of the chip region CR in a region other than the corner CNR, and is arranged so as to be spaced apart from the corner CNR at the corner CNR. Namely, the seal ring SR is, as shown in FIG. 37, arranged so that the distance between the corner CNR and the seal ring SR is larger than the distance between the outer peripheral line of the chip region CR in the region other than the corner CNR and the seal ring SR.

Additionally, in the present ninth embodiment, the groove portion (slit) DIT is arranged along the outer peripheral line of the chip region CR. Specifically, as shown in FIG. 37, the groove portion DIT extends along the outer peripheral line of the chip region CR including the corner CNR. At this time, the groove portion DIT is arranged outside the seal ring SR in plan view. That is, the groove portion DIT is arranged so as to be sandwiched between the outer peripheral line of the chip region CR and the seal ring SR in plan view. Furthermore, in the present ninth embodiment, in plan view, the outer ring OUR1 is provided between the groove portion DIT and the seal ring SR, and the outer ring OUR1 also extends along the outer peripheral line of the chip region CR.

Figure 38:
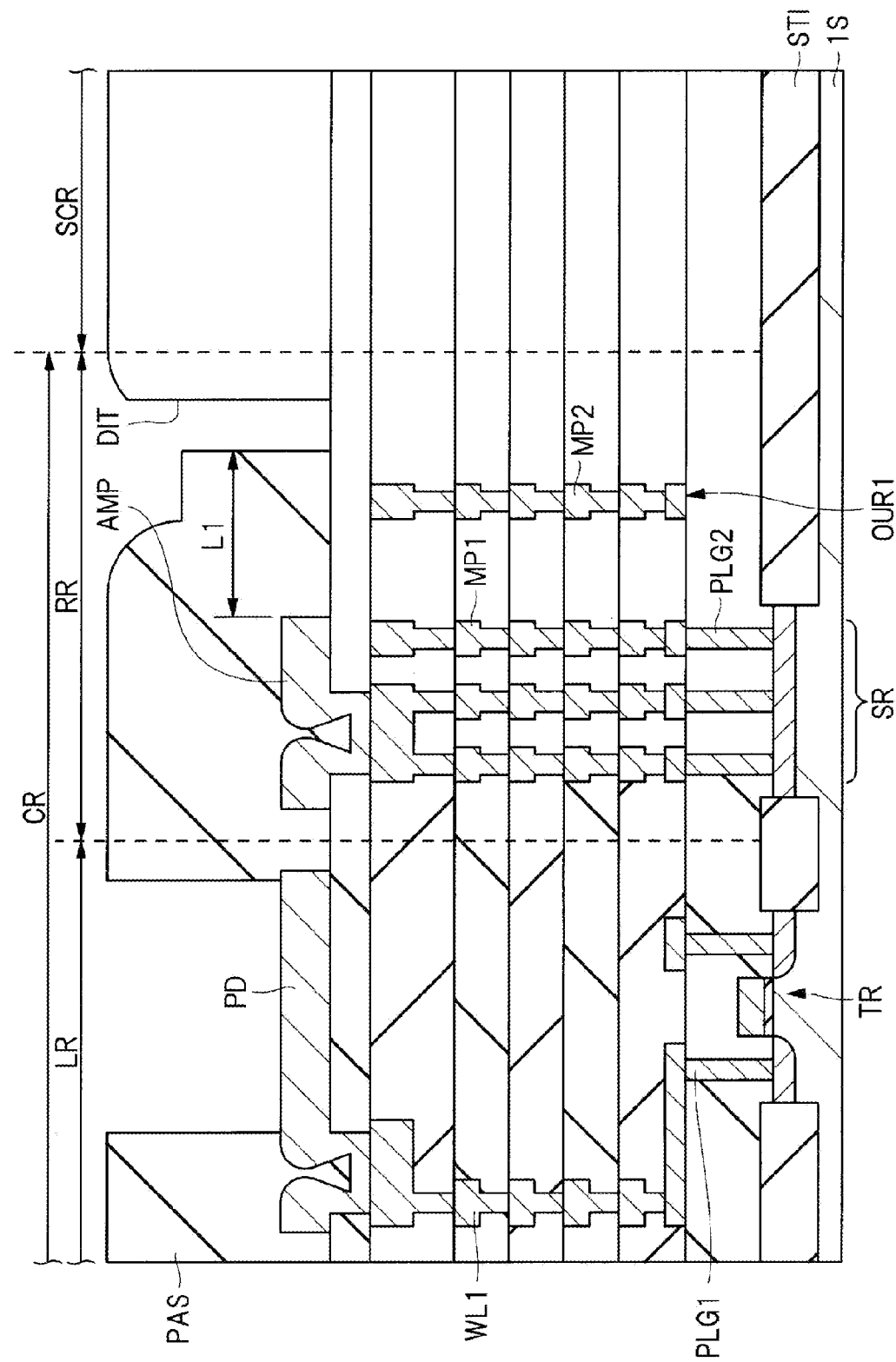
FIG. 38 is a cross-sectional view taken along a line A-A of FIG. 37.

FIG. 38 is a cross-sectional view taken along a line A-A of FIG. 37. As shown in FIG. 38, in the ninth embodiment, although the outer ring OUR1 is provided between the seal ring SR and the groove portion DIT in the ring region RR, the outer ring OUR2 that planarly overlaps with the groove portion DIT is not provided.

Also in such a configuration of the present ninth embodiment, for example, in the scribe region SCR located outside the ring region RR being cut off by a dicing blade, a crack can be prevented from reaching even the seal ring SR that exists in the ring region RR. That is, since the outer ring OUR1 is provided outside the seal ring SR even in the present ninth embodiment, the crack reaches the outer ring OUR1 before reaching the seal ring SR, and stops there. As a result of this, according to the present ninth embodiment, the crack occurring in the dicing step can be prevented from reaching even the seal ring SR that exists in the ring region RR.

Here, a main reason that the outer ring OUR1 is provided outside the seal ring SR and also inside the groove portion DIT is to prevent from reaching even the seal ring SR a crack that progresses to the seal ring SR side with the bottom of the groove portion DIT being as the starting point. Furthermore, the outer ring OUR1 also has a function to prevent the progress of the crack to the seal ring SR side even if a crack with a contact region of a dicing blade and the semiconductor wafer being as the starting point occurs. Accordingly, even when the outer ring OUR2 is not provided outside the outer ring OUR1 as in the present ninth embodiment, destruction of the seal ring SR due to the crack with the bottom of the groove portion DIT being as the starting point, and the crack with the contact region of the dicing blade and the semiconductor wafer can be prevented by the outer ring OUR1. As a result of this, also in the present ninth embodiment, reliability of the semiconductor wafer and the semiconductor chip (semiconductor device) obtained by dicing the semiconductor wafer can be improved.

(Tenth Embodiment) In the present tenth embodiment, there will be explained a configuration in a case of carrying out the dicing step by laser dicing.

Figure 39:
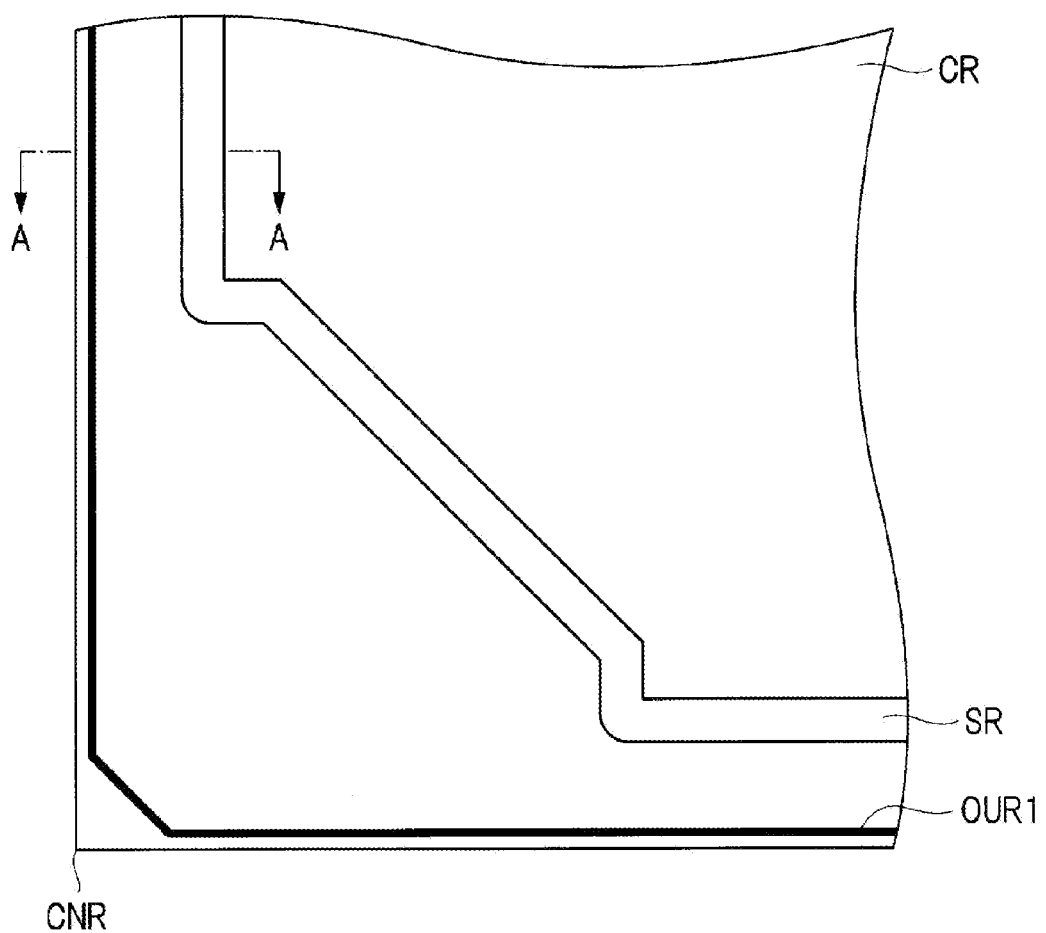
FIG. 39 is a view showing a planar layout configuration near a corner in a semiconductor wafer of a tenth embodiment.

FIG. 39 is a view showing a planar layout configuration near the corner CNR of the chip region CR. As shown in FIG. 39, the seal ring SR is formed in the chip region CR having the corner CNR. The seal ring SR is arranged so as to extend along the outer peripheral line of the chip region CR in the region other than the corner CNR, and is arranged so as to be spaced apart from the corner CNR at the corner CNR. Namely, the seal ring SR is, as shown in FIG. 39, arranged so that the distance between the corner CNR and the seal ring SR is larger than the distance between the outer peripheral line of the chip region CR in the region other than the corner CNR and the seal ring SR.

Additionally, in the present tenth embodiment, when planarly viewed, the outer ring OUR1 is provided between the outer peripheral line of the chip region CR and the seal ring SR, and the outer ring OUR1 extends along the outer peripheral line of the chip region CR. At this time, the width of the outer ring OUR1 is smaller than that of the seal ring SR.

Figure 40:
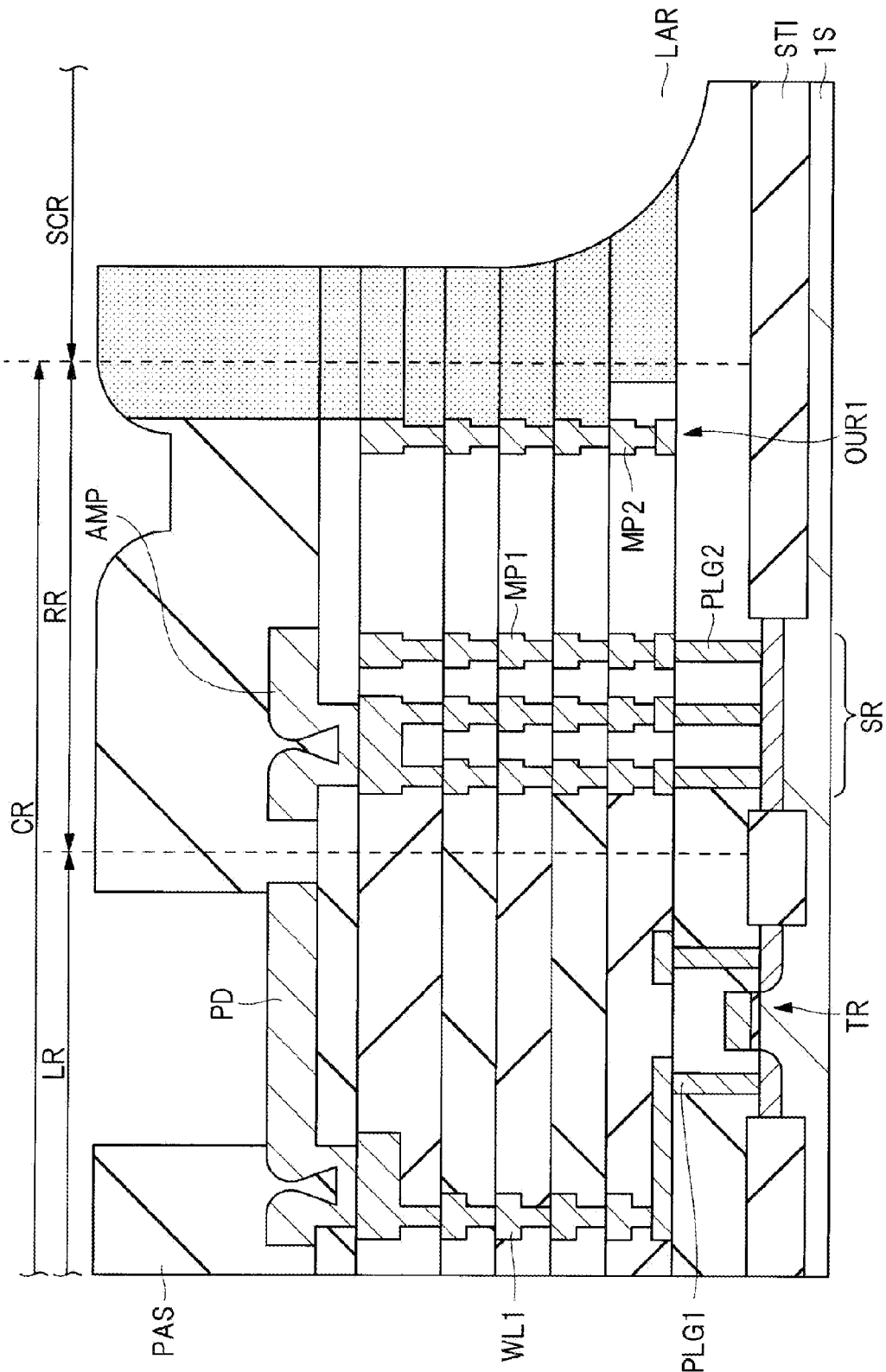
FIG. 40 is a cross-sectional view taken along a line A-A of FIG. 39.

FIG. 40 is a cross-sectional view taken along a line A-A of FIG. 39. As shown in FIG. 40, in the present tenth embodiment, the outer ring OUR1 is provided between the seal ring SR and an outer peripheral line of the ring region RR. The outer ring OUR1 is, for example, arranged in a region near the outer peripheral line of the ring region RR if possible. Specifically, a distance between the outer peripheral line of the ring region RR and the outer ring OUR1 is smaller than a distance between the outer ring OUR1 and the seal ring SR.

Thereby, the following effects can be obtained. Namely, FIG. 40 shows the dicing step in which the scribe region SCR is cut off by irradiating the scribe region SCR of the semiconductor wafer with the laser light LAR. In FIG. 40, a technology called laser dicing is the technology in which the semiconductor wafer is irradiated with the laser light LAR and an irradiation region is heated, and thereby the irradiation region of the semiconductor wafer is burned to be cut off. In this case, since not only the region irradiated with the laser light LAR but a peripheral region of the irradiation region is heated, a film burns and disappears also in the peripheral region. At this time, flammability of the film differs, for example, due to a film type formed at the semiconductor wafer, and heating distribution.

From this, for example, when the outer ring OUR1 is not formed, a cut surface by the laser dicing is likely to be a concavo-convex shape due to the difference in flammability of the film formed at the semiconductor wafer. As a result of this, foreign substances (dust) are easily generated from the concavo-convex shaped cut surface (refer to FIG. 6).

In contrast with this, in the present tenth embodiment, the outer ring OUR1 is arranged near the outer peripheral line of the ring region RR as shown in FIG. 40. As a result of this, as shown in FIG. 40, before flammability of the film formed at the semiconductor wafer is reflected, disappearance of the film stops outside the outer ring OUR1. Thereby, as shown in FIG. 40, the cut surface by the laser dicing has a uniform shape (flat shape) as compared with a case of FIG. 6 of not providing the outer ring OUR1. From this, according to the present tenth embodiment, since the cut surface is smooth, generation of foreign substances (dust) can be reduced as compared with the case where the cut surface has the concavo-convex shape.

As described above, in the present tenth embodiment, the outer ring OUR1 is formed for the purpose of smoothing the cut surface by the laser dicing. In other words, it is conceived that unlike the case of mechanical cutoff by the dicing blade, there is no generation of the crack in the dicing step in the case of laser dicing. From this, as shown in FIG. 40, when premised on the laser dicing, even the groove portion DIT is not provided in the surface protection film PAS, and, the outer ring OUR1 is formed so as to be as close as possible to the outer peripheral line of the ring region RR. Although such configuration of the tenth embodiment is the configuration premised on the laser dicing, in this case as well, reliability deterioration of the semiconductor device due to generation of the foreign substances can be suppressed.

From the discussion described above, not only in the cases of mechanical cutoff by the dicing blade as in the above-described First to ninth embodiments but in the case of being premised on the laser dicing as in the present tenth embodiment, it can be seen that the configuration in which the outer ring OUR1 is provided in the ring region RR is a useful technical idea from a viewpoint of improving a quality of the semiconductor device.

Hereinbefore, although the invention made by the present inventor has been specifically explained based on the embodiments thereof, it is needless to say that the present invention is not limited to the above-described embodiments, and that various modifications can be made without departing from the gist of the invention.

The embodiments include the following aspects.

(Appendix 1)

A semiconductor device having a semiconductor chip, the semiconductor chip including:

a circuit region in which an integrated circuit has been formed; and a ring region formed outside the circuit region, in which in the ring region, there are formed:

(a) a semiconductor substrate;

(b) a seal ring formed over the semiconductor substrate; and (c) an outer ring formed outside the seal ring, in which the seal ring is connected to the semiconductor substrate, and in which the outer ring is arranged above a field insulating film formed on the semiconductor substrate, and is arranged spaced apart from the field insulating film.

(Appendix 2)

The semiconductor device described in Appendix 1, in which a surface height of the semiconductor substrate connected to the seal ring is different from a surface height of the field insulating film located below the outer ring.

(Appendix 3)

The semiconductor device described in Appendix 1, in which in the ring region, there are further formed:

(d) a surface protection film formed over the seal ring; and (e) a groove portion formed in the surface protection film, the groove portion being formed outside the seal ring, and in which the outer ring is formed between the seal ring and the groove portion.

(Appendix 4)

The semiconductor device described in Appendix 1, in which the semiconductor chip has a corner, and in which a first space between the seal ring and the outer ring in the corner is larger than a second space between the seal ring and the outer ring in a region other than the corner.

(Appendix 5)

The semiconductor device described in Appendix 4, in which a distance between an outer end of the ring region and the outer ring is smaller than a distance between the outer ring and the seal ring.

(Appendix 6)

The semiconductor device described in Appendix 5, in which a width of the outer ring is smaller than a width of the seal ring.

(Appendix 7)

A semiconductor wafer having:

a plurality of chip regions; and a scribe region that partitions the chip regions, each of the chip regions including:

a circuit region in which an integrated circuit has been formed; and a ring region formed outside the circuit region, and the scribe region existing outside the ring region, in which in the ring region, there are formed:

(a) a semiconductor substrate;

(b) a seal ring formed over the semiconductor substrate; and (c) an outer ring formed outside the seal ring, in which the seal ring is connected to the semiconductor substrate, and in which the outer ring is arranged above a field insulating film formed on the semiconductor substrate, and is arranged spaced apart from the field insulating film.

What is claimed is:

1. A semiconductor device comprising a semiconductor chip,
    the semiconductor chip including:
    a circuit region in which an integrated circuit has been formed; and
    a ring region formed outside the circuit region,
    wherein in the ring region, there are formed:
    (a) a semiconductor substrate;
    (b) a seal ring formed over the semiconductor substrate;
    (c) a surface protection film formed over the seal ring;
    (d) a groove portion formed at the surface protection film, the groove portion being formed outside the seal ring;
    (e) a first outer ring formed between the seal ring and the groove portion; and
    (f) a second outer ring formed outside the first outer ring, the second outer ring being formed so as to overlap with the groove portion in plan view, and
    wherein a top surface of the second outer ring is not exposed from a bottom surface of the groove portion.

2. The semiconductor device according to claim 1, wherein an insulating film is interposed between a top surface of the second outer ring and the bottom surface of the groove portion.

3. The semiconductor device according to claim 1, wherein a top surface of the first outer ring is higher than the top surface of the second outer ring.

4. The semiconductor device according to claim 1, wherein the top surface of the first outer ring is directly in contact with the surface protection film.

5. The semiconductor device according to claim 4, wherein the top surface of the first outer ring is higher than the bottom surface of the groove portion.

6. The semiconductor device according to claim 1, wherein the top surface of the first outer ring is not directly in contact with the surface protection film.

7. The semiconductor device according to claim 6, wherein
    an insulating film is interposed between the top surface of the second outer ring and the bottom surface of the groove portion, and wherein
    the groove portion penetrates the surface protection film, and is formed halfway through the insulating film.

8. The semiconductor device according to claim 7, wherein the top surface of the first outer ring is higher than the bottom surface of the groove portion.

9. The semiconductor device according to claim 1, wherein a first distance between the first outer ring and the groove portion is smaller than a second distance between the seal ring and the first outer ring.

10. The semiconductor device according to claim 9,
    wherein the first distance is a distance between an outer peripheral line of the first outer ring and an inner peripheral side surface of the groove portion, and
    wherein the second distance is a distance between an outer peripheral line of the seal ring and an inner peripheral line of the first outer ring.

11. The semiconductor device according to claim 1, wherein a width of the first outer ring and a width of the second outer ring are smaller than a width of the seal ring.

12. The semiconductor device according to claim 1, wherein a width of the second outer ring is larger than a width of the groove portion, and an outer peripheral line of the second outer ring is located more inside than an outer peripheral side surface of the groove portion.

13. The semiconductor device according to claim 1, wherein a plurality of dummy patterns is arranged between the seal ring and the first outer ring.

14. The semiconductor device according to claim 13, wherein
    the semiconductor chip has a corner,
    a first space between the seal ring and the first outer ring in the corner is larger than a second space between the seal ring and the first outer ring in a region other than the corner,
    a plurality of corner reinforcing patterns is formed in the first space, and
    the dummy patterns are formed in the second space.

15. The semiconductor device according to claim 14,
    wherein each of the corner reinforcing patterns configures a line segment structure having a line segment shape in plan view, and
    wherein in the first space, in plan view, a plurality of the line segment structures constituting the corner reinforcing patterns is formed side by side in an extending direction of a bisector while crossing the bisector of the corner.

16. The semiconductor device according to claim 15, wherein the dummy patterns are further formed also between the corner reinforcing patterns and the first outer ring in the first space.

17. The semiconductor device according to claim 1,
    wherein the seal ring is connected to the semiconductor substrate, and
    wherein the first outer ring and the second outer ring are arranged above a field insulating film formed on the semiconductor substrate, and are formed spaced apart from the field insulating film.

18. The semiconductor device according to claim 1, wherein a surface height of the semiconductor substrate connected to the seal ring is different from a surface height of the field insulating film located below the first outer ring and the second outer ring.

19. The semiconductor device according to claim 1, wherein each of the first outer ring and the second outer ring includes a laminated structure including a plurality of metal patterns arranged in lamination so as to overlap with each other in plan view, and a plurality of plugs that mutually connects the metal patterns adjacent to each other in a lamination direction.

20. A semiconductor wafer comprising:
    a plurality of chip regions; and
    a scribe region that partitions the chip regions,
    each of the chip regions having:
    a circuit region in which an integrated circuit is formed; and
    a ring region formed outside the circuit region, and
    the scribe region existing outside the ring region,
    wherein in the ring region, there are formed:
    (a) a semiconductor substrate;
    (b) a seal ring formed over the semiconductor substrate;
    (c) a surface protection film formed over the seal ring;
    (d) a groove portion formed at the surface protection film, the groove portion being formed outside the seal ring;
    (e) a first outer ring formed between the seal ring and the groove portion; and
    (f) a second outer ring formed outside the first outer ring, the second outer ring being formed to overlap with the groove portion in plan view, and wherein a top surface of the second outer ring is not exposed from a bottom surface of the groove portion.

* * * * *